US012724562B2

(12) United States Patent
Tran et al.

(10) Patent No.: US 12,724,562 B2
(45) Date of Patent: Sep. 1, 2026

(54) MASKING SPARSE INPUTS AND OUTPUTS IN NEURAL NETWORK ARRAY

(71) Applicant: Silicon Storage Technology, Inc., San Jose, CA (US)

(72) Inventors: Hieu Van Tran, San Jose, CA (US); Stephen Trinh, San Jose, CA (US); Hoa Vu, Milpitas, CA (US); Stanley Hong, San Jose, CA (US); Thuan Vu, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 192 days.

(21) Appl. No.: 18/212,066

(22) Filed: Jun. 20, 2023

(65) Prior Publication Data

US 2024/0338144 A1 Oct. 10, 2024

Related U.S. Application Data

(60) Provisional application No. 63/458,376, filed on Apr. 10, 2023.

(51) Int. Cl.
*G06F 3/06* (2006.01)
*G11C 16/08* (2006.01)

(52) U.S. Cl.
CPC ............ *G06F 3/0655* (2013.01); *G06F 3/062* (2013.01); *G06F 3/0679* (2013.01); *G11C 16/08* (2013.01)

(58) Field of Classification Search
CPC ...... G06F 3/0655; G06F 3/062; G06F 3/0679; G11C 16/08; G11C 16/26; G11C 11/54
See application file for complete search history.

(56) References Cited

U.S. PATENT DOCUMENTS

| | | | | |
|---|---|---|---|---|
| 5,029,130 | A | 7/1991 | Yeh | |
| 5,944,803 | A * | 8/1999 | Whitehouse | G06F 13/385 710/63 |
| 6,747,310 | B2 | 6/2004 | Fan et al. | |
| 10,748,630 | B2 | 8/2020 | Tran et al. | |
| 11,775,311 | B2 * | 10/2023 | Liu | G06N 3/04 706/16 |
| 12,056,459 | B2 * | 8/2024 | Li | G06F 7/50 |
| 2004/0208066 | A1 * | 10/2004 | Burky | G06F 9/3861 712/E9.06 |

(Continued)

FOREIGN PATENT DOCUMENTS

| | | | | |
|---|---|---|---|---|
| CN | 113723044 | A | | 11/2021 |
| KR | 20240037233 | A | * | 3/2024 |

OTHER PUBLICATIONS

U.S. Appl. No. 18/077,686, filed Dec. 8, 2022, Tran et al., entitled "Input Circuit for Artificial Neural Network Array."

(Continued)

*Primary Examiner* — Sultana Begum
(74) *Attorney, Agent, or Firm* — Vedder Price P.C.

(57) ABSTRACT

Numerous examples are disclosed of a masking circuit for inputs and outputs in a neural network array. In one example, a system comprises a neural network array comprising a plurality of non-volatile memory cells arranged into rows and columns; and row circuits for respective rows in the neural network array, the row circuits comprising a masking circuit to prevent an application of a sparse input to one or more rows in the array when a condition is satisfied.

14 Claims, 57 Drawing Sheets

(56) References Cited

U.S. PATENT DOCUMENTS

| | | | | |
|---|---|---|---|---|
| 2017/0337466 | A1 | 11/2017 | Bayat et al. | |
| 2020/0125939 | A1* | 4/2020 | Liu | G06N 3/045 |
| 2022/0223199 | A1 | 7/2022 | Gu et al. | |
| 2023/0049323 | A1 | 2/2023 | Li | |

OTHER PUBLICATIONS

PCT Invitation to Pay Additional Fees mailed on Feb. 8, 2024 corresponding to the related PCT US2023/026052.
PCT Search Report and Written Opinion mailed on Apr. 3, 2024 corresponding to the related PCT US2023/026052.
Machine Translation of Office Action from Korean Patent Office, Dated Feb. 24, 2026, filed under Korea Patent Application No. 10-2025-7028671, 8 pages.

* cited by examiner

100

Memory Cell
510

1000
1001
1002
1003
1014
1014
REF W ARRAY
W ARRAY
REF W ARRAY
BLR0
WL0
WL1
BLR2
WL2
WL3
VBLR
VBLR
VBLR
VBLR
BLR1
BLR3
SL0
SL1
BL0
BLN

1300

LSTM Cell 1600

LSTM Cell 1700

GRU
1800

GRU Cell
1900

GRU Cell
2000

2200

2400

2600

2700

2900

VMM System
3300

FIGURE 36

Row Inputs
3600

3601

| | | input act | | | | | | | |
|---|---|---|---|---|---|---|---|---|---|
| row0 | | 0 | 0 | 0 | 0 | 0 | 0 | 0 | 0 |
| row1 | | 0 | 0 | 0 | 0 | 0 | 0 | 0 | 0 |
| ... | | 0 | 0 | 0 | 0 | 0 | 0 | 0 | 0 |
| row14 | | 0 | 0 | 0 | 0 | 0 | 0 | 0 | 0 |
| row15 | | 0 | 0 | 0 | 0 | 0 | 0 | 0 | 0 |

3602

| | | input act | | | | | | | |
|---|---|---|---|---|---|---|---|---|---|
| | | 3602-7 | 3602-6 | 3602-5 | 3602-4 | 3602-3 | 3602-2 | 3602-1 | 3602-0 |
| row0 | | 0 | 0 | 1 | 1 | 0 | 0 | 1 | 0 |
| row1 | | 0 | 0 | 1 | 1 | 0 | 1 | 1 | 0 |
| ... | | | | | | | | | |
| row14 | | 0 | 0 | 0 | 0 | 0 | 0 | 0 | 0 |
| row15 | | 0 | 0 | 1 | 0 | 0 | 1 | 0 | 0 |

Method 5200

Method 5300

Method
5400

MASKING SPARSE INPUTS AND OUTPUTS IN NEURAL NETWORK ARRAY

PRIORITY CLAIM

This application claims priority from U.S. Provisional Patent Application No. 63/458,376, filed on Apr. 10, 2023, and titled "Masking Circuit for Inputs and Outputs in Neural Network Array," which is incorporated by reference herein.

FIELD OF THE INVENTION

Numerous examples are disclosed of a masking circuit for inputs and outputs in a neural network array.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e., a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. Patent Application Publication 2017/0337466A1, which is incorporated by reference. The non-volatile memory arrays operate as an analog neural memory and comprise non-volatile memory cells arranged in rows and columns. The neural network includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells store a weight value corresponding to a number of electrons on the floating gate. The plurality of memory cells multiply the first plurality of inputs by the stored weight values to generate the first plurality of outputs.

Non-Volatile Memory Cells

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 210 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e., erased of electrons), then the portion of the channel region 18 under the floating gate 20 is turned on as well, and current will flow across the channel region 18, which is sensed as the erased or "1" state. If the floating gate 20 is negatively charged (i.e., programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 210 for performing read, erase, and program operations:

TABLE NO 1

| Operation of Flash Memory Cell 210 of FIG. 2 | | | |
|---|---|---|---|
| | WL | BL | SL |
| Read | 2-3 V | 0.6-2 V | 0 V |
| Erase | ~11-13 V | 0 V | 0 V |
| Program | 1-2 V | 10.5-3 μA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 310 for performing read, erase, and program operations:

TABLE NO 2

| Operation of Flash Memory Cell 310 of FIG. 3 | | | | | |
|---|---|---|---|---|---|
| | WL/SG | BL | CG | EG | SL |
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 0.1-1 μA | 8-11 V | 4.5-9 V | 4.5-5 V |

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage is applied on the source line during a program operation to compensate for a lack of control gate bias.

Table No. 3 depicts typical voltage and current ranges that can be applied to the terminals of memory cell 410 for performing read, erase, and program operations:

TABLE NO 3

| Operation of Flash Memory Cell 410 of FIG. 4 | | | | |
|---|---|---|---|---|
| | WL/SG | BL | EG | SL |
| Read | 0.7-2.2 V | 0.6-2 V | 0-2.6 V | 0 V |
| Erase | −0.5 V/0 V | 0 V | 11.5 V | 0 V |
| Program | 1 V | 0.2-3 μA | 4.5 V | 7-9 V |

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line) extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 210 with a higher control gate voltage.

Table No. 4 depicts typical voltage ranges that can be applied to the terminals of memory cell 510 and substrate 12 for performing read, erase, and program operations:

TABLE NO 4

| Operation of Flash Memory Cell 510 of FIG. 5 | | | | |
|---|---|---|---|---|
| | CG | BL | SL | Substrate |
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), CT (charge trap) memory, CN (carbon-tube) memory, OTP (bi-level or multi-level one time programmable), and CeRAM (correlated electron ram), without limitation.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e., charge on the floating gate) of each memory cell in the array can be continuously changed from a fully erased state to a fully programmed state, and vice-versa, independently and with minimal disturbance of other memory cells. This means the cell storage is effectively analog or at the very least can store one of many discrete values (such as 16 or 64 different values), which allows for very precise and individual tuning of all the memory cells in the memory array, and which makes the memory array ideal for storing and making fine tuning adjustments to the synapsis weights of the neural network.

Neural Networks Employing Non-Volatile Memory Cell Arrays

FIG. 6 conceptually illustrates a non-limiting example of a neural network utilizing a non-volatile memory array of the present examples. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of layer C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two-dimensional array, and thus in this example layer C1 constitutes 16 layers of two-dimensional arrays (keeping in mind that the layers and arrays referenced herein are logical relationships that may or may not be commensurate with physical relationships—i.e., the arrays might not be oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next operation. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed-up output values of differential summer 38 are then supplied to an activation function block 39, which rectifies the output. The activation function block 39 may provide sigmoid, tanh, or ReLU functions. The rectified output values of activation function block 39 become an element of a feature map as the next layer (e.g., C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function block 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

FIG. 8 is a block diagram depicting the usage of numerous layers of VMM arrays 32, here labeled as VMM arrays 32*a*, 32*b*, 32*c*, 32*d*, and 32*e*. As shown in FIG. 8, the input, denoted Inputx, is converted from digital to analog by a digital-to-analog converter 31 and provided to input VMM array 32*a*. The converted analog inputs could be voltage or current. The input D/A conversion for the first layer could be done by using a function or a LUT (look up table) that maps the inputs Inputx to appropriate analog levels for the matrix multiplier of input VMM array 32*a*. The input conversion could also be done by an analog to analog (A/A) converter to convert an external analog input to a mapped analog input to the input VMM array 32*a*.

The output generated by input VMM array 32*a* is provided as an input to the next VMM array (hidden level 1) 32*b*, which in turn generates an output that is provided as an input to the next VMM array (hidden level 2) 32*c*, and so on. The various layers of VMM array 32 function as different layers of synapses and neurons of a convolutional neural network (CNN). Each VMM array 32*a*, 32*b*, 32*c*, 32*d*, and 32*e* can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32*a*,32*b*,32*c*,32*d*,32*e*): one input layer (32*a*), two hidden layers (32*b*,32*c*), and two fully connected layers (32*d*,32*e*). One of ordinary skill in the art will appreciate that this is merely an example and that a system instead could comprise more than two hidden layers and more than two fully connected layers.

Vector-by-Matrix Multiplication (VMM) Arrays

FIG. 9 depicts neuron VMM array 900, which is particularly suited for memory cells 310 as shown in FIG. 3 and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one example, only even rows are used, and in another example, only odd rows are used. The current placed on each source line (SL0, SL1, respectively) performs a summing function of all the currents from the memory cells connected to that particular source line.

As described herein for neural networks, the non-volatile memory cells of VMM array 900, i.e., the memory cells 310 of VMM array 900, may be configured to operate in a sub-threshold region.

The non-volatile reference memory cells and the non-volatile memory cells described herein are biased in weak inversion (sub threshold region):

$$Ids = Io * e^{(Vg-Vth)/nVt} = w * Io * e^{(Vg)/nVt},$$

where $$w = e^{(-Vth)/nVt}$$

where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to (Wt/L)*u*Cox*(n−1)*$Vt^2$ where u is carrier mobility and Wt and L are width and length, respectively, of the memory cell.

For an I-to-V log converter using a memory cell (such as a reference memory cell or a peripheral memory cell) or a transistor to convert input current into an input voltage:

$$Vg = n * Vt * \log [Ids / wp * Io]$$

where, wp is w of a reference or peripheral memory cell.

For a memory array used as a vector matrix multiplier VMM array with the current input, the output current is:

$$Iout = wa * Io * e^{(Vg)/nVt},$$

namely $$Iout = (wa / wp) * Iin = W * Iin$$

$$W = e^{(Vthp-Vtha)/nVt}$$

Here, wa=w of each memory cell in the memory array.

Vthp is effective threshold voltage of the peripheral memory cell and Vtha is effective threshold voltage of the main (data) memory cell. Note that the threshold voltage of a transistor is a function of substrate body bias voltage and the substrate body bias voltage, denoted Vsb, can be modulated to compensate for various conditions, on such temperature. The threshold voltage Vth can be expressed as:

$$Vth = Vth0 + \text{gamma } (SQRT \mid Vsb - 2 * \varphi F) - SQRT|2 * \varphi F|)$$

where Vth0 is threshold voltage with zero substrate bias, φF is a surface potential, and gamma is a body effect parameter.

A wordline or control gate can be used as the input for the memory cell for the input voltage.

Alternatively, the flash memory cells of VMM arrays described herein can be configured to operate in the linear region:

$$Ids = \text{beta} * (Vgs - Vth) * Vds;$$

$$\text{beta} = u * Cox * \text{Wt} / L$$

$$W = \alpha (Vgs - Vth)$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region can be used to linearly convert an input/output current into an input/output voltage.

Alternatively, the memory cells of VMM arrays described herein can be configured to operate in the saturation region:

$$Ids = \frac{1}{2} * \text{beta} * (Vgs - Vth)^2;$$

$$\text{beta} = u * Cox * \text{Wt}/L$$

$$W\alpha(Vgs - Vth)^2,$$

meaning weight $W$ is proportional to $(Vgs - Vth)^2$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

Other examples for VMM array 32 of FIG. 7 are described in U.S. Pat. No. 10,748,630, which is incorporated by reference herein. As described in that application. a sourceline or a bitline can be used as the neuron output (current summation output).

FIG. 10 depicts neuron VMM array 1000, which is particularly suited for memory cells 210 as shown in FIG. 2 and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages and currents for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 5

Operation of VMM Array 1000 of FIG. 10:

| | WL | WL -unsel | BL | BL -unsel | SL | SL -unsel |
|---|---|---|---|---|---|---|
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 11 depicts neuron VMM array 1100, which is particularly suited for memory cells 210 as shown in FIG. 2 and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages and currents for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

| Operation of VMM Array 1100 of FIG. 11 | | | | | | |
|---|---|---|---|---|---|---|
| | WL | WL -unsel | BL | BL -unsel | SL | SL -unsel |
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

FIG. 12 depicts neuron VMM array 1200, which is particularly suited for memory cells 310 as shown in FIG. 3 and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bit lines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. If too much charge is placed on the floating gate (such that the wrong value is stored in the cell), the cell is erased, and the sequence of partial programming operations starts over. As shown, two rows sharing the same erase gate (such as EG0 or EG1) are erased together (which can be referred to as a page erase), and thereafter, each cell is partially programmed until the desired charge on the floating gate is reached.

Table No. 7 depicts operating voltages and currents for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

| Operation of VMM Array 1200 of FIG. 12 | | | | | | | | | | | |
|---|---|---|---|---|---|---|---|---|---|---|---|
| | WL | WL - unsel | BL | BL - unsel | CG | CG - unsel same sector | CG - unsel | EG | EG - unsel | SL | SL - unsel |
| Read | 1.0-2 V | −0.5 V/0 V | 0.6-2 V (Ineuron) | 0 V | 0-2.6 V | 0-2.6 V | 0-2.6 V | 0-2.6 V | 10-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 13 depicts neuron VMM array 1300, which is particularly suited for memory cells 310 as shown in FIG. 3 and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bit lines BL0-BLN, where each bit line sums all currents from the non-volatile memory cells connected to that particular bitline.

Table No. 8 depicts operating voltages and currents for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 8

Operation of VMM Array 1300 of FIG. 13

| | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 22 depicts neuron VMM array 2200, which is particularly suited for memory cells 210 as shown in FIG. 2 and is utilized as the synapses and parts of neurons between an input layer and the next layer. In VMM array 2200, the inputs $INPUT_0$ . . . , $INPUT_N$ are received on bit lines $BL_0$, . . . $BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

FIG. 23 depicts neuron VMM array 2300, which is particularly suited for memory cells 210 as shown in FIG. 2 and is utilized as the synapses and parts of neurons between an input layer and the next layer. In this example, the inputs $INPUT_0$, $INPUT_1$, $INPUT_2$, and $INPUT_3$ are received on source lines $SL_0$, $SL_1$, $SL_2$, and $SL_3$, respectively, and the outputs $OUTPUT_0$, . . . $OUTPUT_N$ are generated on bit lines $BL_0$, . . . , $BL_N$.

FIG. 24 depicts neuron VMM array 2400, which is particularly suited for memory cells 210 as shown in FIG. 2 and is utilized as the synapses and parts of neurons between an input layer and the next layer. In this example, the inputs $INPUT_0$, . . . , $INPUT_M$ are received on word lines $WL_0$, . . . , $WL_M$, respectively, and the outputs $OUTPUT_0$, . . . $OUTPUT_N$ are generated on bit lines $BL_0$, . . . , $BL_N$.

FIG. 25 depicts neuron VMM array 2500, which is particularly suited for memory cells 310 as shown in FIG. 3 and is utilized as the synapses and parts of neurons between an input layer and the next layer. In this example, the inputs $INPUT_0$, . . . , $INPUT_M$ are received on word lines $WL_0$, . . . , $WL_M$, respectively, and the outputs $OUTPUT_0$, . . . $OUTPUT_N$ are generated on bit lines $BL_0$, . . . , $BL_N$.

FIG. 26 depicts neuron VMM array 2600, which is particularly suited for memory cells 410 as shown in FIG. 4 and is utilized as the synapses and parts of neurons between an input layer and the next layer. In this example, the inputs $INPUT_0$, . . . , $INPUT_n$ are received on vertical control gate lines $CG_0$, . . . , $CG_N$, respectively, and the outputs $OUTPUT_1$ and $OUTPUT_2$ are generated on source lines $SL_0$ and $SL_1$.

FIG. 27 depicts neuron VMM array 2700, which is particularly suited for memory cells 410 as shown in FIG. 4 and is utilized as the synapses and parts of neurons between an input layer and the next layer. In this example, the inputs $INPUT_0$, . . . , $INPUT_N$ are received on the gates of bit line control gates 2701-1, 2701-2, . . . , 2701-(N−1), and 2701-N, respectively, which are coupled to bit lines $BL_0$, . . . , $BL_N$, respectively. Example outputs $OUTPUT_1$ and $OUTPUT_2$ are generated on source lines $SL_0$ and $SL_1$.

FIG. 28 depicts neuron VMM array 2800, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on word lines $WL_0$, . . . , $WL_M$, and the outputs $OUTPUT_0$, . . . , $OUTPUT_N$ are generated on bit lines $BL_0$, . . . $BL_N$, respectively.

FIG. 29 depicts neuron VMM array 2900, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on control gate lines $CG_0$, . . . , $CG_M$. Outputs $OUTPUT_0$, . . . , $OUTPUT_N$ are generated on vertical source lines $SL_0$, . . . , $SL_N$, respectively, where each source line $SL_i$ is coupled to the source lines of all memory cells in column i.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on control gate lines $CG_0$, . . . , $CG_M$. Outputs $OUTPUT_0$, . . . , $OUTPUT_N$ are generated on vertical bit lines $BL_0$, . . . , $BL_N$, respectively, where each bit line $BL_i$ is coupled to the bit lines of all memory cells in column i.

Long Short-Term Memory

The prior art includes a concept referred to as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

FIG. 14 depicts an example LSTM 1400. LSTM 1400 in this example comprises cells 1401, 1402, 1403, and 1404. Cell 1401 receives input vector $x_0$ and generates output vector $h_0$ and cell state vector $c_0$. Cell 1402 receives input vector $x_1$, the output vector (hidden state) $h_0$ from cell 1401 and cell state $c_0$ from cell 1401 and generates output vector $h_1$ and cell state vector $c_1$. Cell 1403 receives input vector $x_2$, the output vector (bidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

FIG. 15 depicts an example implementation of an LSTM cell 1500, which can be used for cells 1401, 1402, 1403, and 1404 in FIG. 14. LSTM cell 1500 receives input vector x(t), cell state vector c(t−1) from a preceding cell, and output vector h(t−1) from a preceding cell, and generates cell state vector c(t) and output vector h(t).

LSTM cell 1500 comprises sigmoid function devices 1501, 1502, and 1503, each of which applies a number between 0 and 1 to control how much of each component in the input vector is allowed through to the output vector. LSTM cell 1500 also comprises tanh devices 1504 and 1505 to apply a hyperbolic tangent function to an input vector, multiplier devices 1506, 1507, and 1508 to multiply two vectors together, and addition device 1509 to add two vectors together. Output vector h(t) can be provided to the next LSTM cell in the system, or it can be accessed for other purposes.

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tanh device 1504 each comprise multiple VMM arrays 1601 and activation function blocks 1602. Thus, it can be seen that VMM arrays are particular useful in LSTM cells used in certain neural network systems. The multiplier devices 1506, 1507, and 1508 and the addition device 1509 are implemented in a digital manner or in an analog manner. The activation function blocks 1602 can be implemented in a digital manner or in an analog manner.

An alternative to LSTNM cell 1600 (and another example of an implementation of LSTM cell 1500) is shown in FIG. 17. In FIG. 17, sigmoid function devices 1501, 1502, and 1503 and tanh device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tanh device 1505 (which comprises activation function block 1702), register 1707 to store the value i(t) when i(t) is output from sigmoid function block 1702, register 1704 to store the value f(t)*c(t−1) when that value is output from multiplier device 1703 through multiplexor 1710, register 1705 to store the value i(t)*u(t) when that value is output from multiplier device 1703 through multiplexor 1710, and register 1706 to store the value o(t)*c~(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains one set of VMN arrays 1701 and activation function block 1702, which are used to represent multiple layers in the example of LSTM cell 1700. LSTM cell 1700 will require less space than LSTM 1600, as LSTM cell 1700 will require ¼ as much space for VMMs and activation function blocks compared to LSTM cell 1600.

It can be further appreciated that LSTM units will typically comprise multiple VMM arrays, each of which uses functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The examples described below therefore reduce the circuitry provided outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

FIG. 18 depicts an example GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

FIG. 19 depicts an example implementation of a GRU cell 1900, which can be used for cells 1801, 1802, 1803, and 1804 of FIG. 18. GRU cell 1900 receives input vector x(t) and output vector h(t−1) from a preceding GRU cell and generates output vector h(t). GRU cell 1900 comprises sigmoid function devices 1901 and 1902, each of which applies a number between 0 and 1 to components from output vector h(t−1) and input vector x(t). GRU; cell 1900 also comprises a tanh device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tanh device 1903 each comprise multiple VMM arrays 2001 and activation function blocks 2002. Thus, it can be seen that VMM arrays are of particular use in GRU cells used in certain neural network systems. The multiplier devices 1904, 1905, 1906, the addition device 1907, and the complementary device 1908 are implemented in a digital manner or in an analog manner. The activation function blocks 2002 can be implemented in a digital manner or in an analog manner.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tanh device 1903 share the same physical hardware (VMM arrays 2101 and activation function block 2102) in a time-multiplexed fashion. GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1)*r(t) when that value is output from multiplier device 2103 through multiplexor 2104, register 2107 to hold the value h(t−1)*z(t) when that value is output from multiplier device 2103 through multiplexor 2104, and register 2108 to hold the value h^(t)*(1−z(t)) when that value is output from multiplier device 2103 through multiplexor 2104.

Whereas GRU cell 2000 contains multiple sets of VMM arrays 2001 and activation function blocks 2002, GRU cell 2100 contains one set of VMM arrays 2101 and activation function block 2102, which are used to represent multiple layers in the example of CRU cell 2100. GRU cell 2100 will require less space than GRU cell 2000, as GRU cell 2100 will require ⅓ as much space for VMMs and activation function blocks compared to GRU cell 2000.

It can be further appreciated that GRU systems will typically comprise multiple VMM arrays, each of which uses functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The examples described below therefore reduce the circuitry outside of the VMM arrays themselves.

The input to the VMM arrays can be an analog level, a binary level, a pulse, a time modulated pulse, or digital bits (in this case a DAC is used to convert digital bits to appropriate input analog level) and the output can be an analog level, a binary level, a timing pulse, pulses, or digital bits (in this case an output ADC is used to convert output analog level into digital bits).

In general, for each memory cell in a VMM array, each weight W can be implemented by a single memory cell or by a differential cell or by two blend memory cells (average of 2 cells). In the differential cell case, two memory cells are used to implement a weight W as a differential weight (W=W+−W−). In the two blend memory cells, two memory cells are used to implement a weight W as an average of two cells.

FIG. 31 depicts VMM system 3100. In some examples, the weights, W, stored in a VMM array are stored as differential pairs, W+ (positive weight) and W− (negative weight), where W=(W+)−(W−). In VMM system 3100, half of the bit lines are designated as W+ lines, that is, bit lines connecting to memory cells that will store positive weights W+, and the other half of the bit lines are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3101 and 3102. The output of a W+ line and the output of a W− line are combined together to give effectively W=W+−W− for each pair of (W+, W−) cells for all pairs of (W+, W−) lines. While the above has been described in relation to W− lines interspersed among the W+ lines in an alternating fashion, in other examples W+ lines and W− lines can be arbitrarily located anywhere in the array.

FIG. 32 depicts another example. In VMM system 3210, positive weights W+ are implemented in first array 3211 and negative weights W− are implemented in a second array 3212, second array 3212 separate from the first array, and the resulting weights are appropriately combined together by summation circuits 3213.

FIG. 33 depicts VMM system 3300. The weights, W, stored in a VMM array are stored as differential pairs, W+ (positive weight) and W− (negative weight), where W=(W+)−(W−). VMM system 3300 comprises array 3301 and array 3302. Half of the bit lines in each of array 3301 and 3302 are designated as W+ lines, that is, bit lines connecting to memory cells that will store positive weights W+, and the other half of the bit lines in each of array 3301 and 3302 are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3303, 3304, 3305, and 3306. The output of a W+ line and the output of a W− line from each array 3301, 3302 are respectively combined together to give effectively W=W+−W− for each pair of (W+, W−) cells for all pairs of (W+, W−) lines. In addition, the W values from each array 3301 and 3302 can be further combined through summation circuits 3307 and 3308, such that each W value is the result of a W value from array 3301 minus a W value from array 3302, meaning that the end result from summation circuits 3307 and 3308 is a differential value of two differential values.

Each non-volatile memory cells used in the analog neural memory system is to be erased and programmed to hold a very specific and precise amount of charge, i.e., the number of electrons, in the floating gate. For example, each floating gate holds one of N different values, where N is the number of different weights that can be indicated by each cell. Examples of N include 16, 32, 64, 128, and 256.

During a neural read operation, all rows in the VMM array are read at one time, which involves applying row inputs to all rows in the array and reading the resulting output currents, usually received from the columns of the array. As described herein, a row input can comprise an activation input, a feature input, an input to a neural network, an output received by one neural network layer from another neural network layer, and other types of data that might be applied to a row. In many instances, one or more rows receive a sparse row input, yet the operations are still performed on those rows, which ends up consuming power unnecessarily and sometimes creating latency.

What is needed is a mechanism for detecting row inputs that are sparse and preventing activation of those rows during a neural read operation. What is similarly needed is a mechanism for detecting output currents that are sparse and preventing activation of those columns during the neural read operation.

SUMMARY OF THE INVENTION

Numerous examples are disclosed of circuits and methods for masking sparse inputs and outputs in a neural network array.

BRIEF DESCRIPTION OF THE DRAWINGS

FIG. 36 depicts an example of row inputs for a VMM system.

DETAILED DESCRIPTION OF THE INVENTION

VMM System Architecture

Figure 1:
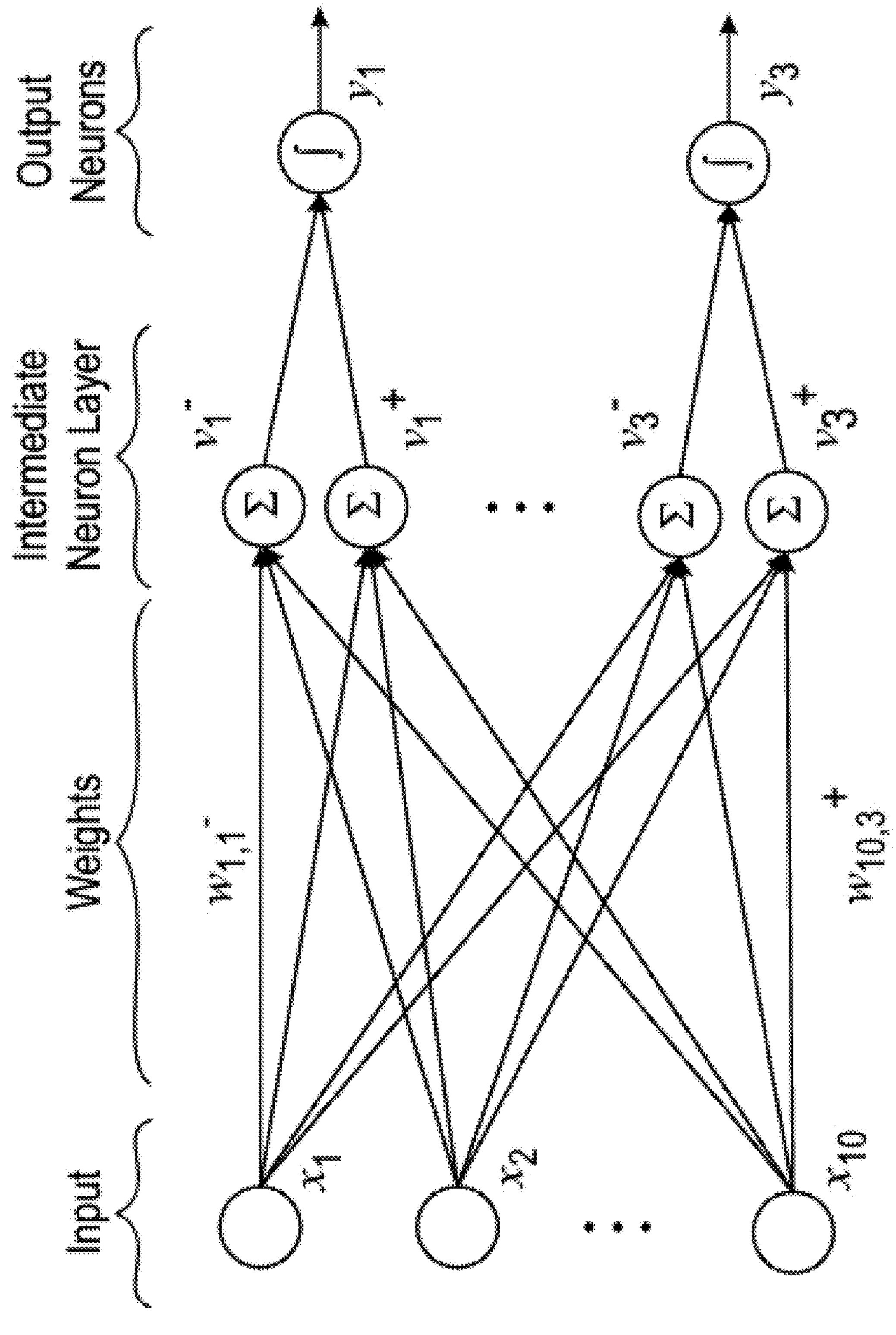
FIG. 1 is a diagram that illustrates an artificial neural network.
Figure 2:
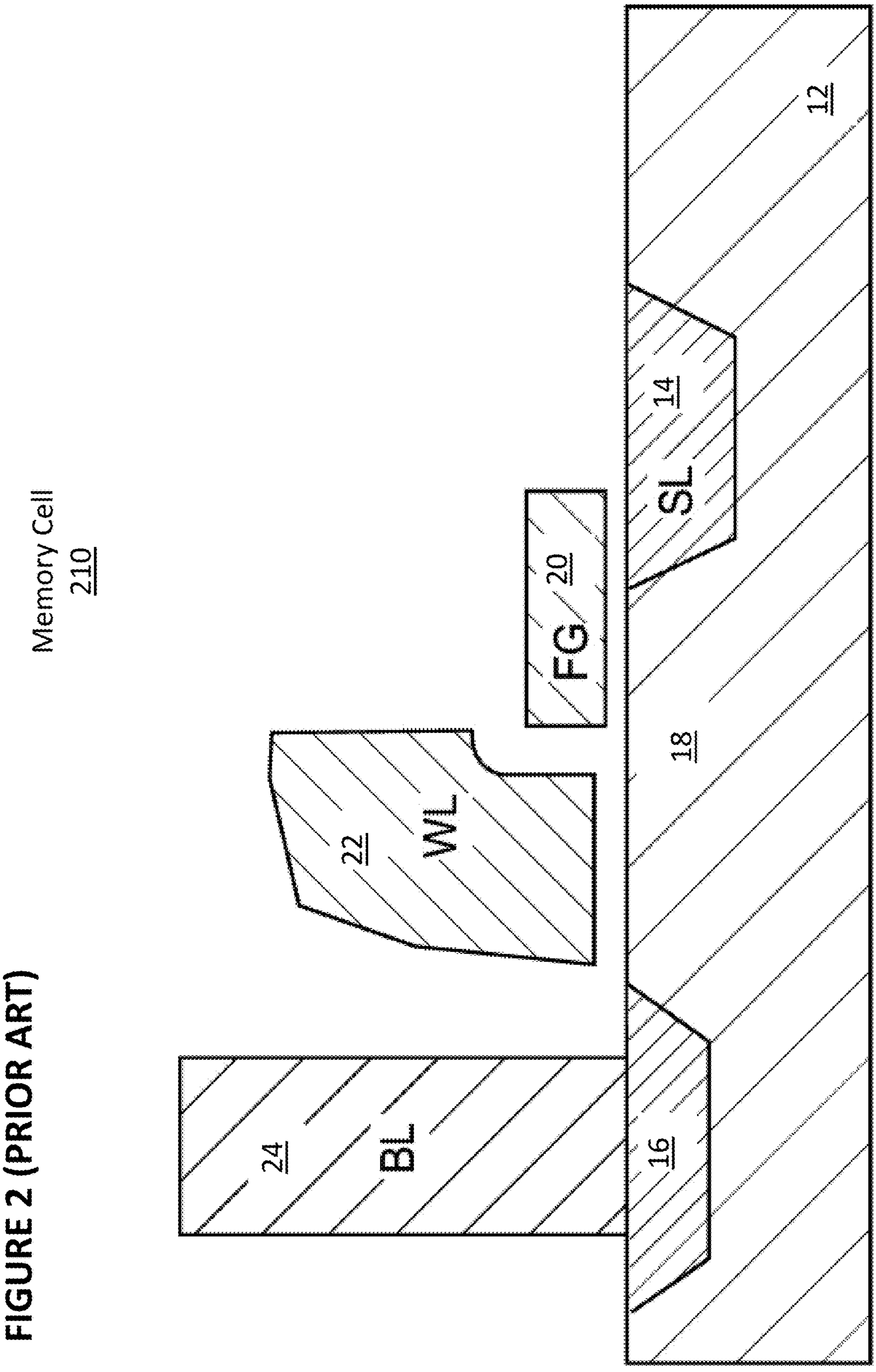
FIG. 2 depicts a prior art split gate flash memory cell.
Figure 3:
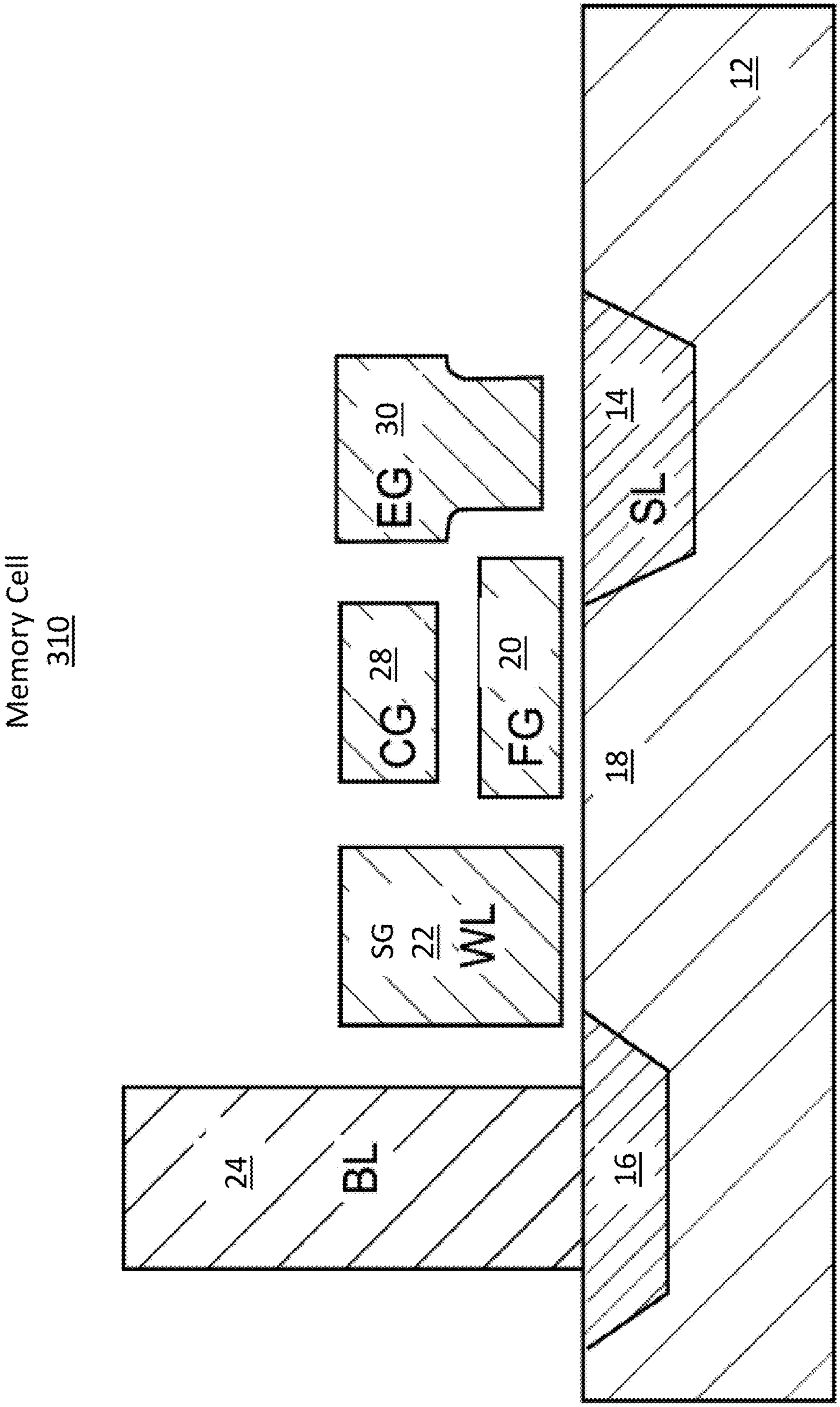
FIG. 3 depicts another prior art split gate flash memory cell.
Figure 4:
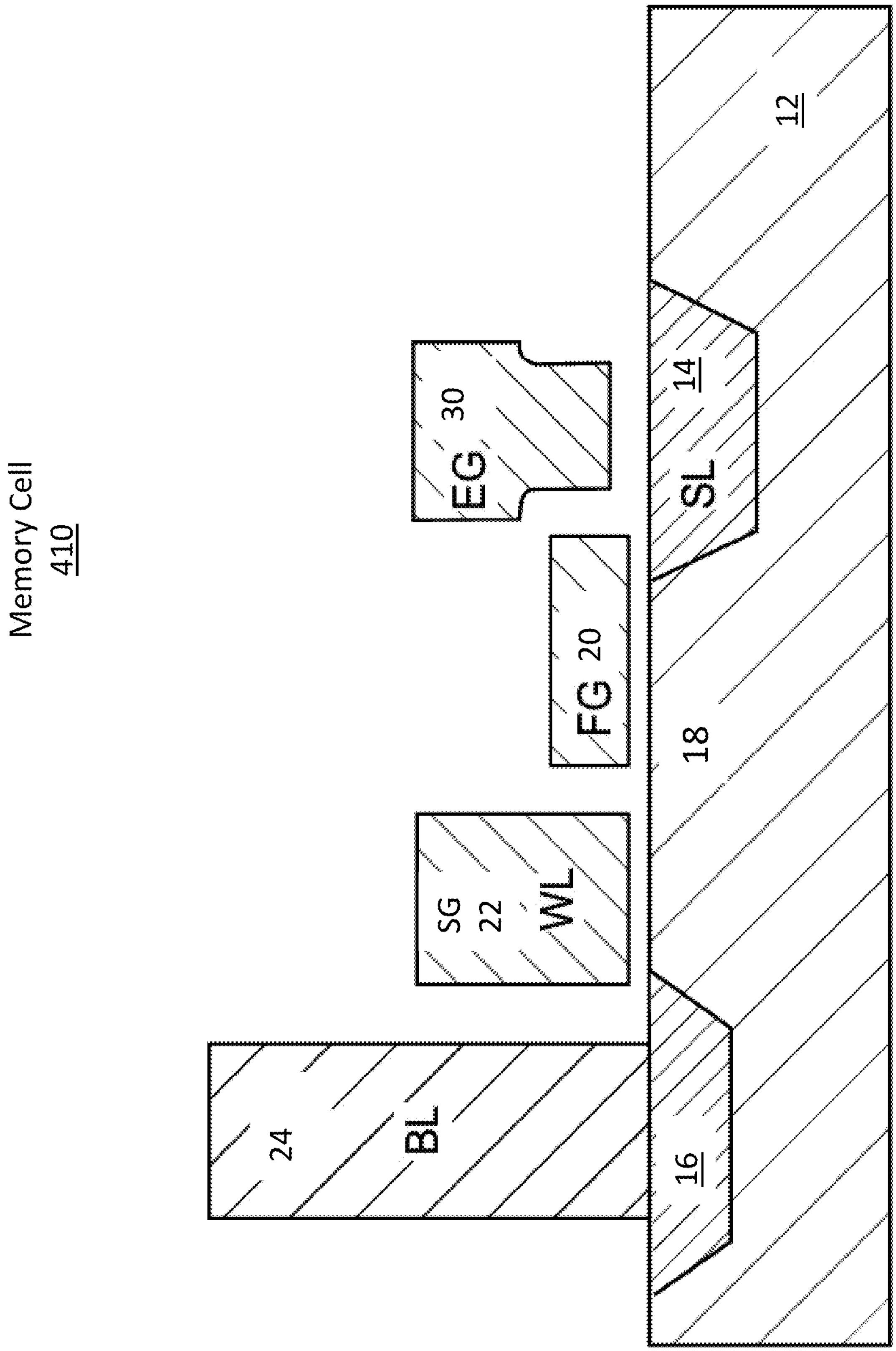
FIG. 4 depicts another prior art split gate flash memory cell.
Figure 5:
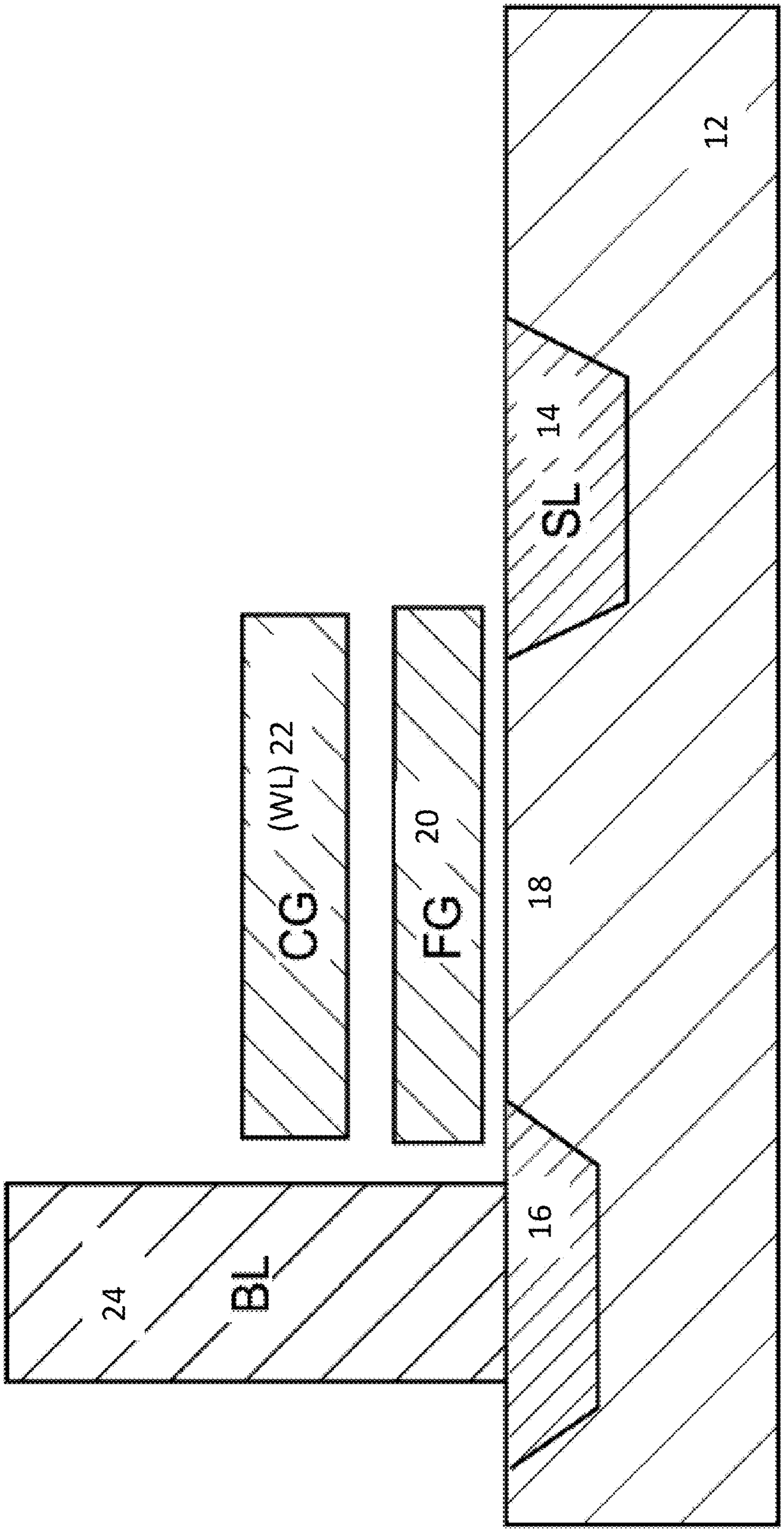
FIG. 5 depicts another prior art split gate flash memory cell.
Figure 6:
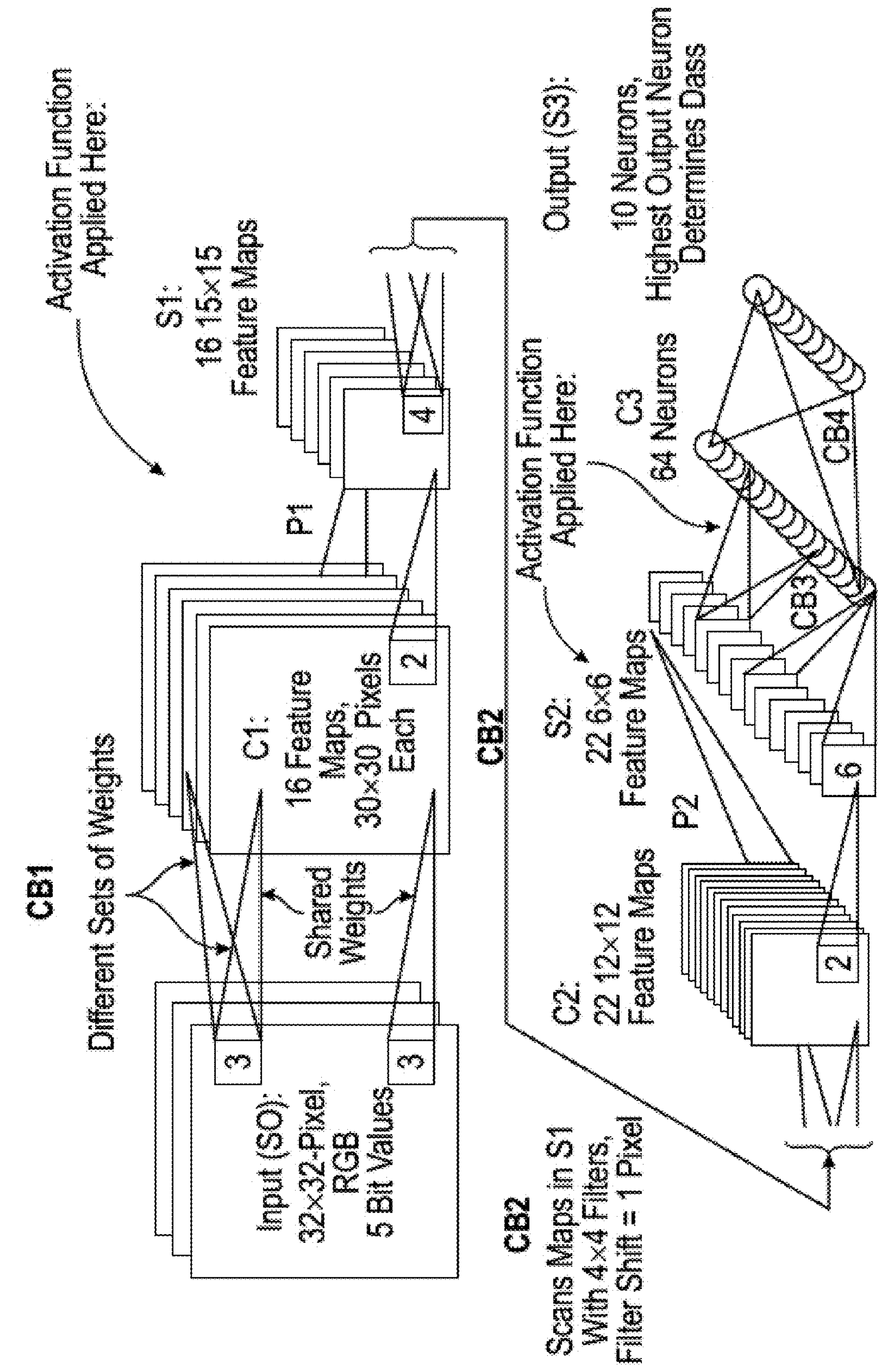
FIG. 6 is a diagram illustrating the different levels of an example of an artificial neural network utilizing one or more non-volatile memory arrays.
Figure 7:
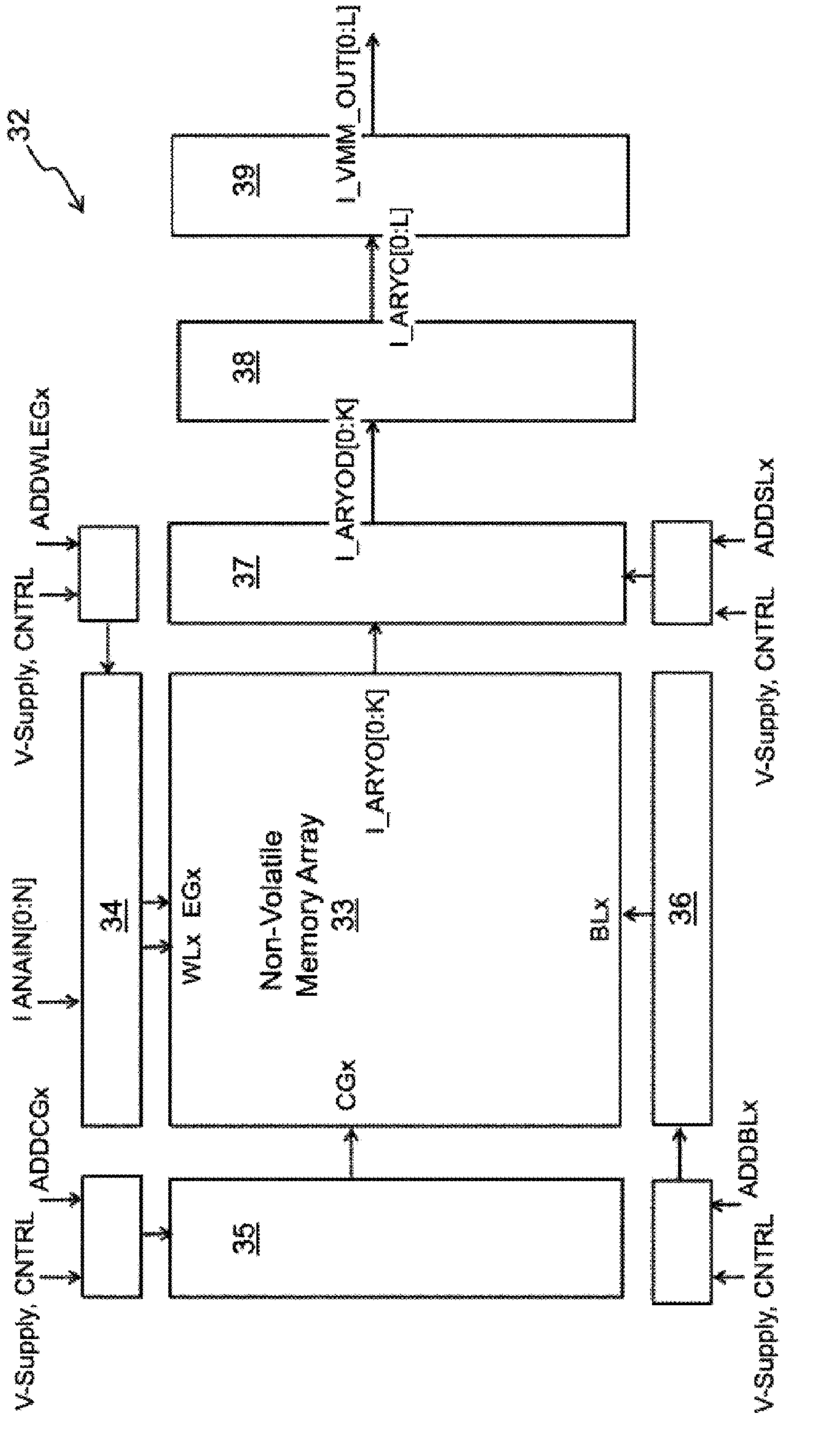
FIG. 7 is a block diagram illustrating a VMM system.
Figure 8:
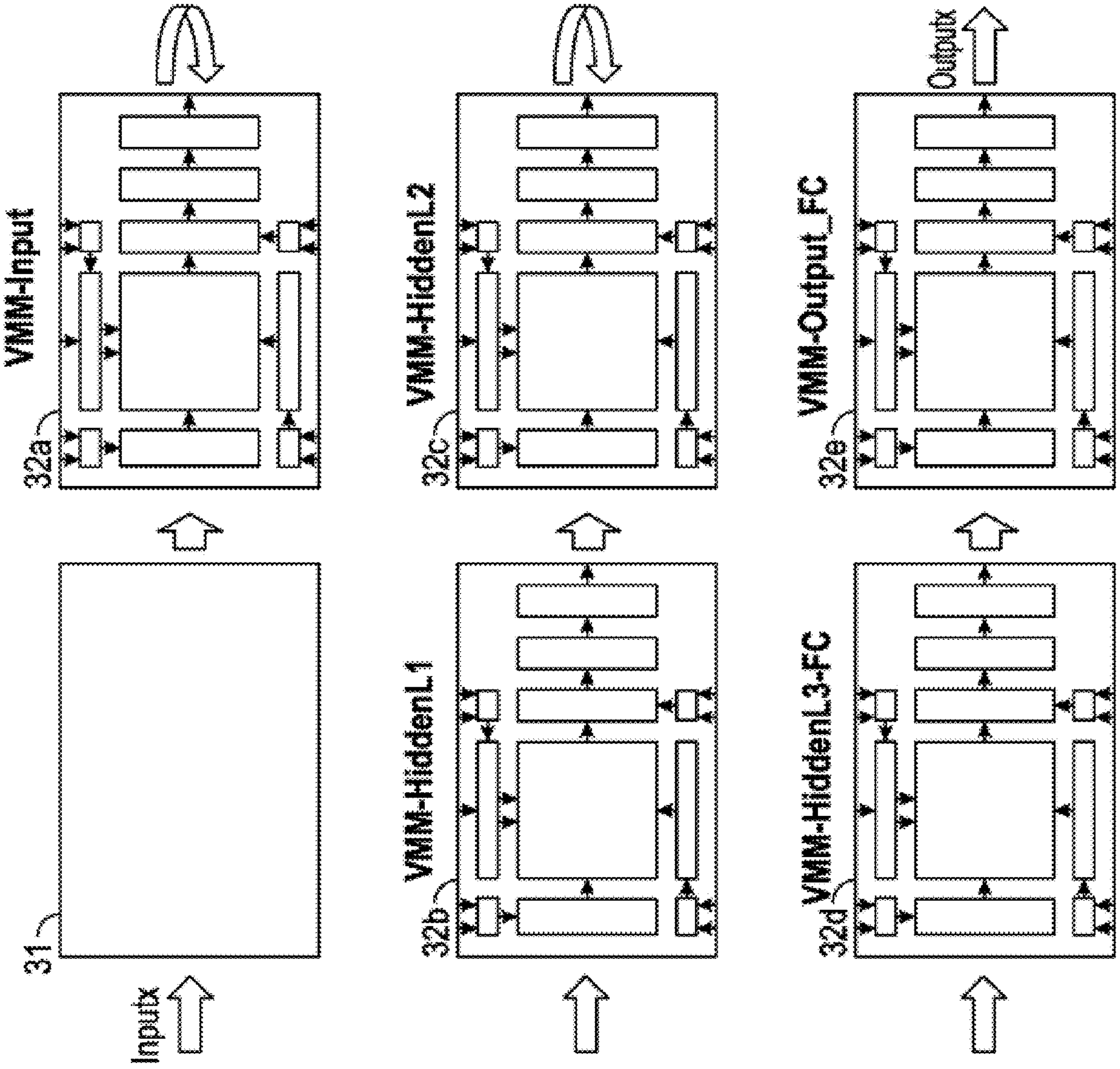
FIG. 8 is a block diagram illustrates an example artificial neural network utilizing one or more VMM systems.
Figure 9:
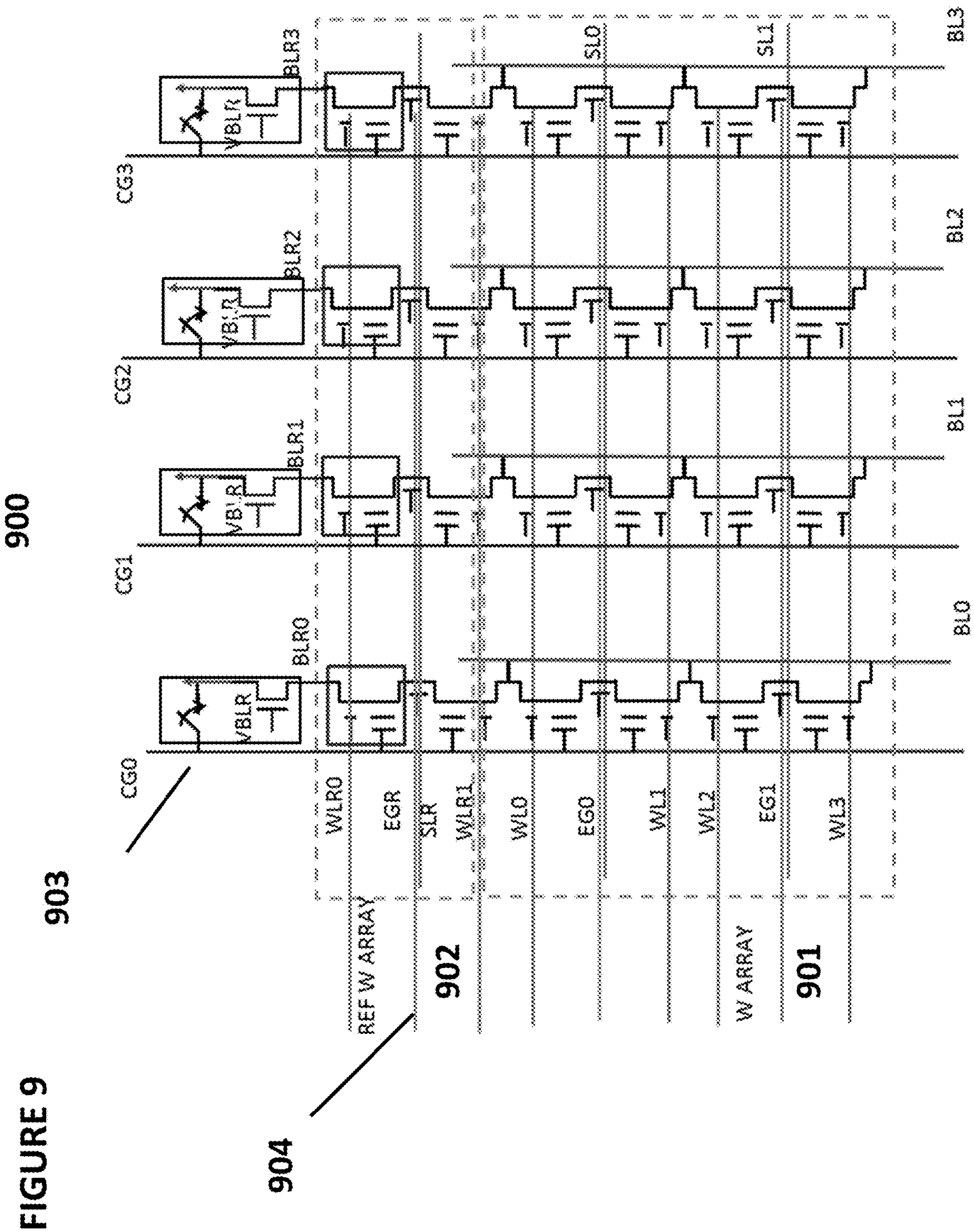
FIG. 9 depicts another example of a VMM system.
Figure 10:
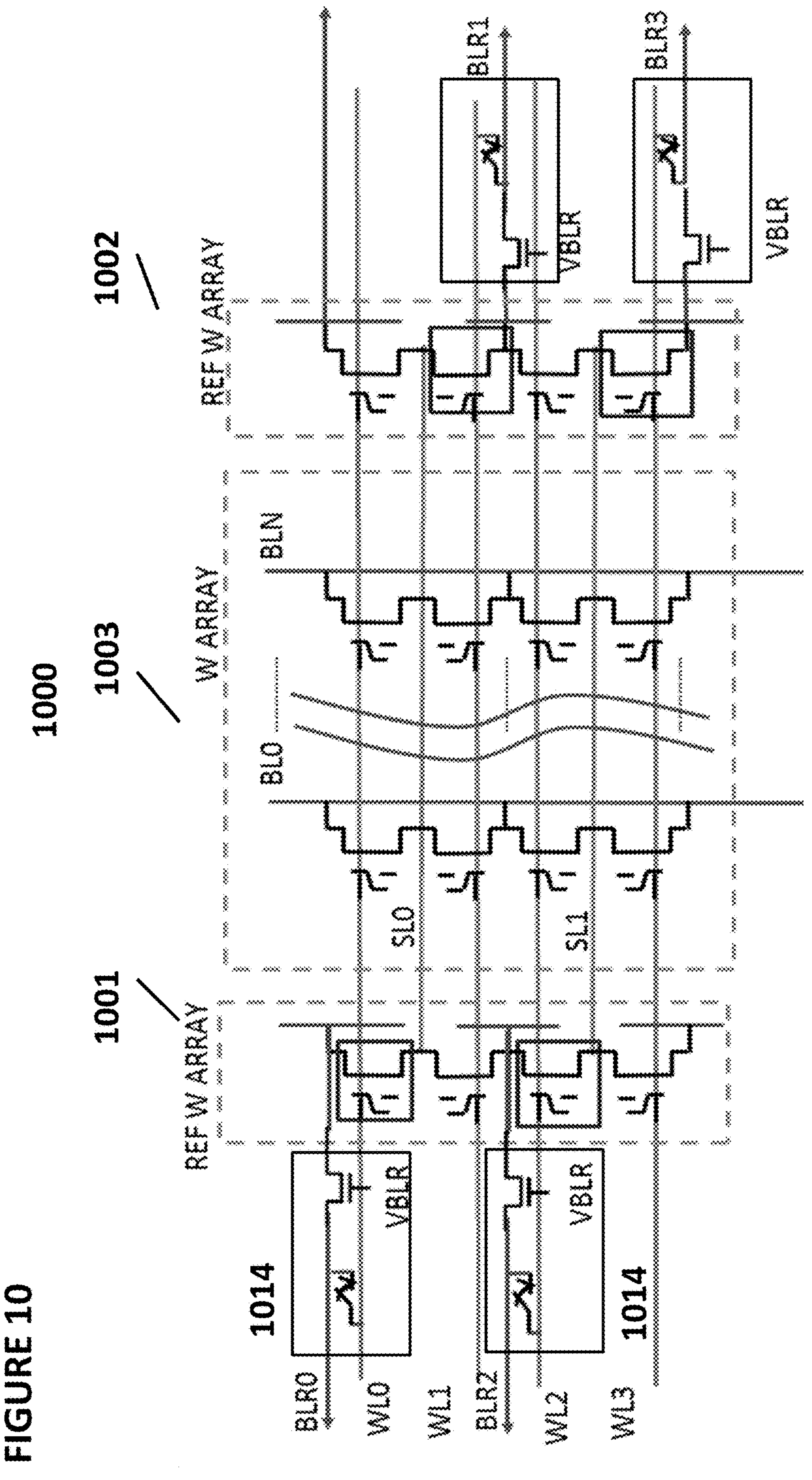
FIG. 10 depicts another example of a VMM system.
Figure 11:
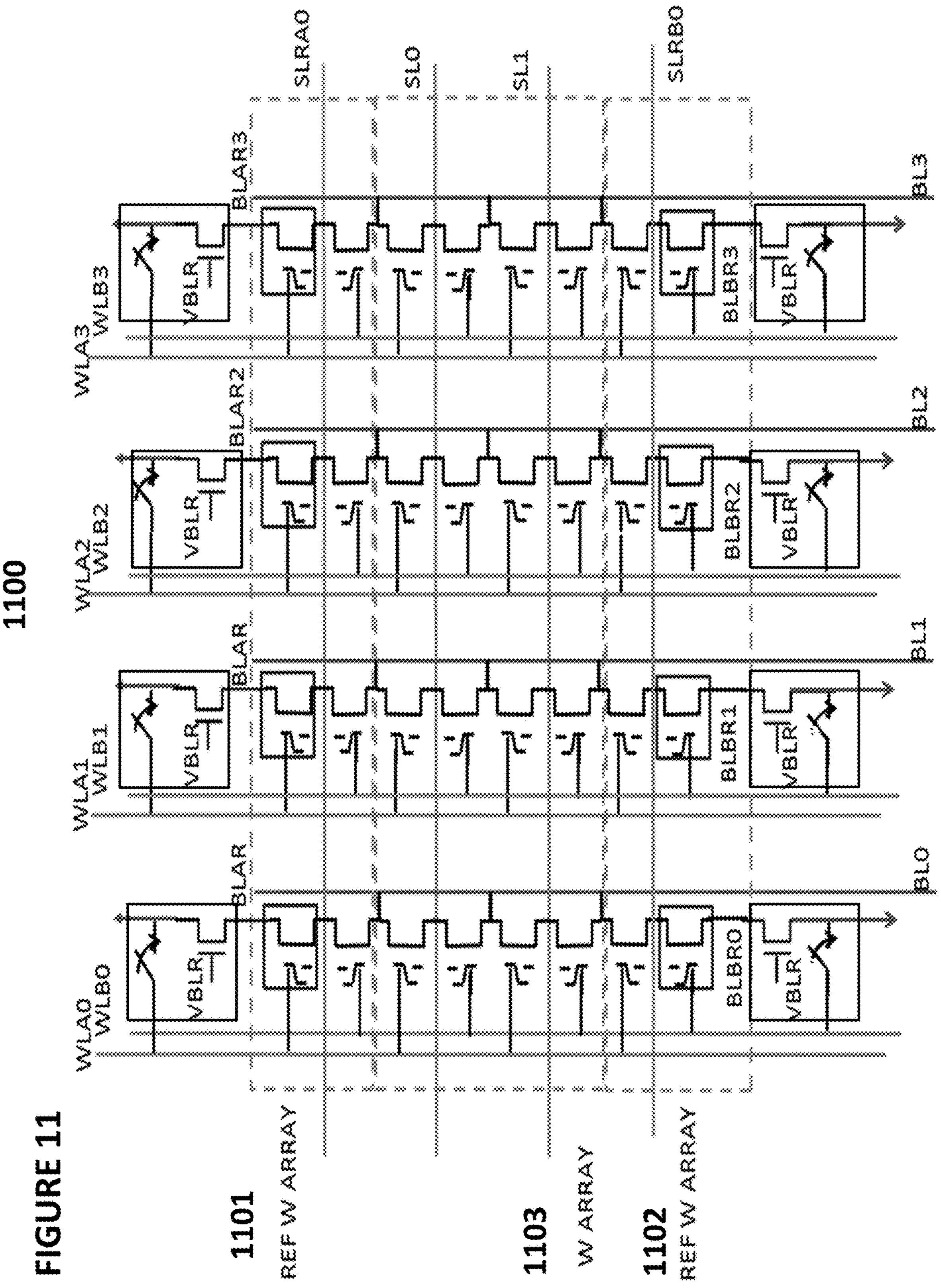
FIG. 11 depicts another example of a VMM system.
Figure 12:
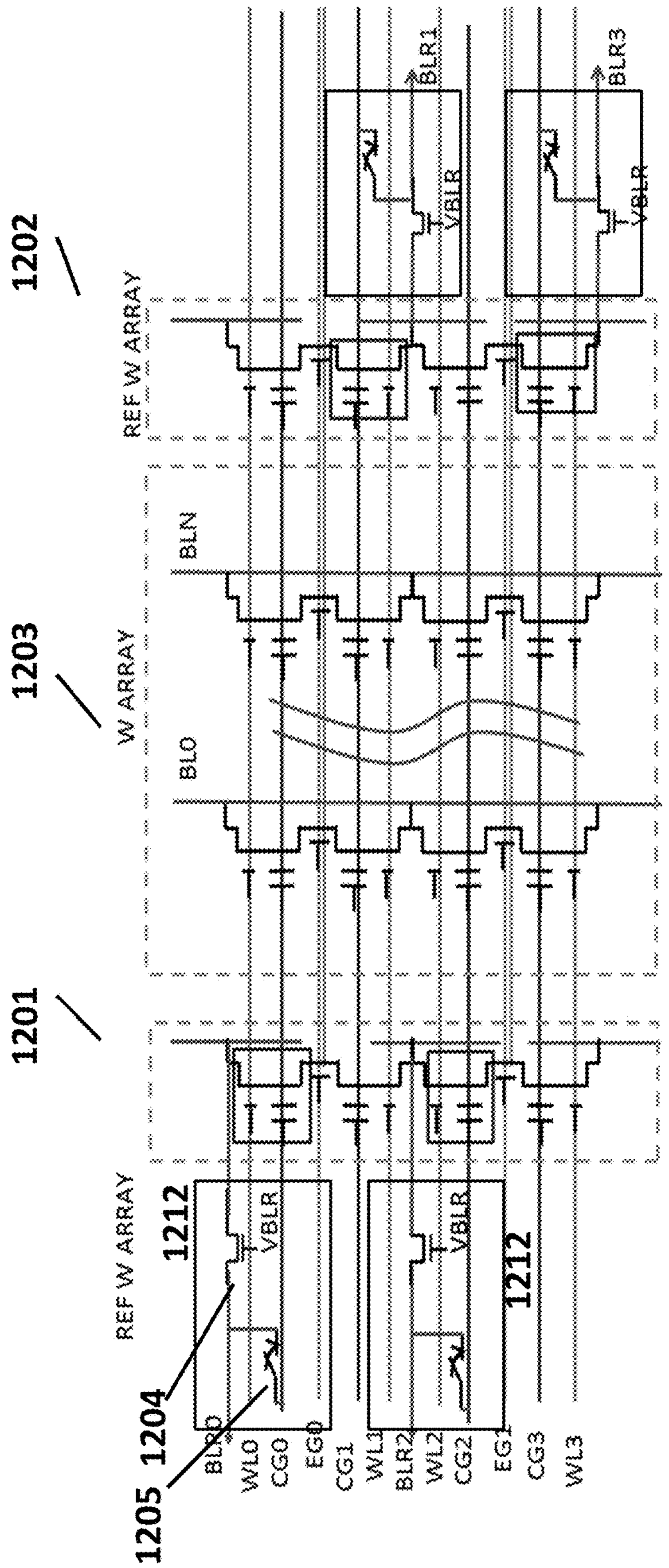
FIG. 12 depicts another example of a VMM system.
Figure 13:
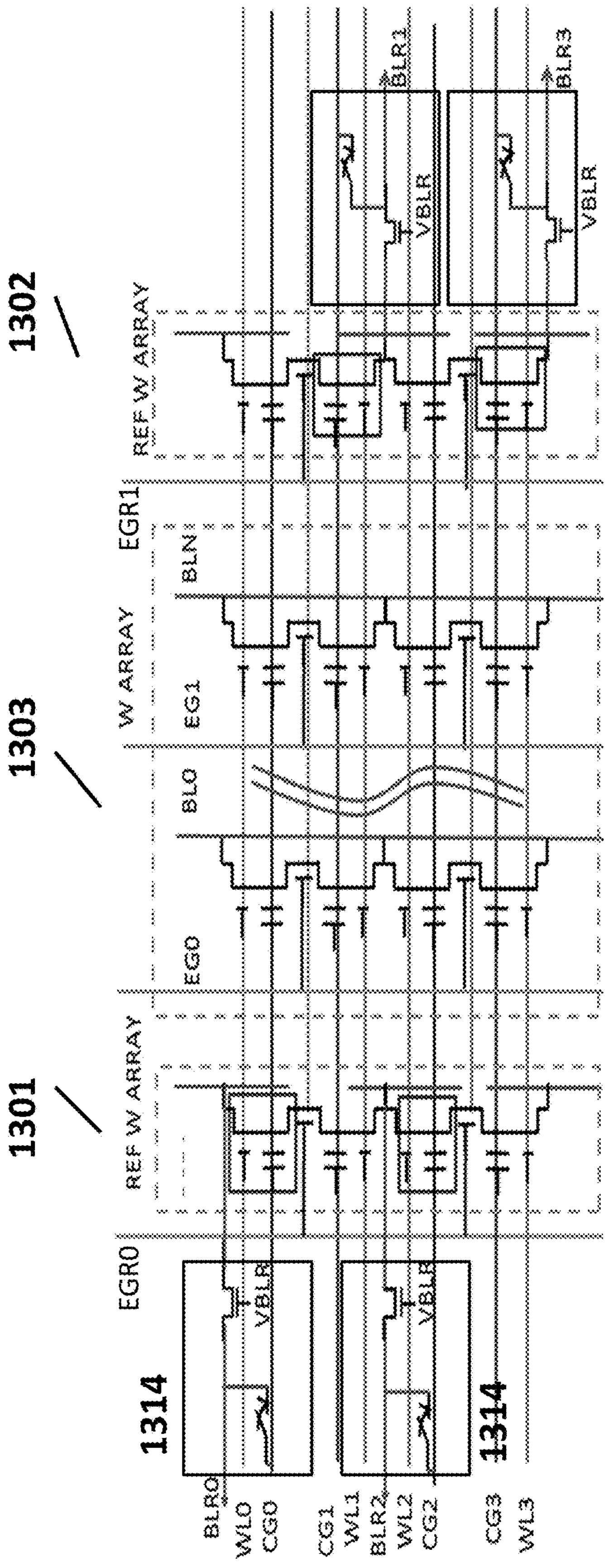
FIG. 13 depicts another example of a VMM system.
Figure 14:
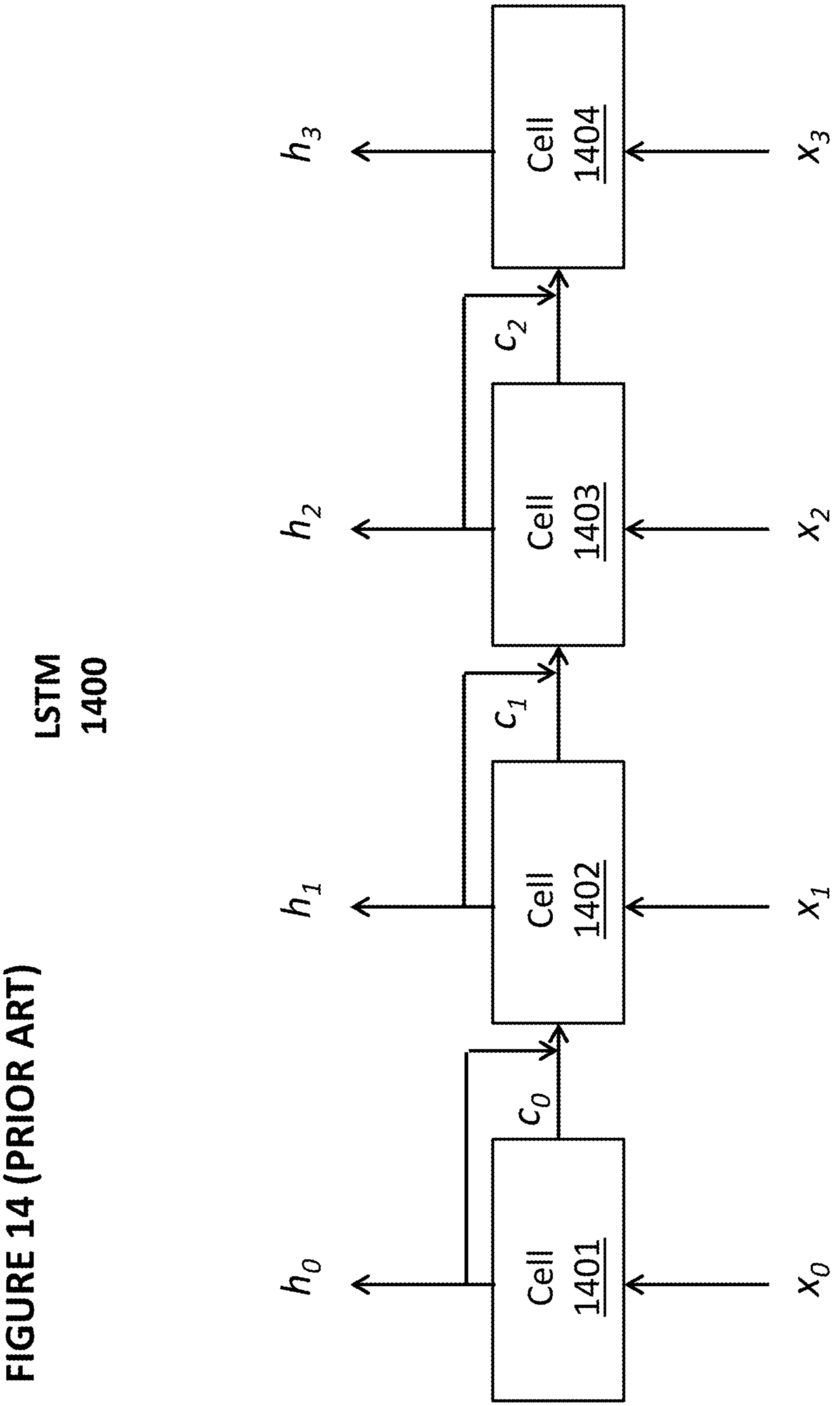
FIG. 14 depicts a prior art long short-term memory system.
Figure 15:
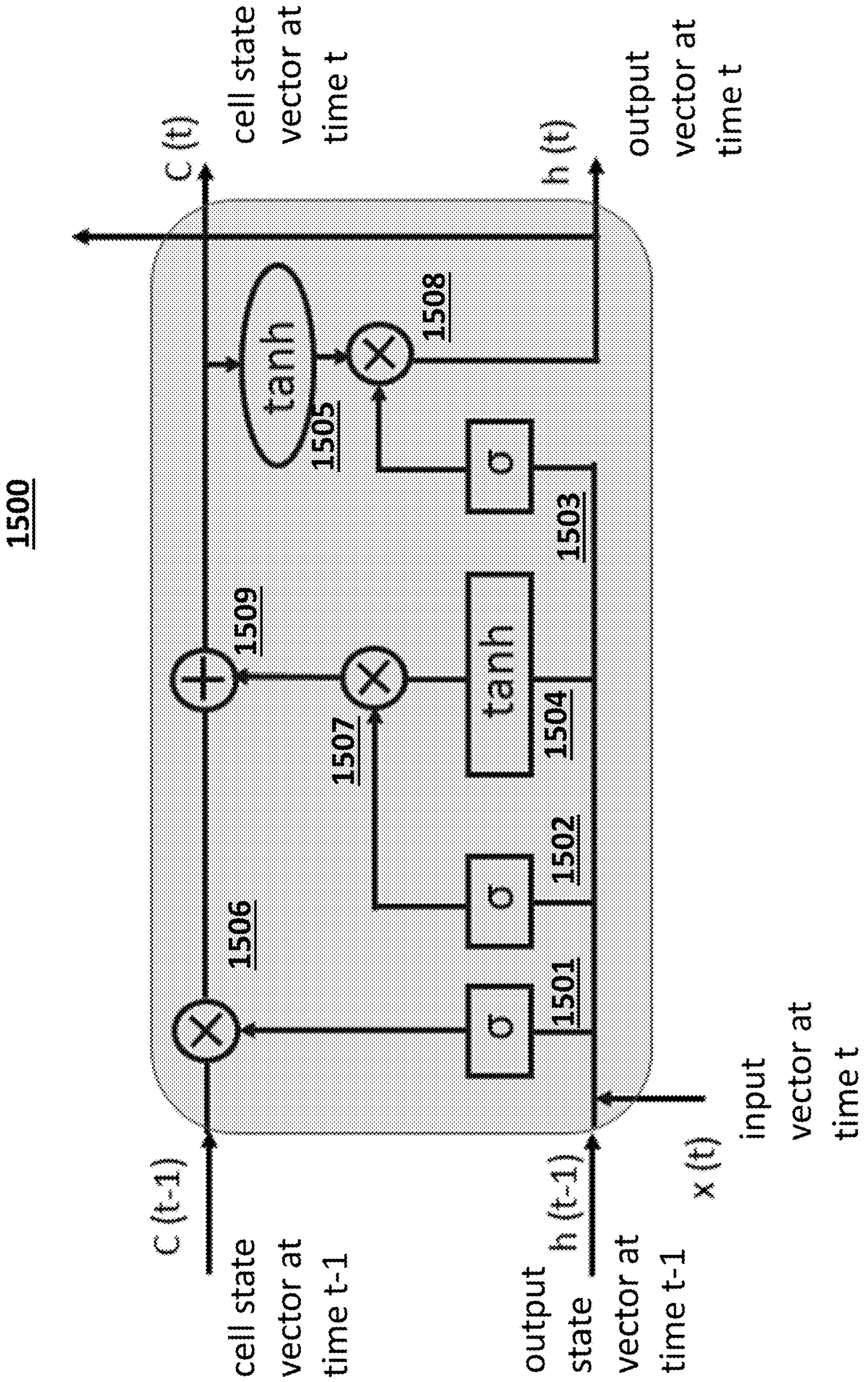
FIG. 15 depicts an example cell for use in a long short-term memory system.
Figure 16:
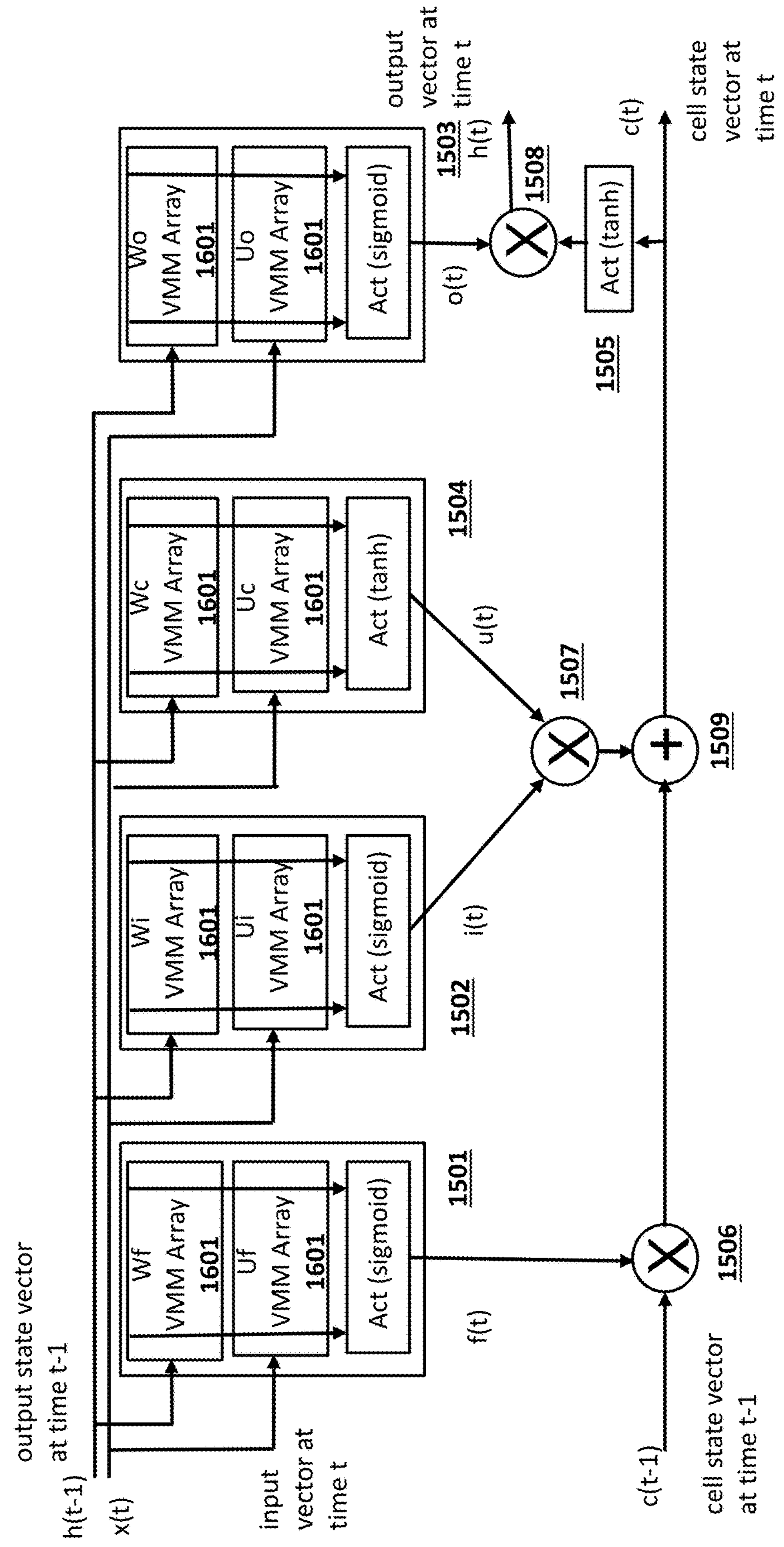
FIG. 16 depicts an example implementation of the cell of FIG. 15.
Figure 17:
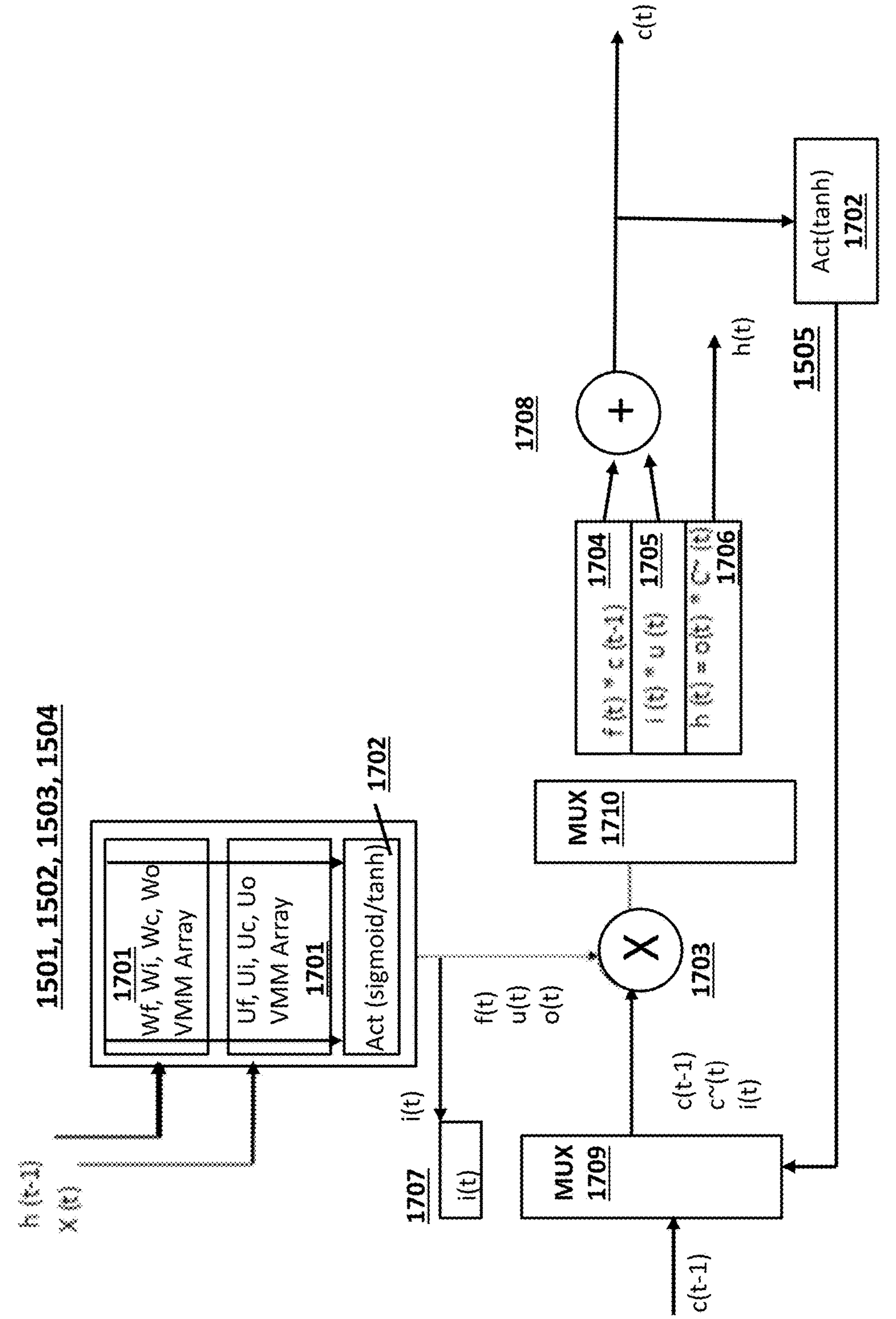
FIG. 17 depicts another example implementation of the cell of FIG. 15.
Figure 18:
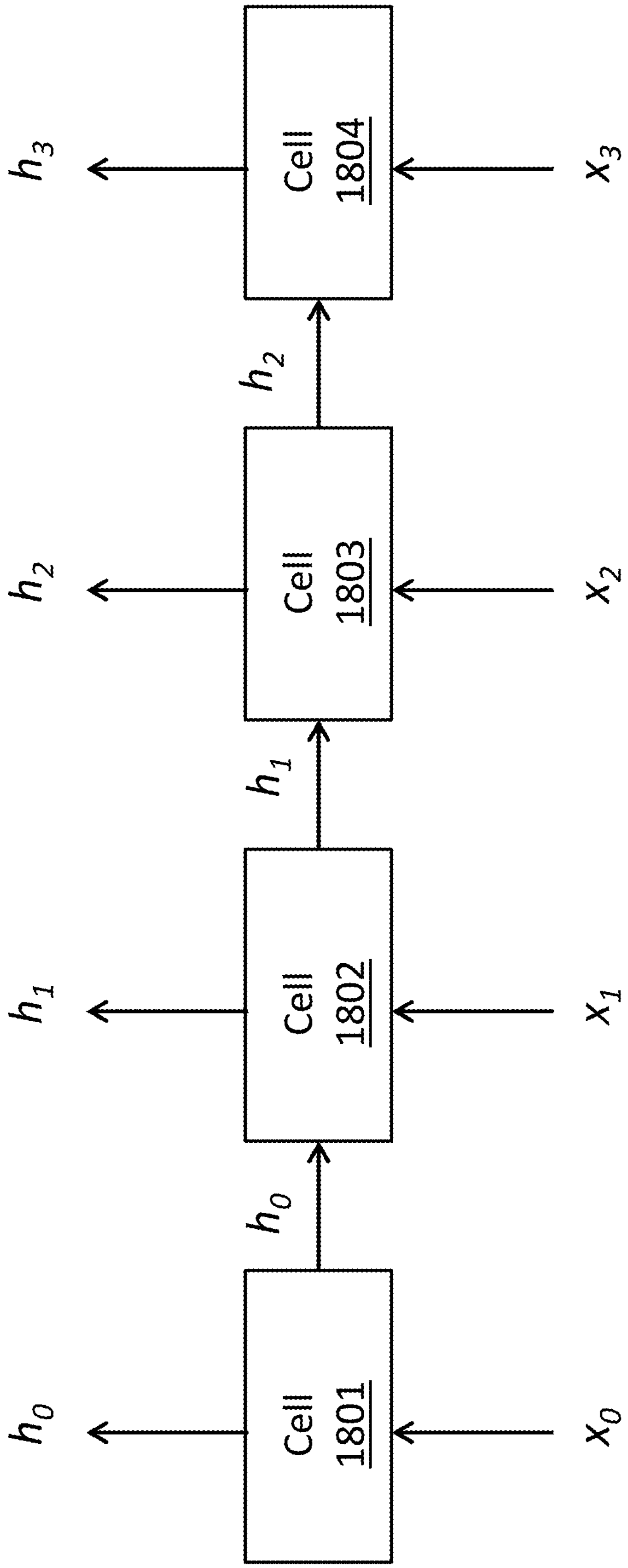
FIG. 18 depicts a prior art gated recurrent unit system.
Figure 19:
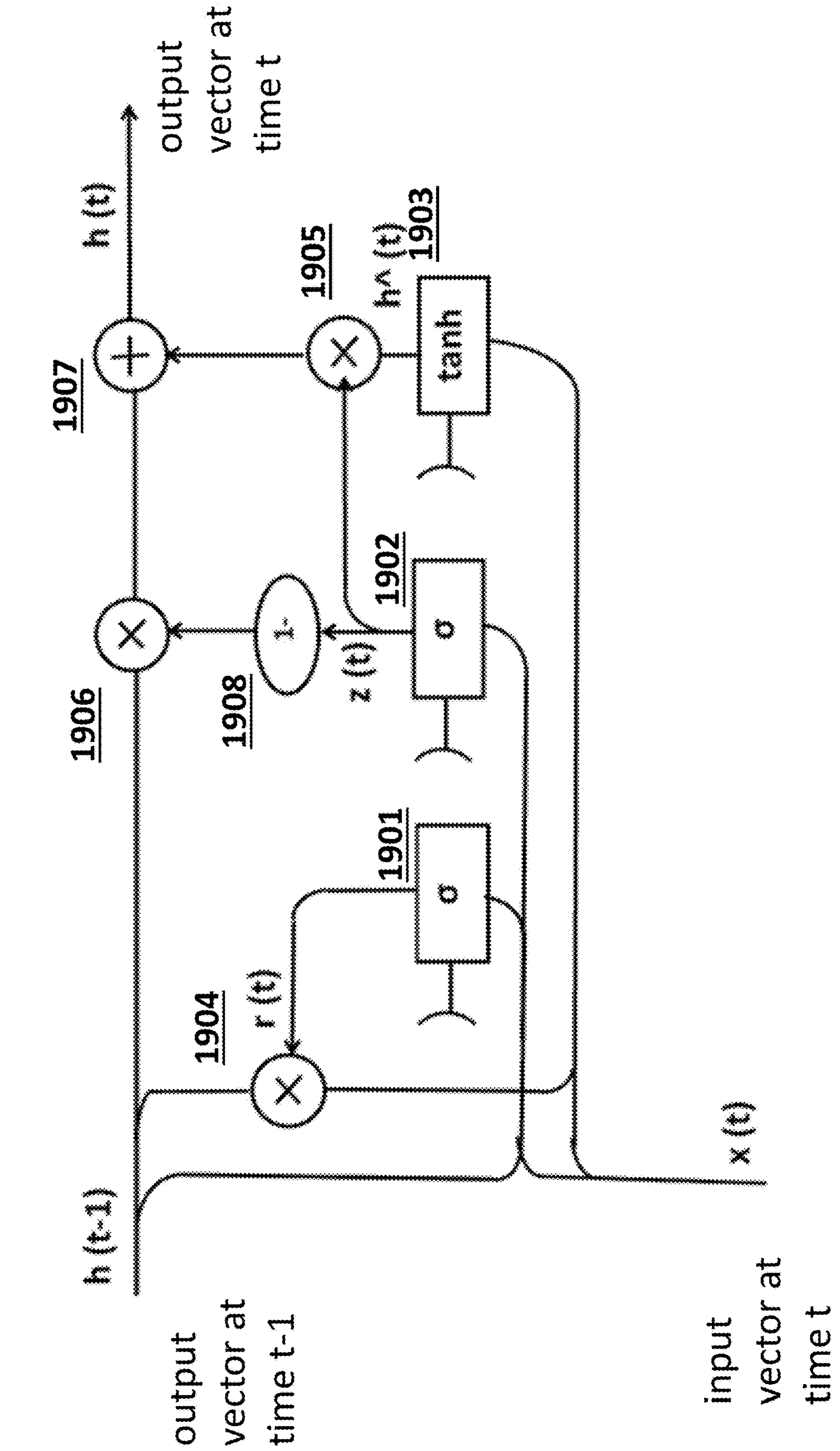
FIG. 19 depicts an example cell for use in a gated recurrent unit system.
Figure 20:
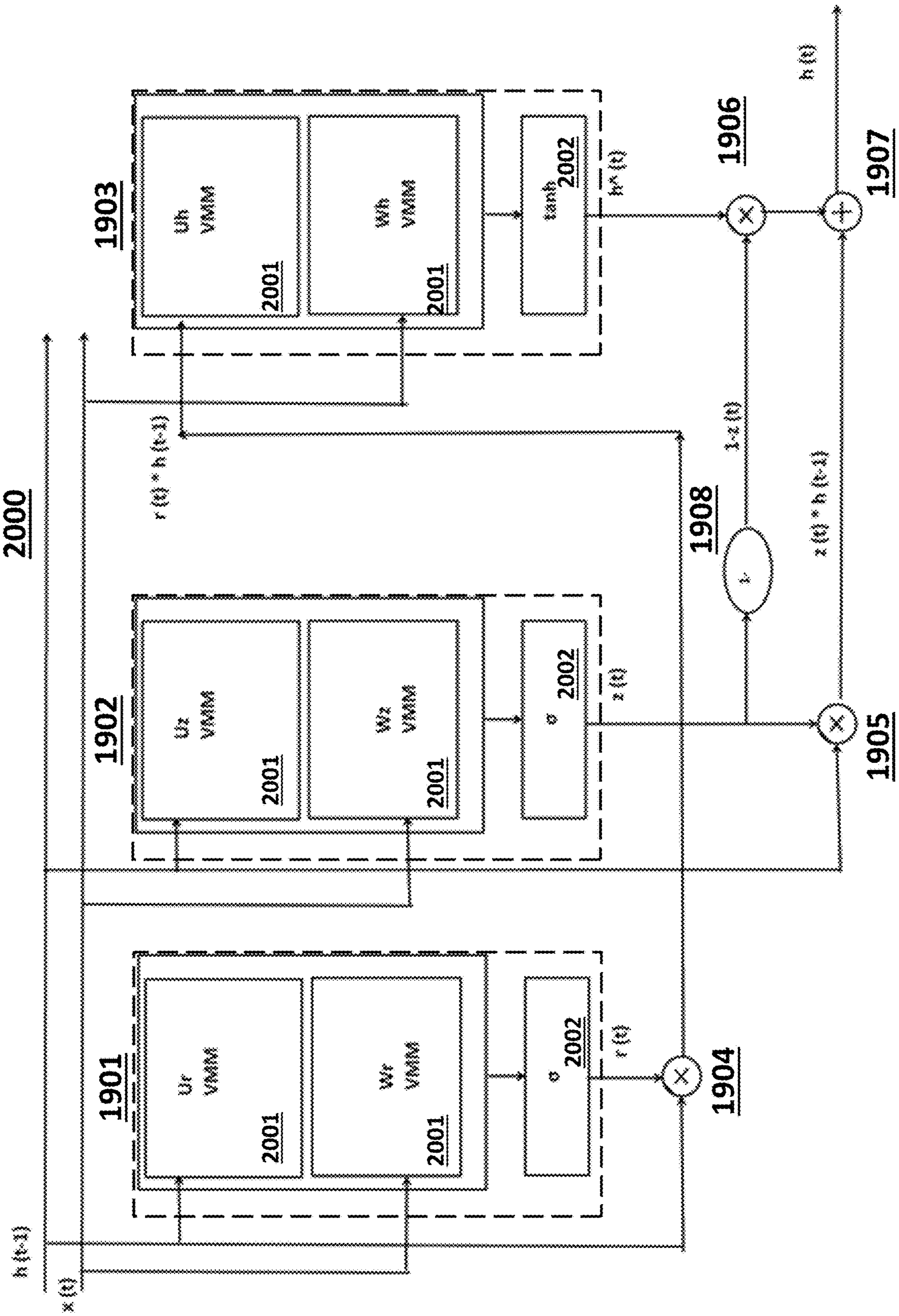
FIG. 20 depicts an example implementation t of the cell of FIG. 19.
Figure 21:
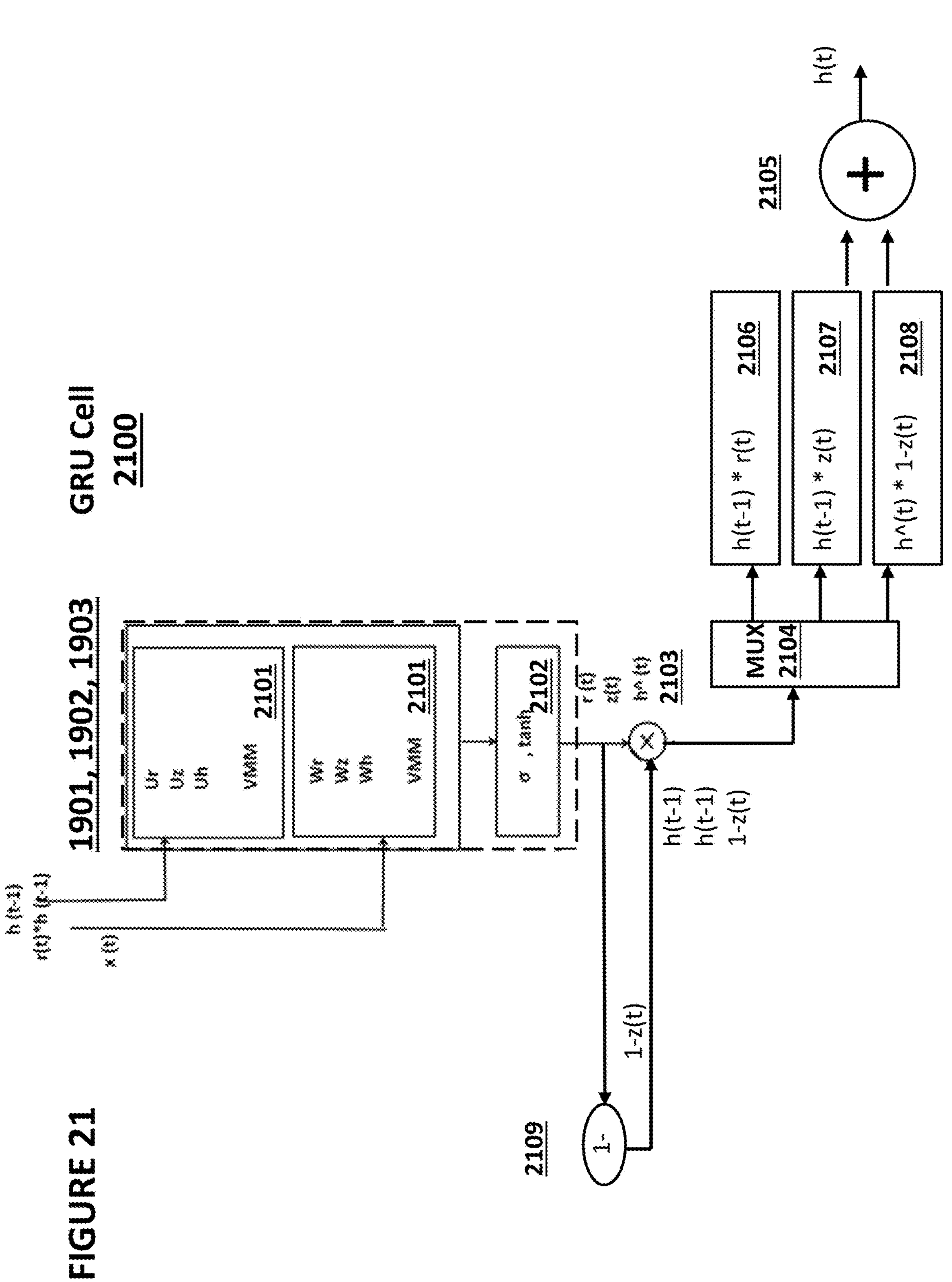
FIG. 21 depicts another example implementation of the cell of FIG. 19.
Figure 22:
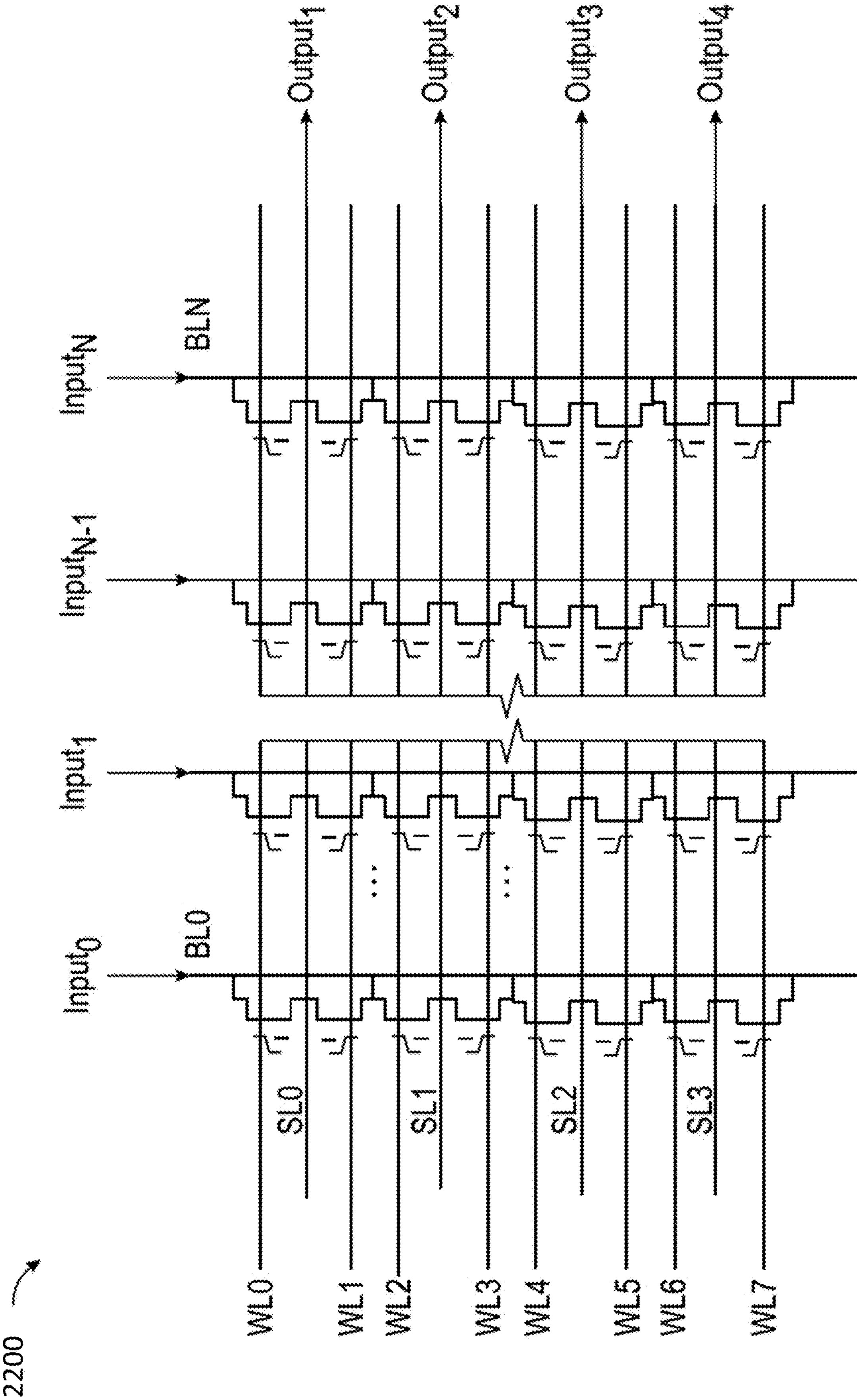
FIG. 22 depicts another example of a VMM system.
Figure 23:
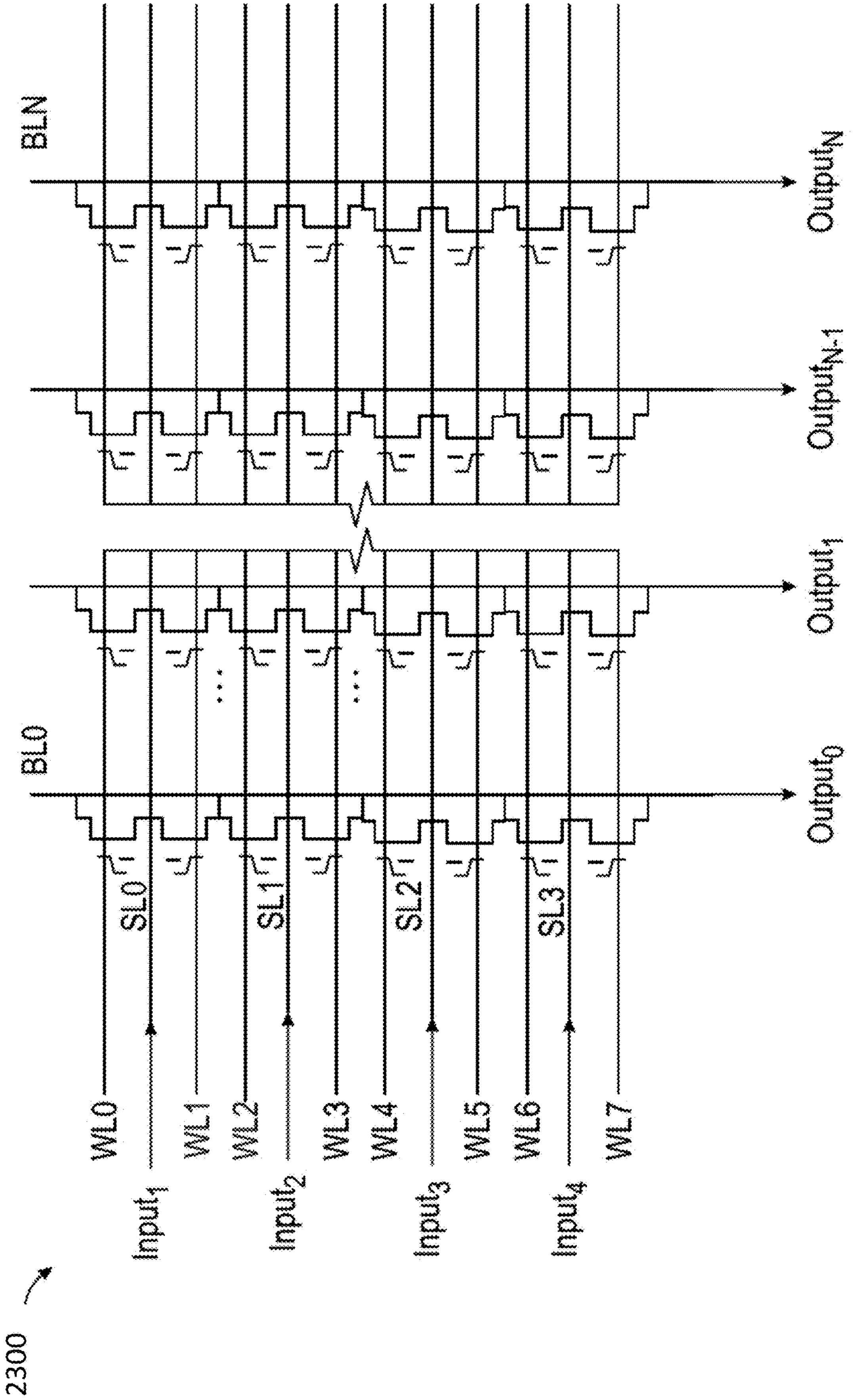
FIG. 23 depicts another example of a VMM system.
Figure 24:
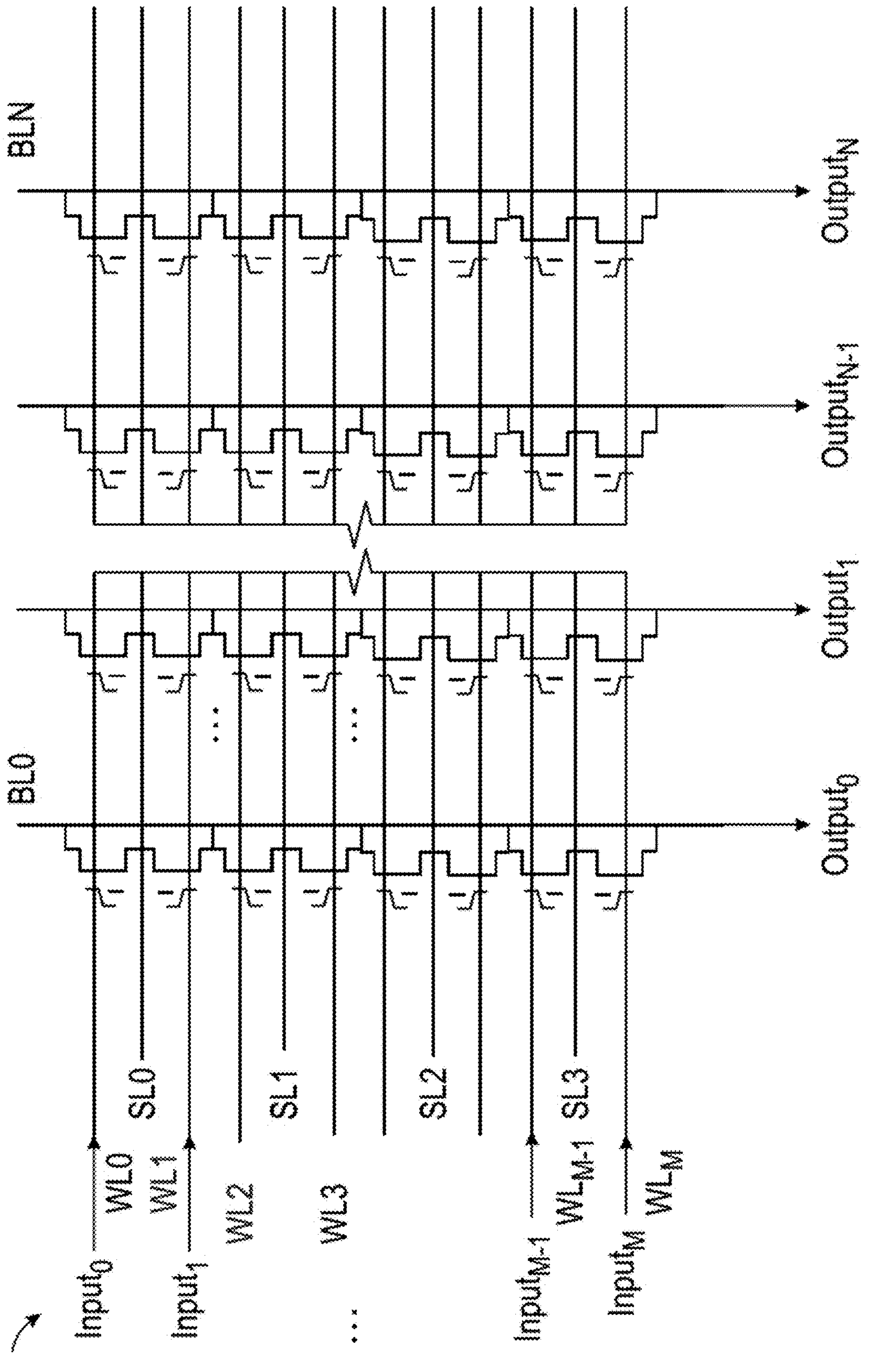
FIG. 24 depicts another example of a VMM system.
Figure 25:
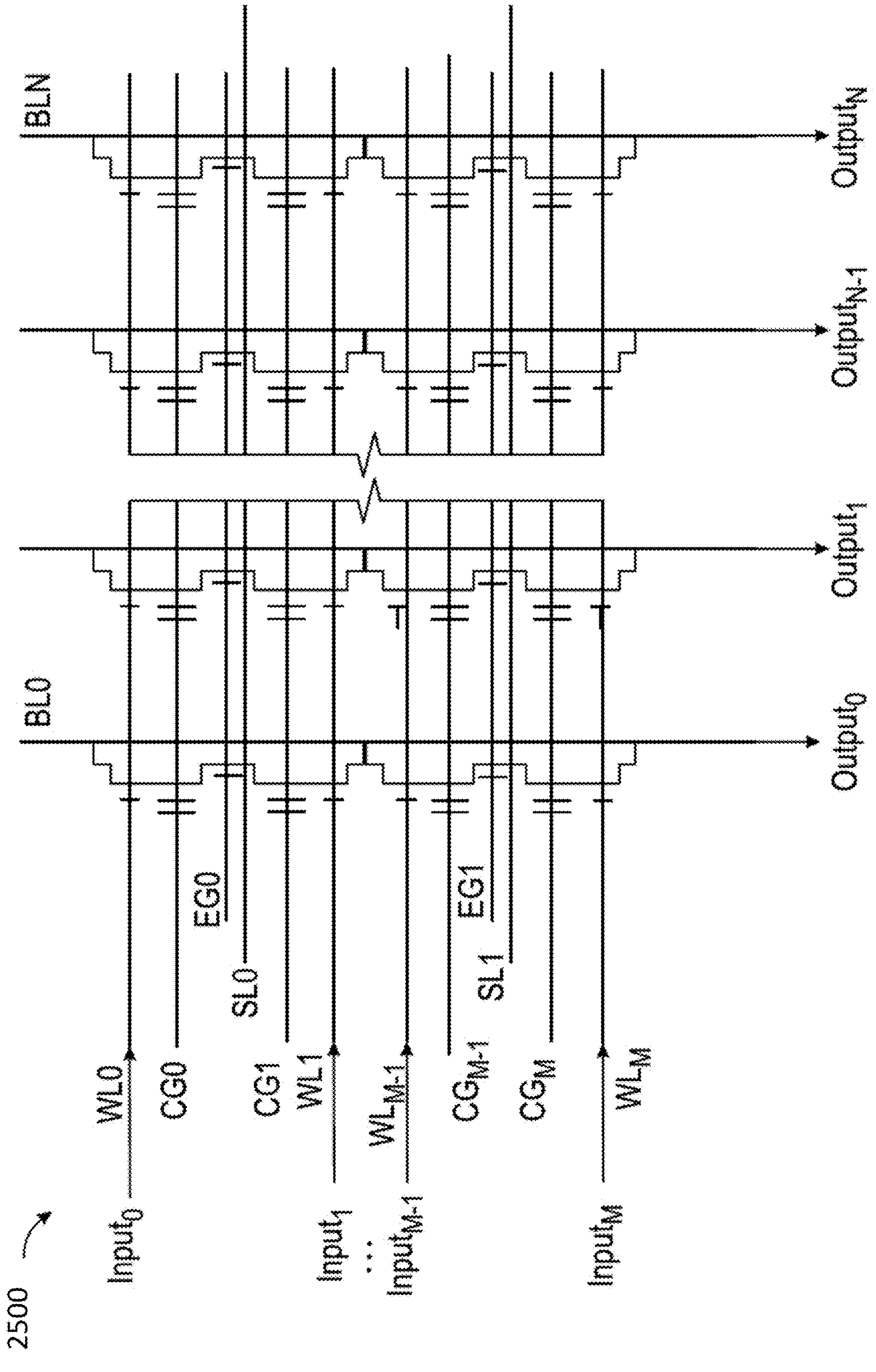
FIG. 25 depicts another example of a VMM system.
Figure 26:
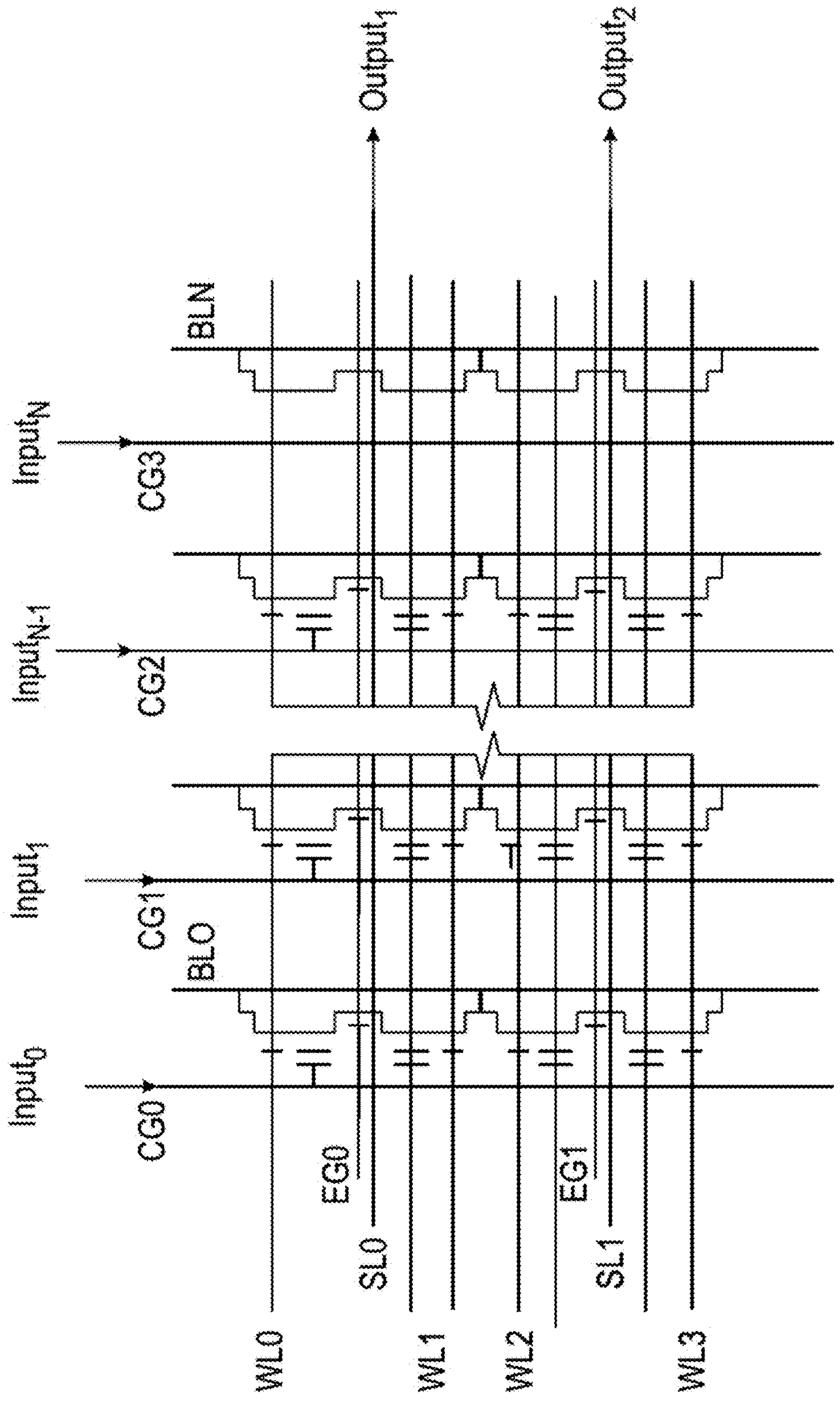
FIG. 26 depicts another example of a VMM system.
Figure 27:
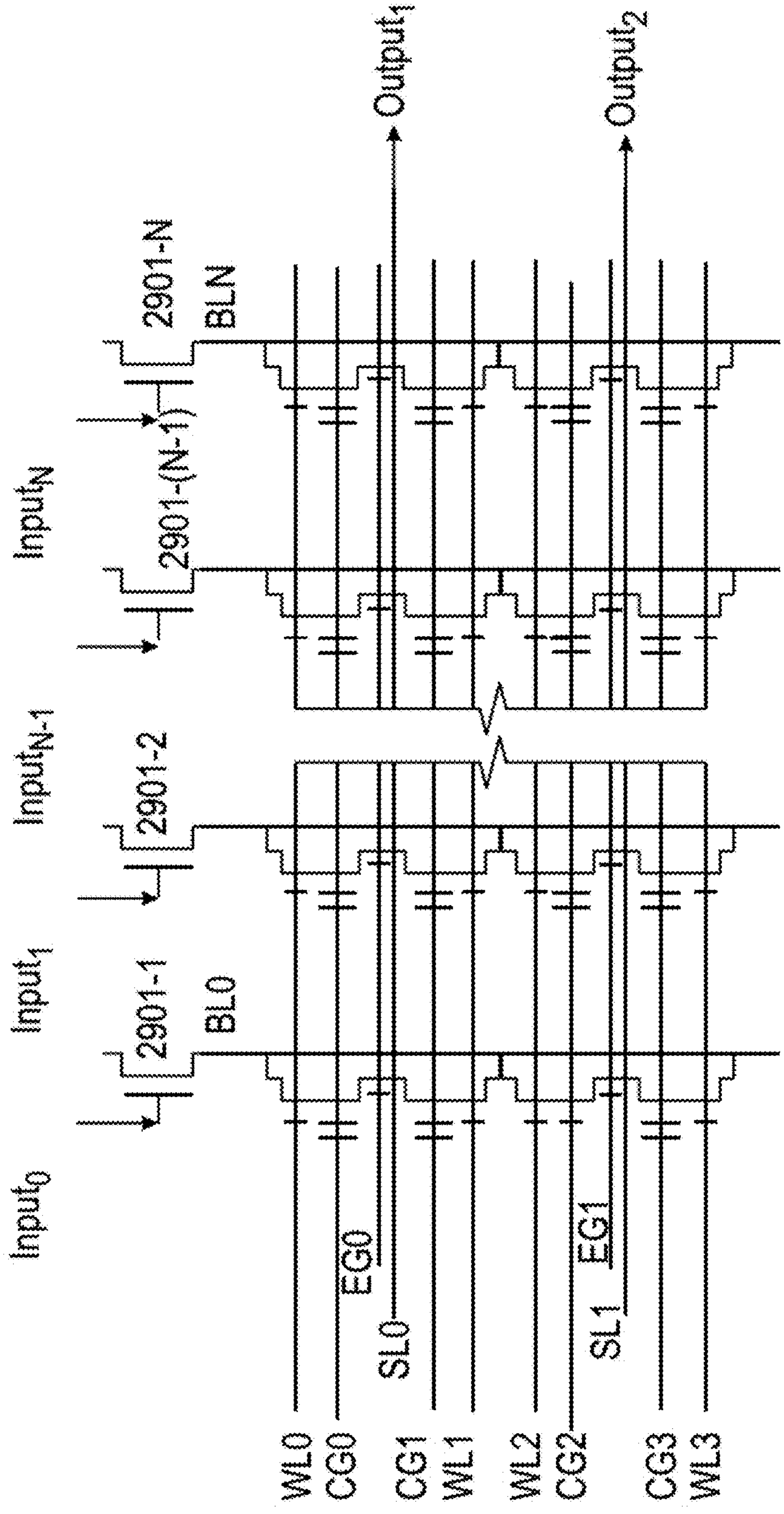
FIG. 27 depicts another example of a VMM system.
Figure 28:
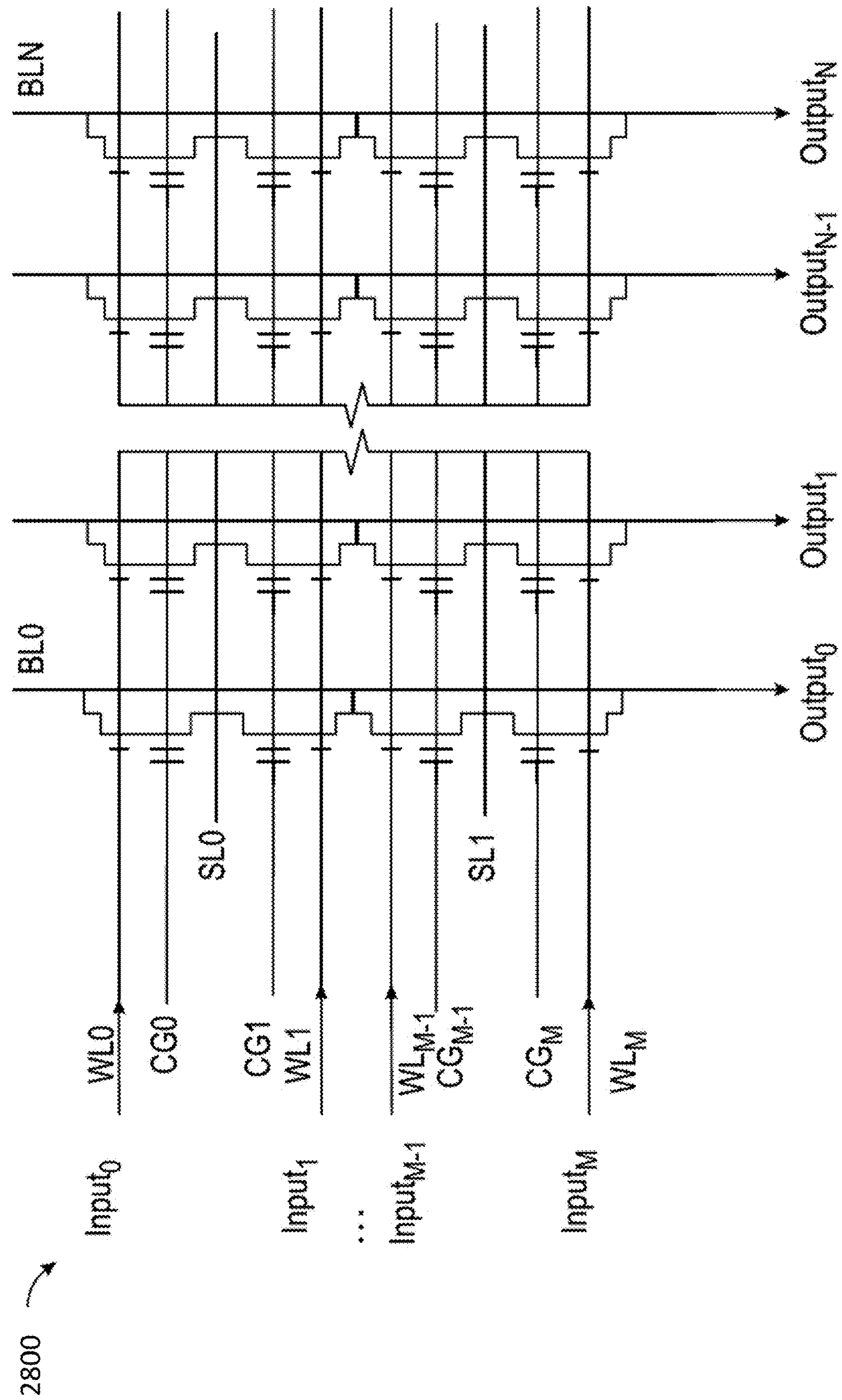
FIG. 28 depicts another example of a VMM system.
Figure 29:
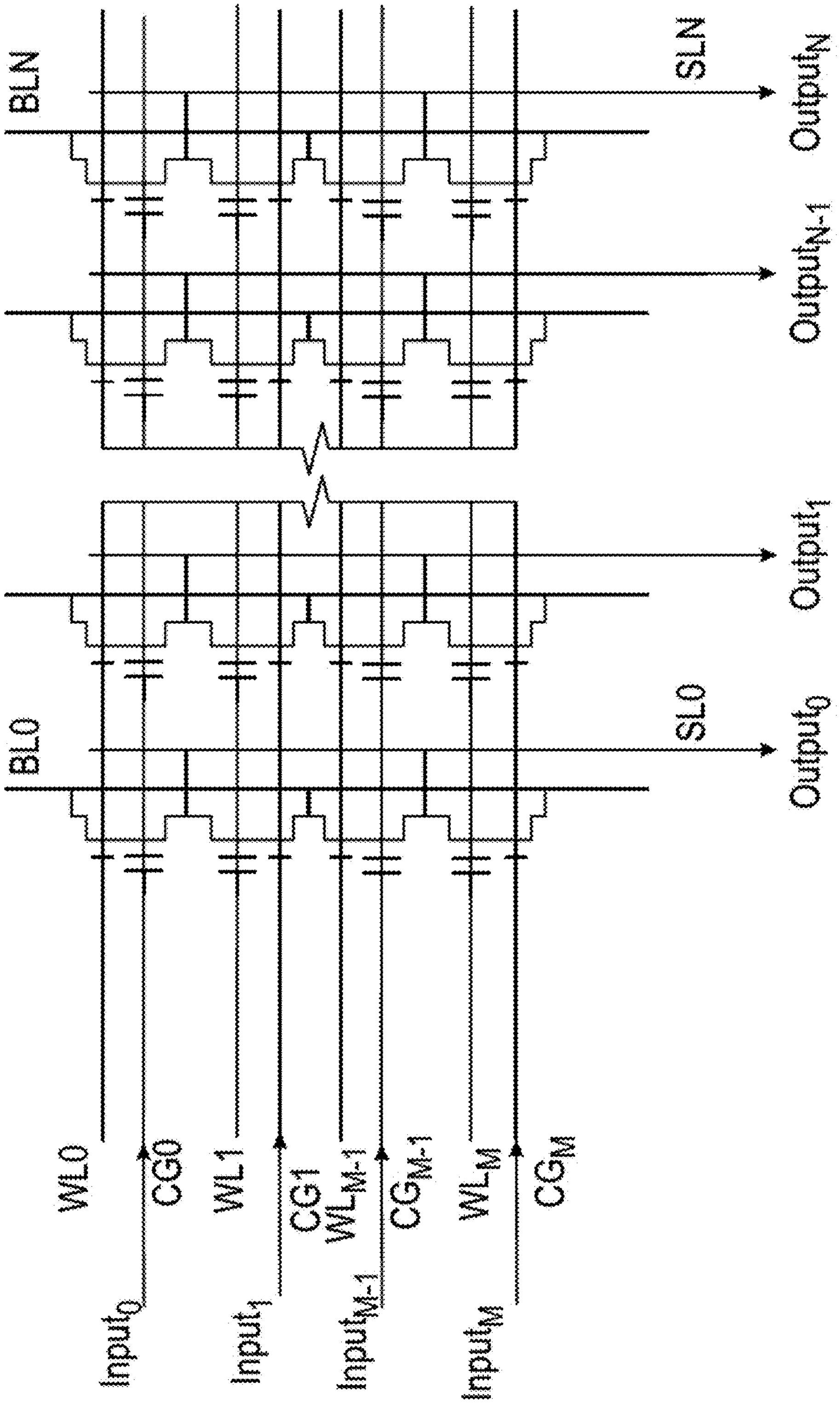
FIG. 29 depicts another example of a VMM system.
Figure 30:
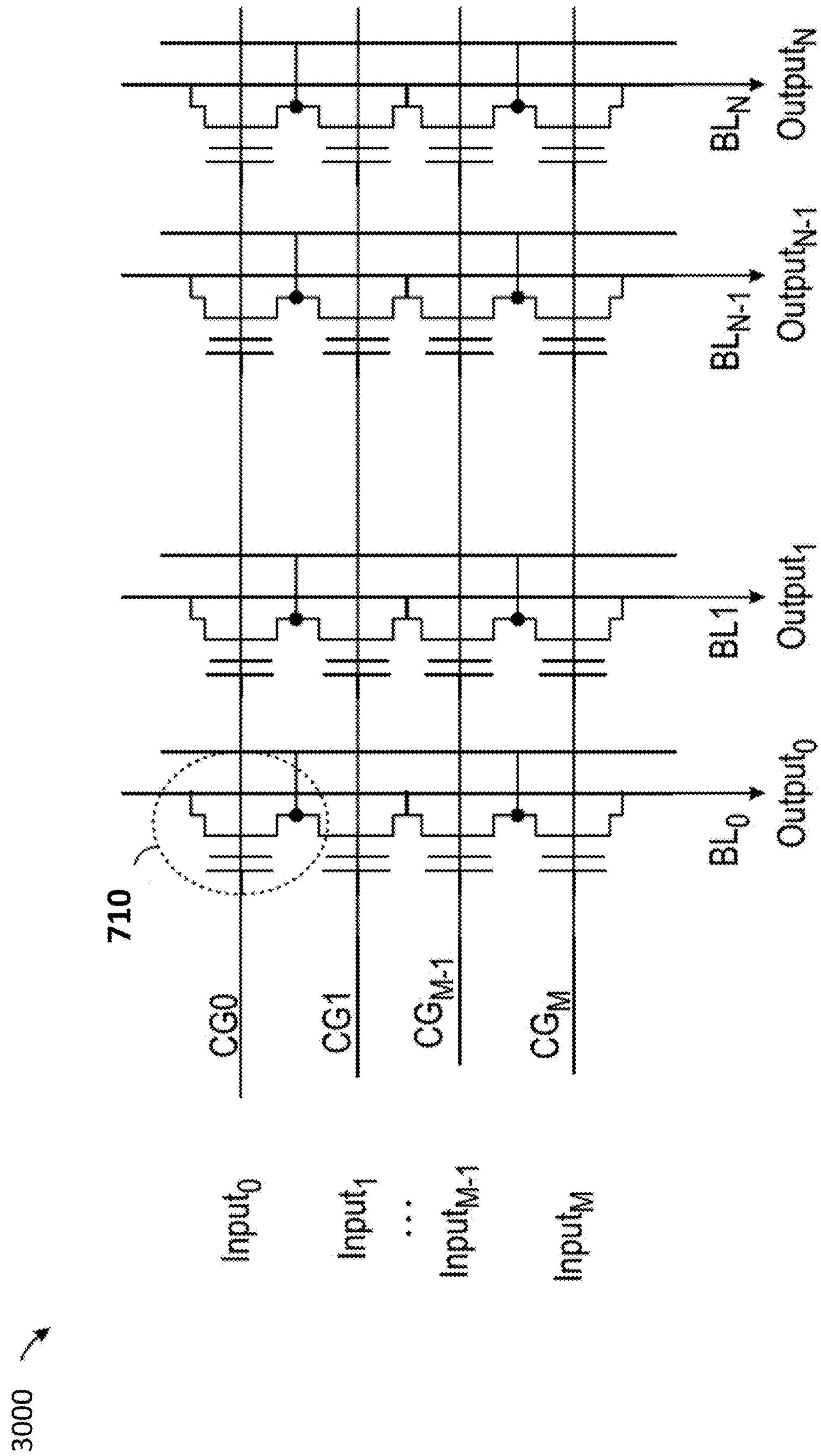
FIG. 30 depicts another example of a VMM system.
Figure 31:
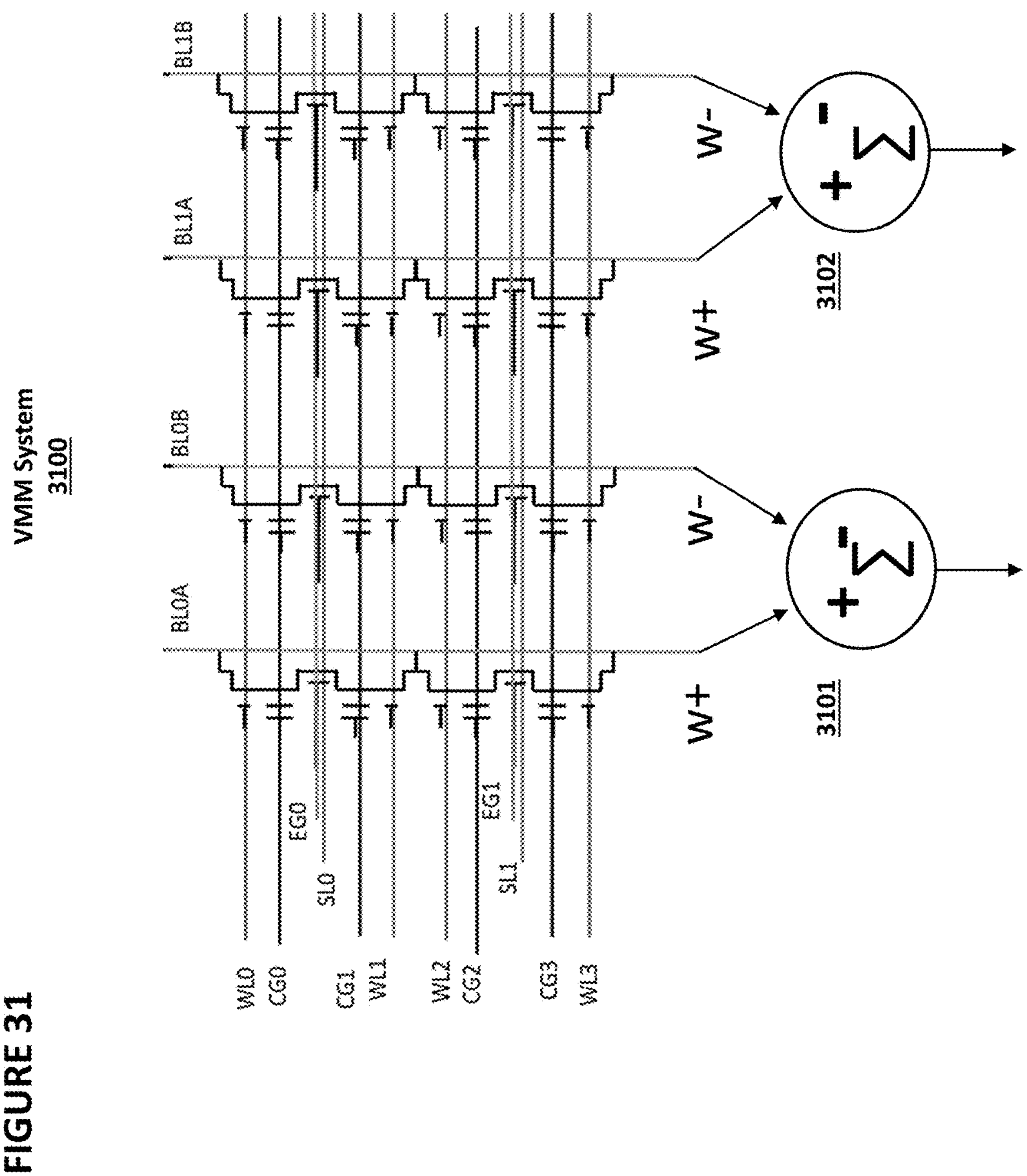
FIG. 31 depicts another example of a VMM system.
Figure 32:
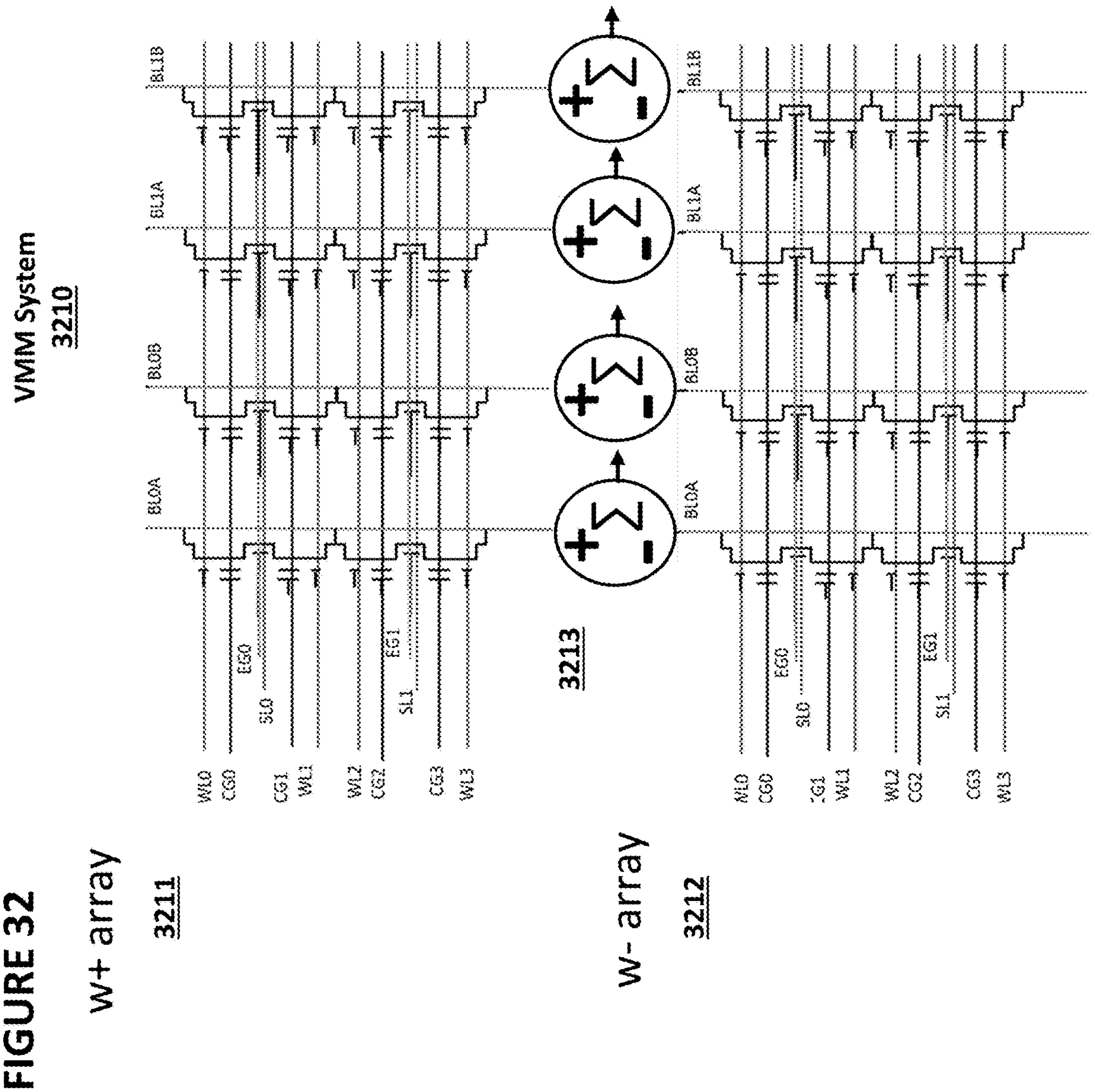
FIG. 32 depicts another example of a VMM system.
Figure 33:
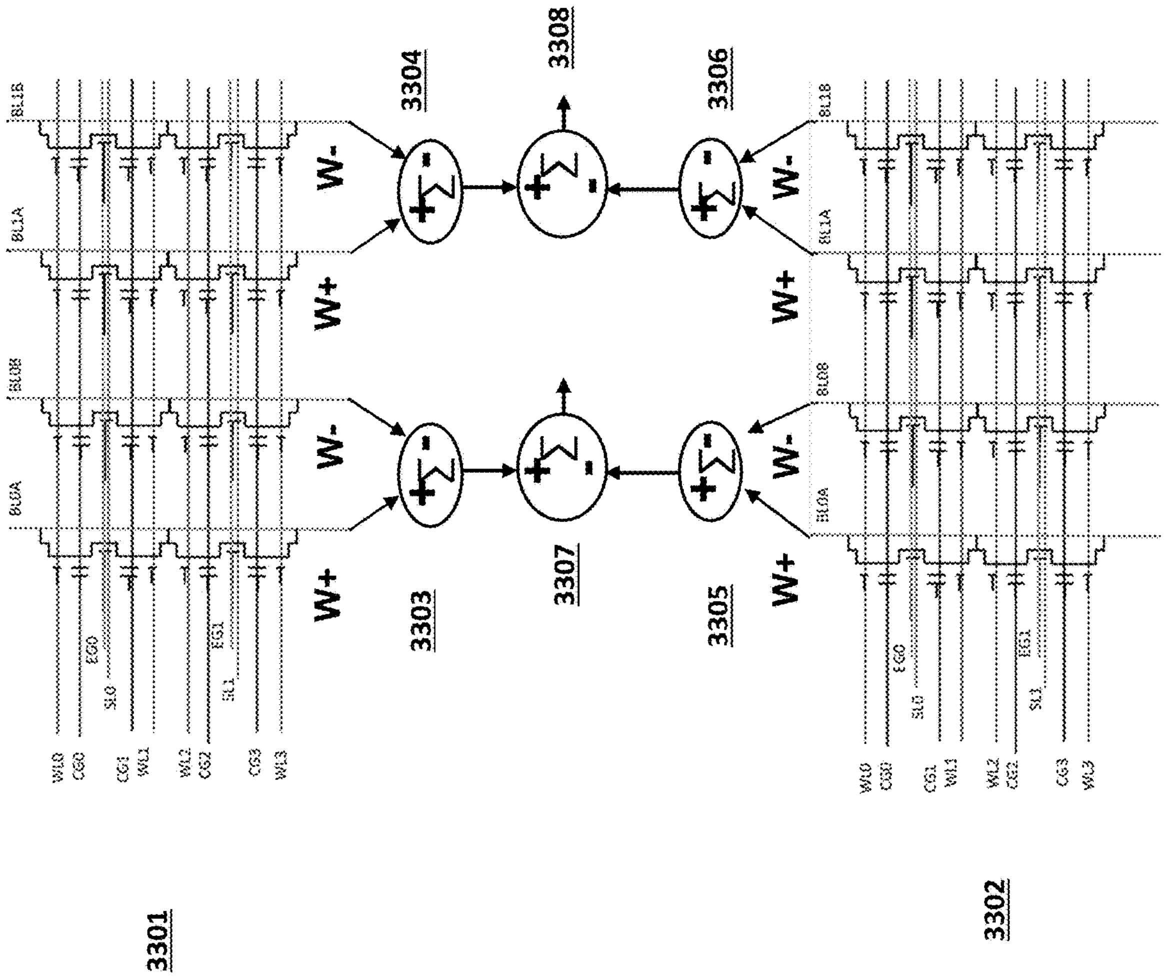
FIG. 33 depicts another example of a VMM system.
Figure 34:
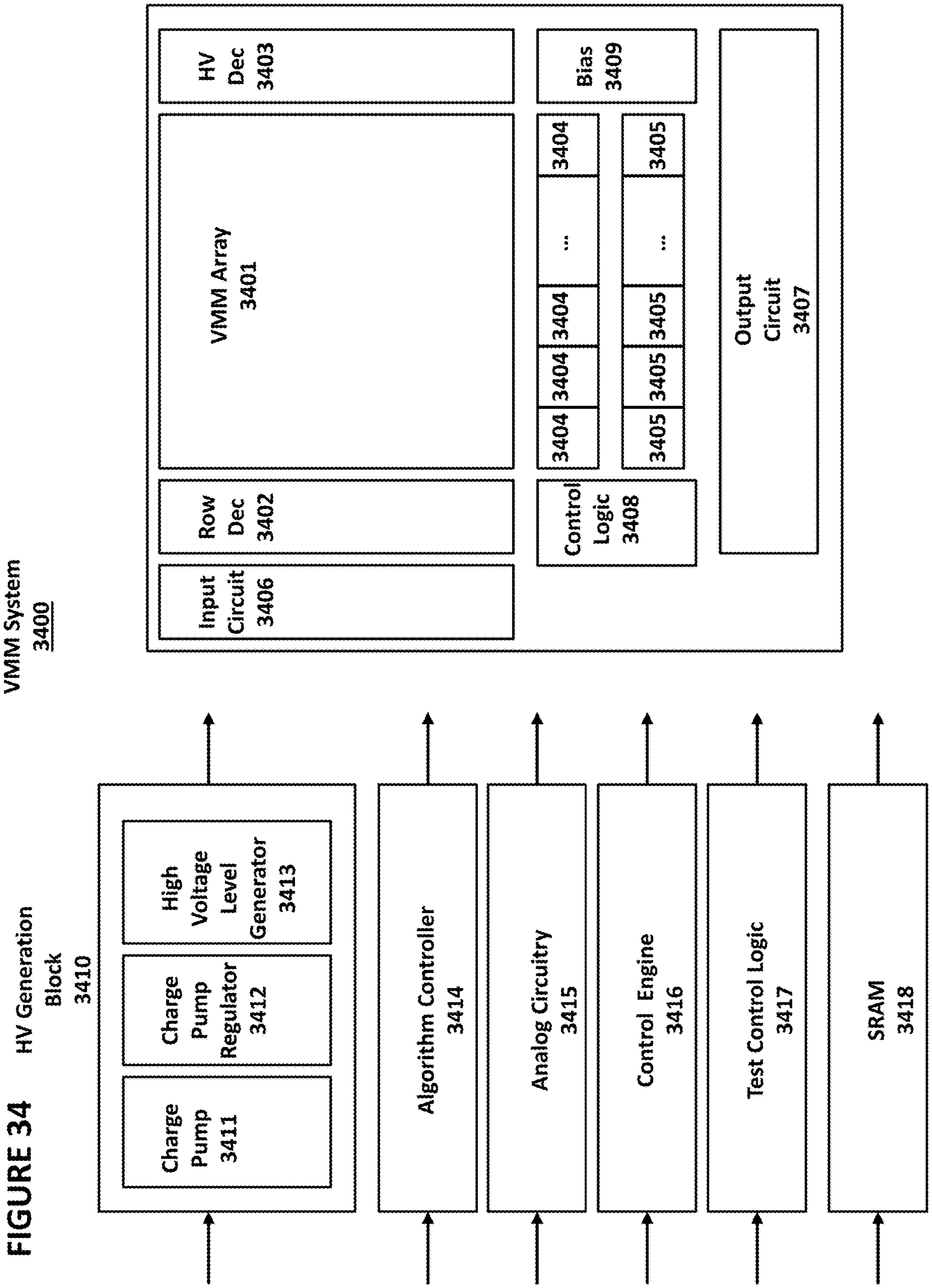
FIG. 34 depicts a VMM system.

FIG. 34 depicts a block diagram of VMM system 3400. VMM system 3400 comprises VMM array 3401 (which also can be referred to as a neural network array), row decoder 3402, high voltage decoder 3403, column decoders 3404, bit line drivers 3405 (such as bit line control circuitry for programming), input circuit 3406, output circuit 3407, control logic 3408, and bias generator 3409. VMM system 3400 further comprises high voltage generation block 3410, which comprises charge pump 3411, charge pump regulator 3412, and high voltage level generator 3413. VMM system 3400 further comprises (program/erase, or weight tuning) algorithm controller 3414, analog circuitry 3415, control engine 3416 (that may include functions such as arithmetic functions, activation functions, embedded microcontroller logic, without limitation), test control logic 3417, and static random access memory (SRAM) block 3418 to store intermediate data such as for input circuits (e.g., activation data) or output circuits (neuron output data, partial sum output neuron data) or data in for programming (such as data in for a whole row or for multiple rows). VMM array 3401 comprises an array of non-volatile memory cells arranged into rows and columns, where the non-volatile memory cells are split-gate flash memory cells of the type shown in FIG. 2, 3, or 4, or stacked-gate flash memory cells as in FIG. 5 as memory cells 210, 310, 410, or 510, respectively, or are of other types of non-volatile memory cell.

The input circuit 3406 may include circuits such as a DAC (digital to analog converter), DPC (digital to pulses converter, digital to time modulated pulse converter), AAC (analog to analog converter, such as a current to voltage converter, logarithmic converter), PAC (pulse to analog level converter), or any other type of converter. The input circuit 3406 may implement one or more of normalization, linear or non-linear up/down scaling functions, or arithmetic functions. The input circuit 3406 may implement a temperature compensation function for input levels. The input circuit 3406 may implement an activation function such as a rectified linear activation function (ReLU) or sigmoid. Input circuit 3406 may store digital activation data to be applied as, or combined with, an input signal during a program or read operation. The digital activation data can be stored in registers. Input circuit 3406 may comprise circuits to drive the array terminals, such as CG, WL, EG, and SL lines, which may include sample-and-hold circuits and buffers. A DAC can be used to convert digital activation data into an analog input voltage to be applied to the array. Input circuit 3406 may also contain the masking circuits described below.

Output circuit 3407 may include circuits such as an ITV (current-to-voltage circuit), ADC (analog to digital converter, to convert neuron analog output to digital bits), AAC (analog to analog converter, such as a current to voltage converter, logarithmic converter), APC (analog to pulse(s) converter, analog to time modulated pulse converter), or any other type of converters. Output circuit 3407 may convert array outputs into activation data. Output circuit 3407 may implement an activation function such as ReLU or sigmoid. Output circuit 3407 may implement one or more of statistic normalization, regularization, up/down scaling/gain functions, statistical rounding, or arithmetic functions (e.g., add, subtract, divide, multiply, shift, log) for neuron outputs. Output circuit 3407 may implement a temperature compensation function for neuron outputs or array outputs (such as bitline output) so as to keep power consumption of the array approximately constant or to improve precision of the array (neuron) outputs such as by keeping the IV slope approximately the same over temperature. Output circuit 3407 may comprise registers for storing output data. Output circuit 3407 may also contain the masking circuits described below.

Figure 35:
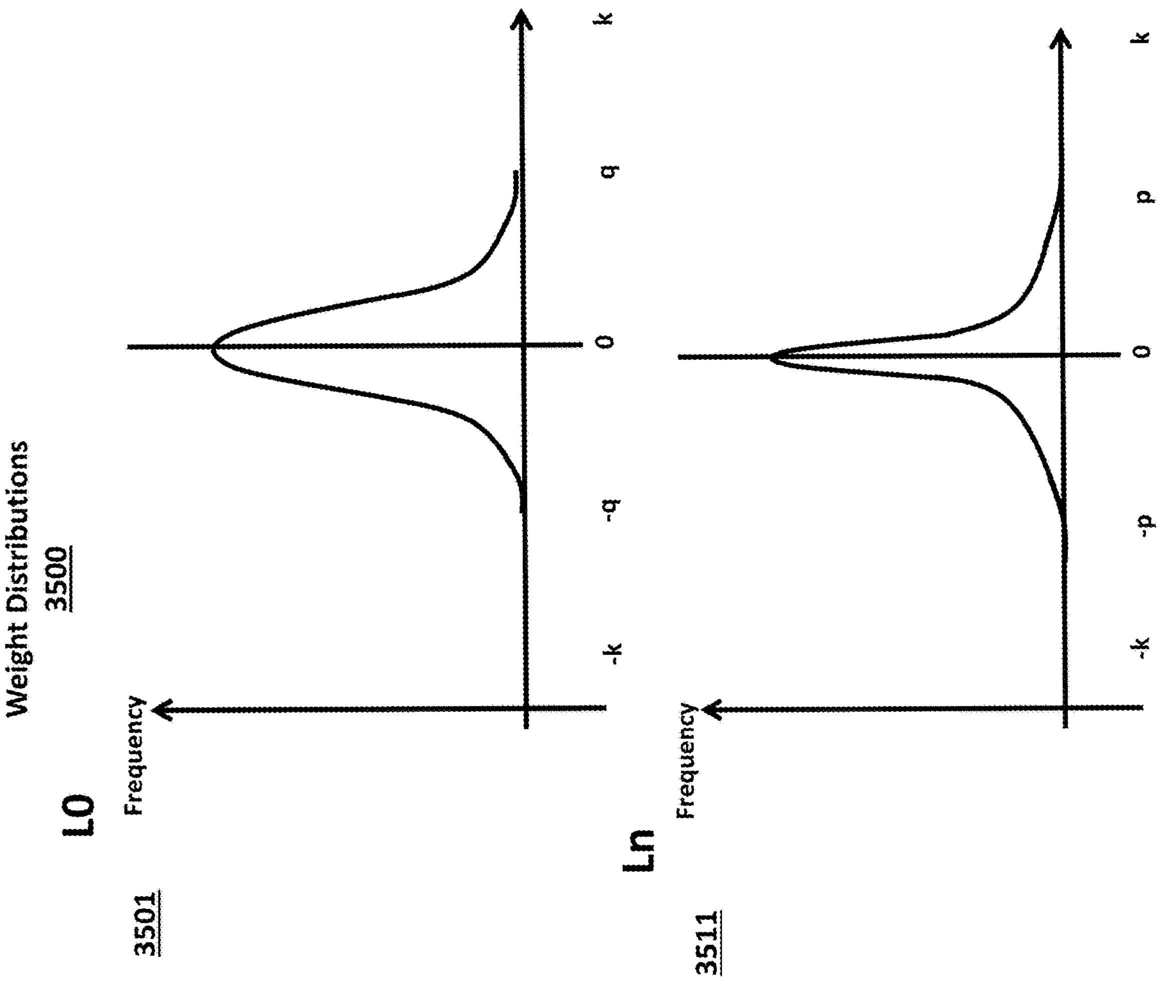
FIG. 35 depicts an example of weight distributions in a VMM system.

FIG. 35 depicts an example of weight distributions 3500 in typical VMM operations in a neural network. Diagrams 3501 and 3511 shows the weight distributions for layers L0 and Ln, respectively, as examples. As shown, the majority of weights are at, or near, '0'. There are very few weights that have value >q or less than −q for L0 and >p and <−p for Ln. Values at the extremes are sometimes referred to as sparse. Applicants have observed that the weight distributions shown are examples of typical distributions that occur in VMM operations.

FIG. 36 depicts an example of row inputs 3600 that are applied to the rows of a VMM array during a typical VMM operation. In example 3601, rows 0 to 15 each receive a row input comprising all 0s, meaning that the multiplication of those rows by the stored weights in the array are intended to yield an output current corresponding to a '0' value. It would be desirable to avoid that operation (i.e., multiply and add operation which involves the input circuit (row DAC) and the output circuit (column ITV+DAC)) altogether and to force the output to a pre-defined state (e.g., '0' value) to decrease power consumption and latency (reduced power and latency since no operation of DAC and ITV+ADC occurs). In example 3602, it can be seen that certain bits in the row input are "0" and certain bits are "1." It can be appreciated that in instance where the row input is applied in a serial fashion to the rows of an array (e.g., one bit location within the row input at a time as indicated by boxes 3602-0, 3602-1, 3602-2, 3602-3, 3602-4, 3602-5, 3602-6, and 3602-7), it would be desirable to avoid operations and to force the output of a row to a pre-defined state (e.g., '0' value) to decrease power consumption and latency when the row input value for the row is "0".

Figure 37:
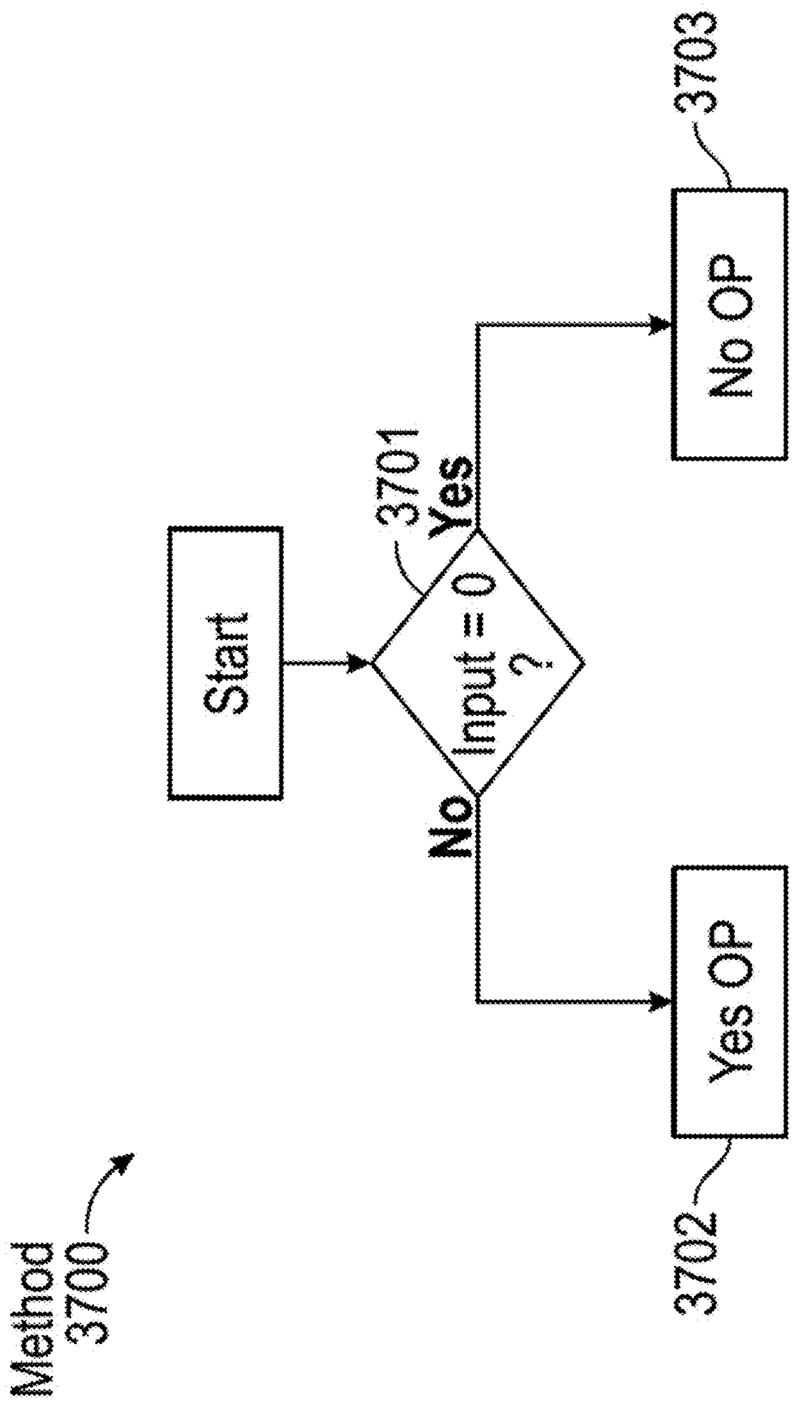
FIG. 37 depicts a method for analyzing row inputs for a VMM system.
Figure 38:
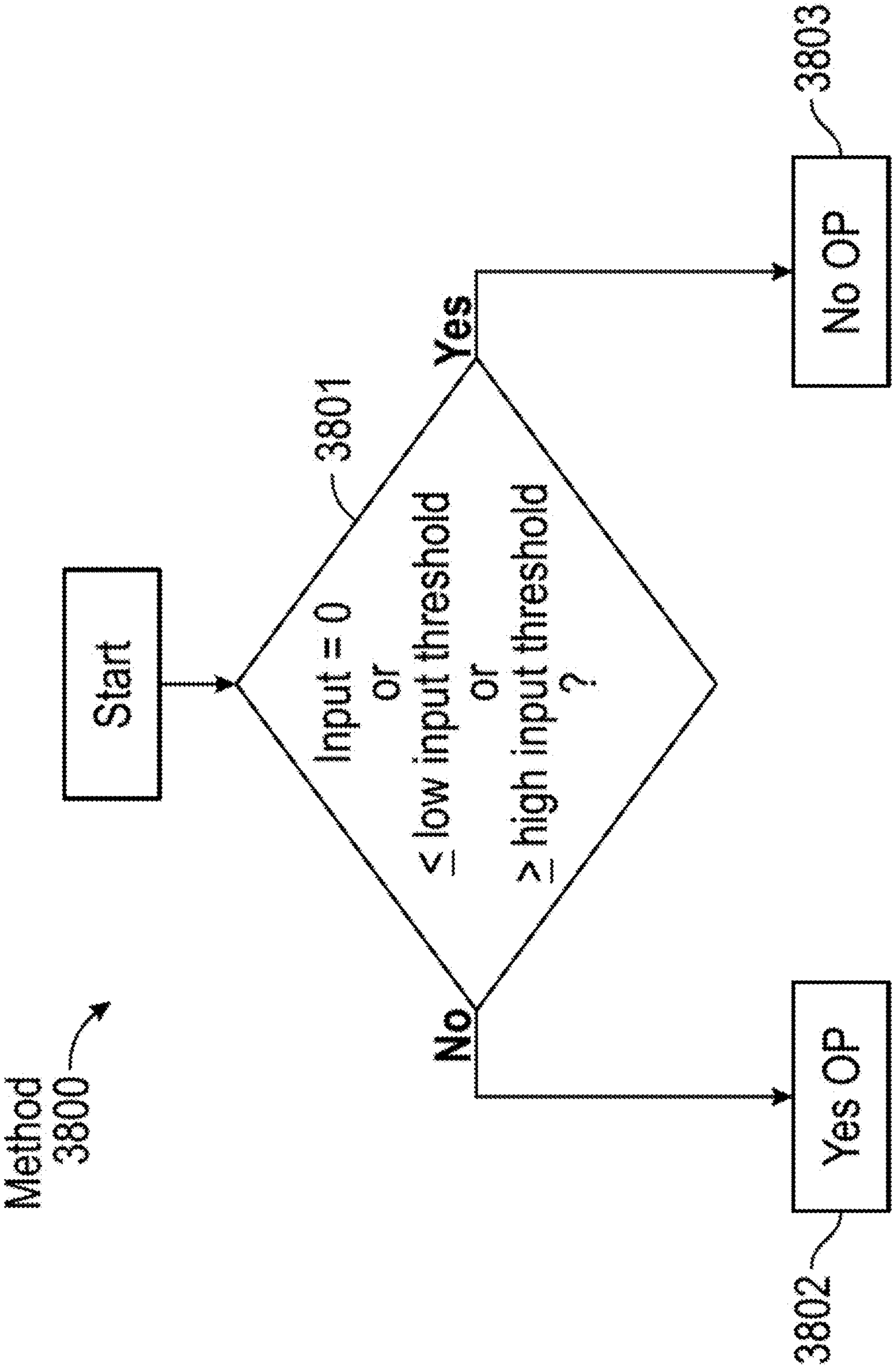
FIG. 38 depicts another method for analyzing row inputs for a VMM system.

FIGS. 37 and 38 depict methods for performing these operations.

FIG. 37 depicts method 3700. A row input value (e.g., the value stored in a row register) is measured (3701). If it is '0,' then no operation (no OP) is performed (3703), meaning that no neural read of the memory array is performed (which means that the DAC, ITV, and ADC circuits in the output block are not activated) and the output value of the output block is kept a pre-defined state. If it is a '1,' then the operation is performed (3702), such as a neural read of the memory array.

FIG. 38 depicts method 3800. A row input value (e.g., the value stored in a row register) is measured (3801). If the value is '0' or if the value is equal to or less than a low input threshold or if the value is equal to or greater than a high input threshold, then no operation is performed (3803). Otherwise, the operation is performed (3802). The low input threshold and high input threshold values are selected such that no significant performance degradation is observed when the operation is not performed.

Figure 39:
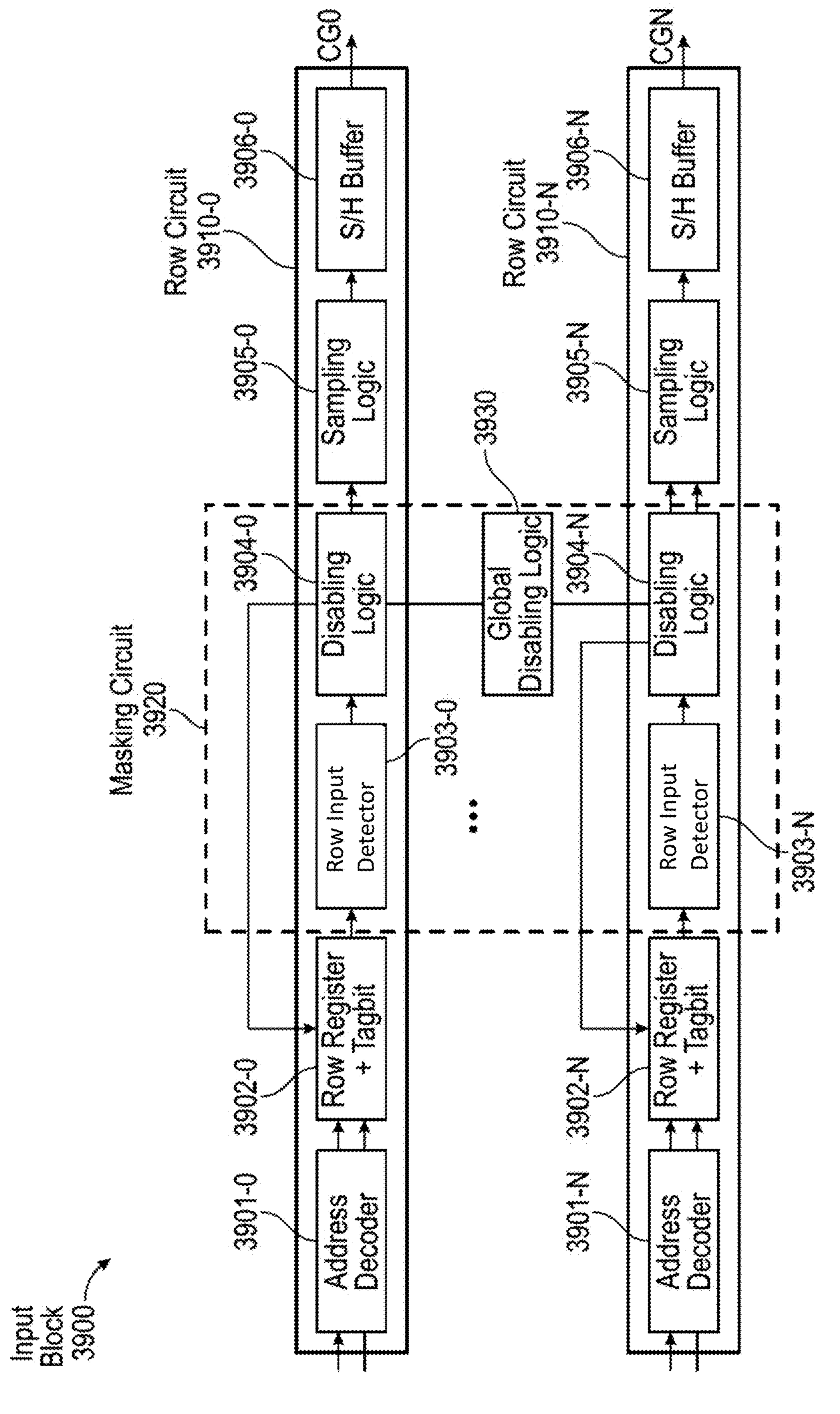
FIG. 39 depicts a masking circuit for inputs in a VMM system.

FIG. 39 depicts input block 3900, which can be part of input circuit 3406 in FIG. 34. Input block 3900 comprises row circuits 3910-0, . . . , 3910-N, respectively for the n+1 rows in VMM array 3401 in FIG. 34. Each row circuit 3910 comprises address decoder 3901, row register and tagbit 3902 (which stores the input activation value for that row, such as an 8-bit value, and a corresponding tagbit), row input detector 3903, disabling logic 3904, sampling logic 3905, and sample-and-hold buffer 3906. For example, row circuits 3910-0 and 3910-N comprise address decoders 3901-0 and 3901-N, row registers and tagbits 3902-0 and 3902-N, row input detectors 3903-0 and 3903-N, disabling logic 3904-0 and 3904-N, sampling logic 3905-0 and 3905-N, and sample-and-hold buffers 3906-0 and 3906-N, respectively. Sampling logic 3905 comprises logic to sample a global digital-to-analog converter (not shown) and to store that sampled value in a respective sample-and-hold buffer 3906, as described in U.S. patent application Ser. No. 18/077,686, filed on Dec. 8, 2022, and titled "Input Circuit for Artificial Neural Network Array," which is incorporated by reference herein. Disabling logic 3904 for each row is coupled to global disabling logic 3930.

During a load operation, each row register and tagbit 3902 is loaded with row input data for that particular row. During a load operation, address decoder 3901 receives an address; the address decoder 3901 for the selected row as described by the received address provides an enabling signal to its respective row register and tagbit 3902, and in response to the enabling signal, the respective row register and tagbit 3902 loads in the row input data into the respective row register of the respective row register and tagbit 3902. The tagbits in the row registers and tagbits 3902 optionally are set to enable or disable a row for a neural read operation. For example, a tagbit for a particular row can be set to a first value (e.g., "1") if the row is to be read during a neural read operation and to a second value (e.g., "0") if the row is not be read during a neural read operation.

During a neural read operation, rows are selected depending on the tagbits stored in the respective row register and tagbit 3902. For example, rows with a tagbit set to the first value (e.g., “1”) are operated upon such that a signal ultimately is applied to a row in the VMM array (in FIG. 39, shown as CG0, . . . , CGN), and rows with a tagbit set of the second value (e.g., “0”) are disregarded such that no signal ultimately is applied to the row.

As discussed in greater detail below, row input detector 3903, disabling logic 3904, and global disabling logic 3930 together form masking circuit 3920, which masking circuit 3920 prevents an application of an input signal to any row for which the row input data stored in the associated row register and tagbit 3902 is zero or is equal to or less than a low input threshold or equal to or greater than a high input threshold.

The preventing of the application of a signal (e.g., CG0, . . . , CGN in FIG. 39) to a row (meaning that the row is disabled) can happen through any of the following mechanisms: (1) modifying the row input data stored in a row register and tagbit 3902 for a row from their initial value to all ‘0’s; (2) modifying the value of a tagbit in row register and tagbit 3902 from its initial value to the second value (e.g., “0”) for a row; or (3) de-assertion of an enable signal to sampling logic 3905 or sample and hold buffer 3906 to prevent their use.

During the neural read operation, for rows that are not disabled, sampling logic 3905 converts the received row input data into an analog signal, which will be held in sample-and-hold buffer 3906 and applied as a signal, CG, to be applied to a control gate line for an associated row in VMM array.

Optionally, if all rows are disabled, another mechanism is to assert a control signal to output circuit 3407 indicating that output circuit 3407 is to output a pre-defined signal rather than process the actual outputs of VMM array 3401 (for example, to prevent the neural read operation from being performed).

Figure 40A:
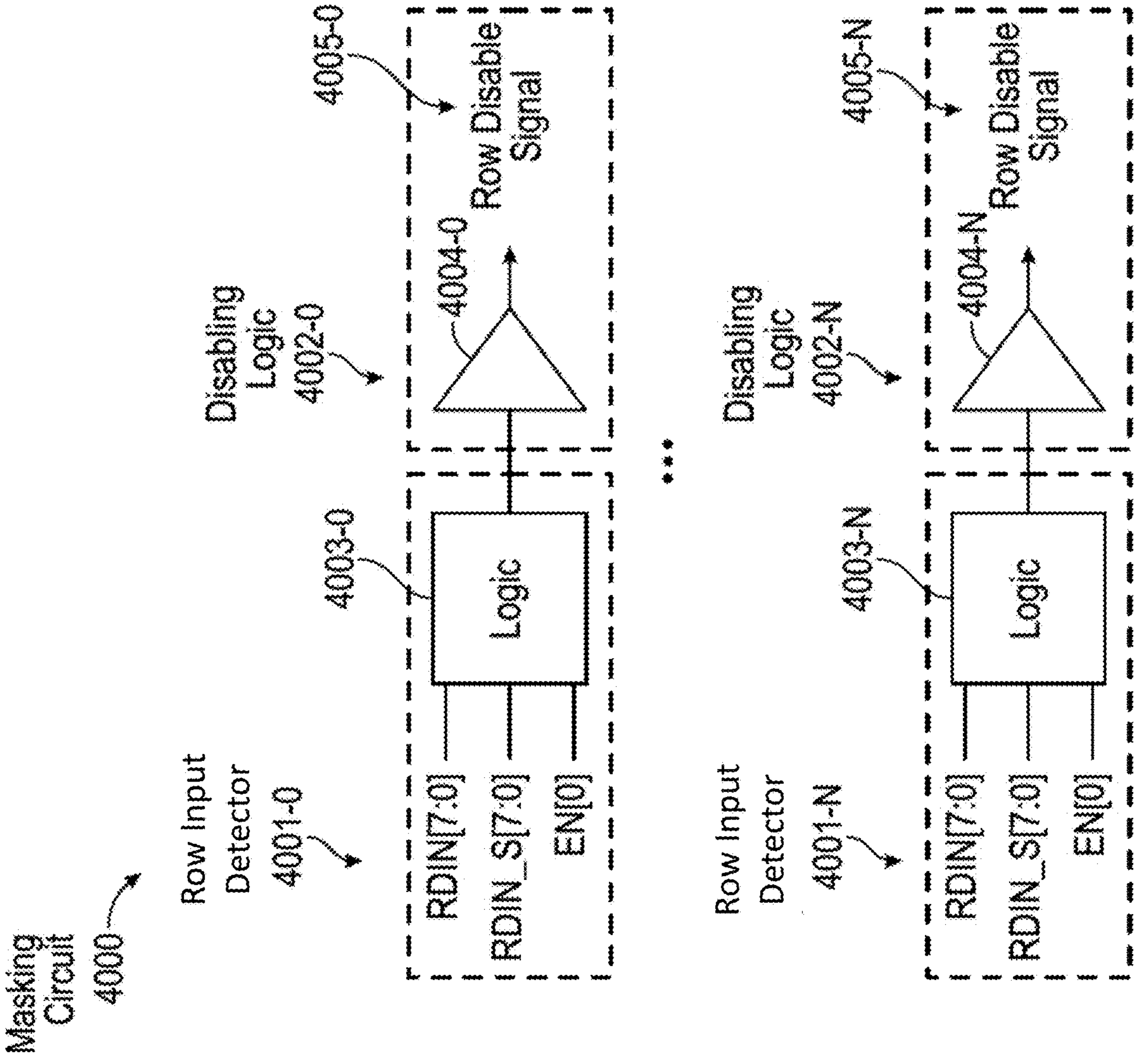
FIG. 40A depicts another masking circuit for inputs in a VMM system.

FIG. 40A depicts masking circuit 4000, which is an example of masking circuit 3920 that can be used in input block 3900, which in turn can be part of input circuit 3406 in FIG. 34. Masking circuit 4000 comprises row input detectors 4001-0, . . . , 4001-N (respectively for each of the n+1 rows), which correspond to row input detectors 3903-0, . . . , 3903-N in FIG. 39, and disabling logic 4002-0, . . . , 4002-N, which correspond to disabling logic 3904-0, . . . 3904-N in FIG. 39. Each row input detector 4001 comprises logic 4003, which receives the input row input data (in this example, RDIN[7:0], which is an 8-bit value) for that row received from row register and tagbit 3902 in FIG. 39, and optionally receives one or more reference values (in this example, RDIN_S[7:0]), which can include any of a low input threshold value, a high input threshold value and a particular value of interest; optionally, each such value can be provided as RDIN_S[7:0] sequentially), and also receives the EN[0] enable signal. For example, row input detector 4001-0 comprises logic 4003-0, and row input detector 4001-N comprises logic 4003-N. Each disabling logic 4002 comprises buffer 4004. For example, disabling logic 4002-0 comprises buffer 4004-0, and disabling logic 4002-N comprises buffer 4004-N.

During a load operation, row input data RDIN[7:0] is loaded into row register and tagbit 3902, and logic 4003 determines if the following conditions are present: (1) RDIN[7:0]=00000000; (2) RDIN[7:0]≤low input threshold value identified in RDIN_S[7:0]; (3) RDIN[7:0]≥high input threshold value identified in RDIN_S[7:0]; or (4) RDIN[7:0]=a particular data input pattern identified in RDIN_S[7:0]. To determine if conditions (1)-(4) are present, logic 4003 compares RDIN[7:0] to the fixed value 00000000 for condition (1) or to RDIN_S[7:0] for conditions (2), (3), and (4) using a digital comparator. If any of these four conditions are true, then the output of logic 4003 is high, i.e., is asserted. Disabling logic 4002 comprises buffer 4004, which receives the output of logic 4003 and generates a respective row disable signal 4005 in response to assertion of the output of logic 4003. For example, when row disable signal 4005 is high (e.g., “1) then the row is disabled but if row disable signal 4005 is low (e.g., “0”) then the row is not disabled.

Figure 40B:
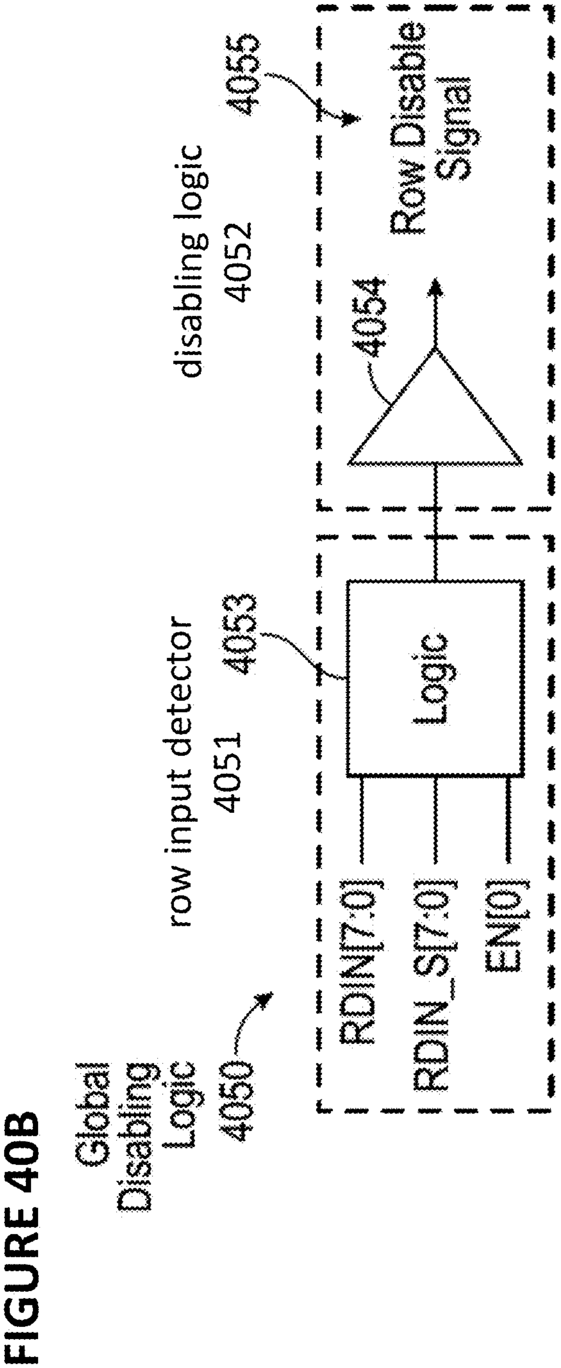
FIG. 40B depicts a global disabling circuit for a VMM system.

FIG. 40B depicts global disabling logic 4050, which is an example of global disabling logic 3930 in in input block 3900 in FIG. 39, which in turn can be part of input circuit 3406 in FIG. 34. Global disabling logic 4050 is used to gauge each row one at a time and is an alternative to the design of FIG. 40A where separate instances of a row input detector and disabling logic are present for each row. That, is, FIG. 40B uses one set of circuitry while FIG. 40A uses (N+1) sets of circuitry.

Global disabling logic 4050 comprises row input detector 4051 and disabling logic 4052. Row input detector 4051 comprises logic 4053, which receives the input row input data (in this example, RDIN[7:0], which is an 8-bit value) received from row register and tagbit 3902 for a selected row in FIG. 39, and optionally receives one or more reference values (in this example, RDIN_S[7:0]), which can include any of a low input threshold value, a high input threshold value and a particular value of interest; optionally, each such value can be provided as RDIN_S[7:0] sequentially), and also receives the EN[0] enable signal. Disabling logic 4052 comprises buffer 4054.

During a load operation of a particular row, row input data RDIN[7:0] is loaded into row register and tagbit 3902 for that row, and logic 4053 determines if the following conditions are present: (1) RDIN[7:0]=00000000; (2) RDIN[7:0]≤low input threshold value identified in RDIN_S[7:0]; (3) RDIN[7:0]≥high input threshold value identified in RDIN_S[7:0]; or (4) RDIN[7:0]=a particular data input pattern identified in RDIN_S[7:0]. To determine if conditions (1)-(4) are present, logic 4053 compares RDIN[7:0] to the fixed value 00000000 for condition (1) or to RDIN_S[7:0] for conditions (2), (3), and (4) using a digital comparator. If any of these four conditions are true, then the output of logic 4053 is high, i.e., is asserted. Disabling logic 4052 comprises buffer 4054, which receives the output of logic 4053 and generates row disable signal 4055 in response to assertion of the output of logic 4053. For example, when row disable signal 4055 is high (e.g., “1) then the row is disabled but if row disable signal 4055 is low (e.g., “0”) then the row is not disabled.

Figure 40C:
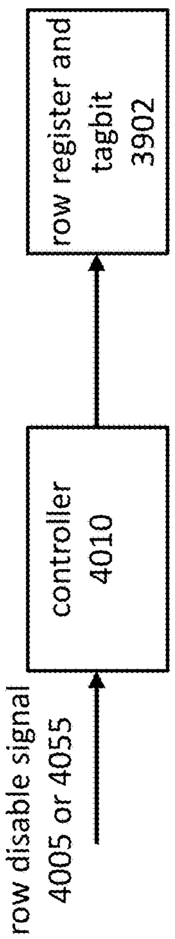
FIG. 40C depicts circuitry to set bits in a row register and tagbit.

As discussed above, a first mechanism for disabling a row is modifying the row input data stored in a row register and tagbit 3902 for a row from their initial value to all ‘0’s. With respect to FIG. 40C, row disable signal 4005 or 4055 is received by controller 4010. When row disable signal 4005 or 4055 is high (indicating that a row is disabled), then controller will load all ‘0’s into the row register in row register and tagbit 3902 for that row.

As further discussed above, a second mechanism for disable a row is modifying the value of a tagbit in row register and tagbit 3902 to the second value (e.g., “0”) for a row. With respect to FIG. 40C, row disable signal 4005 or 4055 is received by controller 4010. When row disable signal 4005 or 4055 is high (indicating that a row is disabled), then controller 4010 will load a “0” into the tagbit in row register and tagbit 3902 for that row.

Figure 40D:
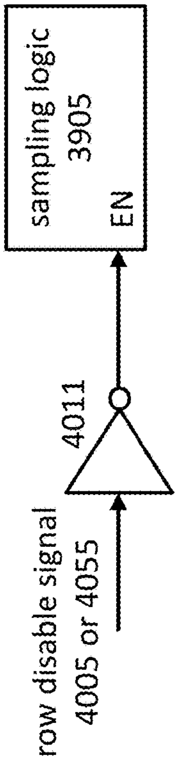
FIG. 40D depicts circuitry to disable sampling logic.
Figure 40E:
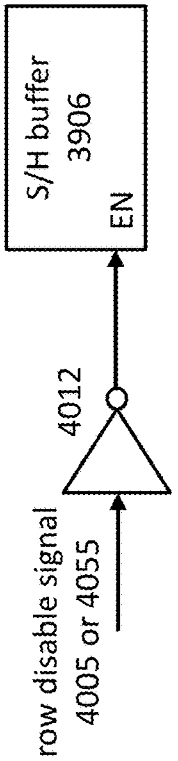
FIG. 40E depicts circuitry to disable a sample-and-hold buffer.

As further discussed above, a third mechanism for disabling a row is de-assertion of an enable signal to sampling logic 3905 or sample and hold buffer 3906 to prevent their use. With respect to FIGS. 40D and 40E, row disable signal 4005 or 4055 is provided to inverters 4011 and 4012, and the output of inverters 4011 and 4012 are provided to the enable port of sampling logic 3905 and S/H buffer 3906, respectively, which will disable sampling logic 3905 and S/H buffer 3906.

Thus, during a neural read operation, certain rows can be disabled using the mechanisms described above. This can save power, for example, if many rows are disabled because their row input data is 0 or below the low input threshold or above the high input threshold. If all rows are disabled, then the entire neural read operation is not performed and the output of output circuit 3407 are kept at a pre-defined condition (such as '0' for single ended output or mid-point for differential outputs such as 127 for an 8-bit output).

Figure 41:
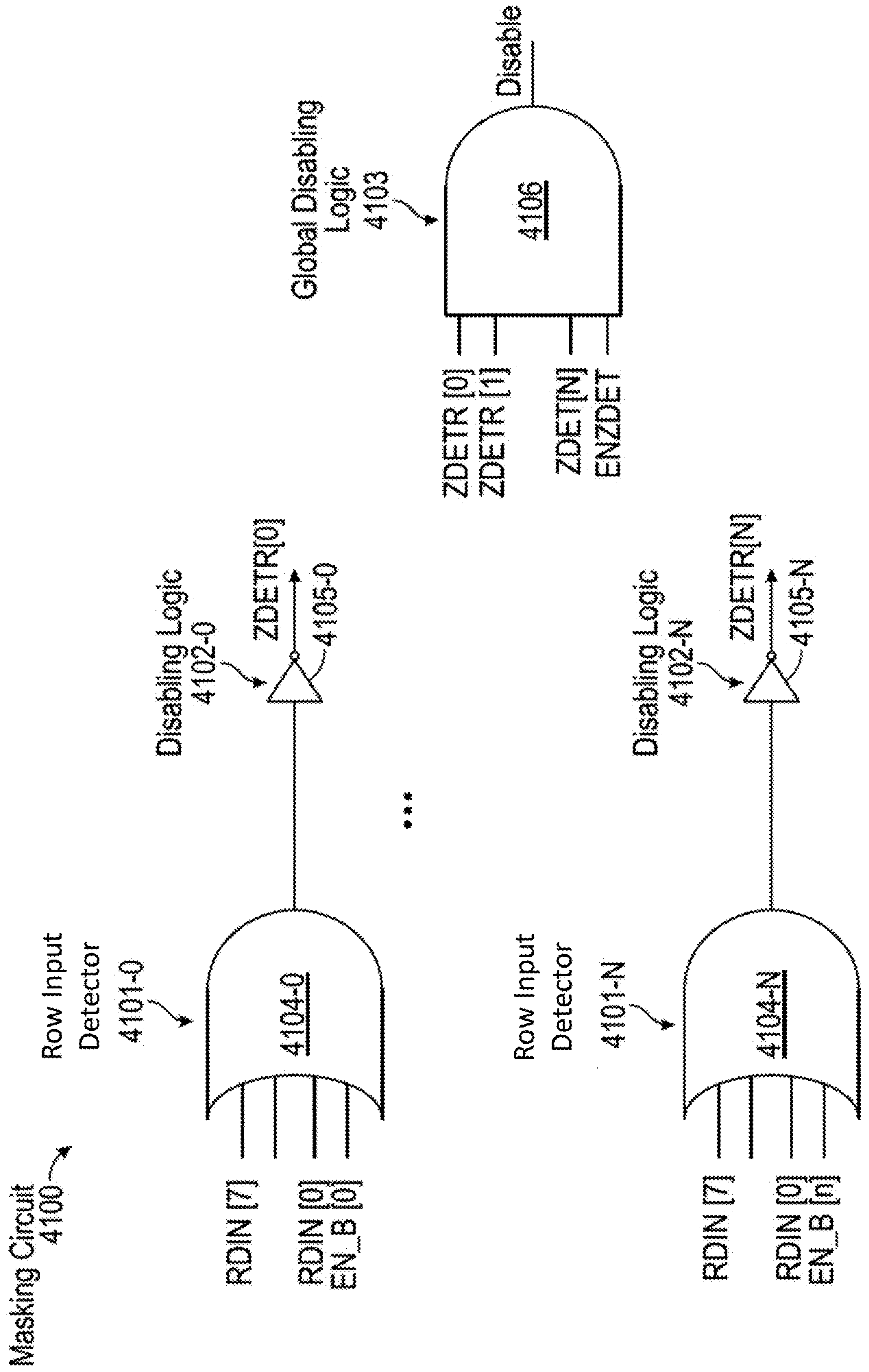
FIG. 41 depicts another masking circuit for inputs in a VMM system.

FIG. 41 depicts masking circuit 4100, which is an example of masking circuit 3920 that can be used in input block 3900, which in turn can be part of input circuit 3406 in FIG. 34. Masking circuit 4100 comprises row input detectors 4101-0, . . . , 4101-N (for each of the n+1 rows, respectively), which correspond to row input detectors 3903-0, . . . , 3903-N in FIG. 39, disabling logic 4102-0, . . . , 4102-N, which correspond to disabling logic 3904-0, . . . , 3904-N in FIG. 39, and global disabling logic, which corresponds to global disabling logic 3930 in FIG. 34. Each row input detector 4001 comprise OR logic 4104 (an OR gate or other logic performing an OR function), which receives all bits of the input row input data (RDIN[7:0]) for that row received from row register and tagbit 3902 in FIG. 39. For example, row input detector 4101-0 comprises OR logic 4104-0, and row input detector 4101-N comprises OR logic 4104-N. If all bits are '0,' the output of OR logic 4104 will be '0'. If any of the bits is a '1,' the output of OR logic 4104, depicted as ZDETR will be '1'. Disabling logic 4102 comprises inverter 4105, which inverts the output of OR logic 4104. For example, disabling logic 4102 comprises inverter 4105-0, whose output signal is depicted as ZDETR [0] and disabling logic 4102-N comprises inverter 4105-N, whose output signal is depicted as ZDETR[N]. The output of each inverter 4105 is provided to global disabling logic 4103, which comprises AND logic 4106 (an AND gate or other logic performing an AND function). AND logic 4106 receives all outputs of inverters 4105 and generates an output, DISABLE, which is a neural read disable signal. DISABLE will be high if all bits for all rows is '0,' in which case the neural read operation for all of the rows 0 to N can be disabled altogether. For example, if DISABLE=1, then all of the rows (all selected rows for the neural read) had a '0' input for its row input data, meaning that all rows will generate a 0 output and the neural read can be eliminated altogether (no OP), meaning that input row input data is not applied to respective rows, resulting in decreased power consumption and latency. Thus, each signal ZDETR indicates if a particular row is to be disabled and a no OP (read neural operation) is to be performed for that row (e.g., CG terminal for that row=0V), and the signal DISABLE indicates if all rows are to be disabled.

Figure 42:
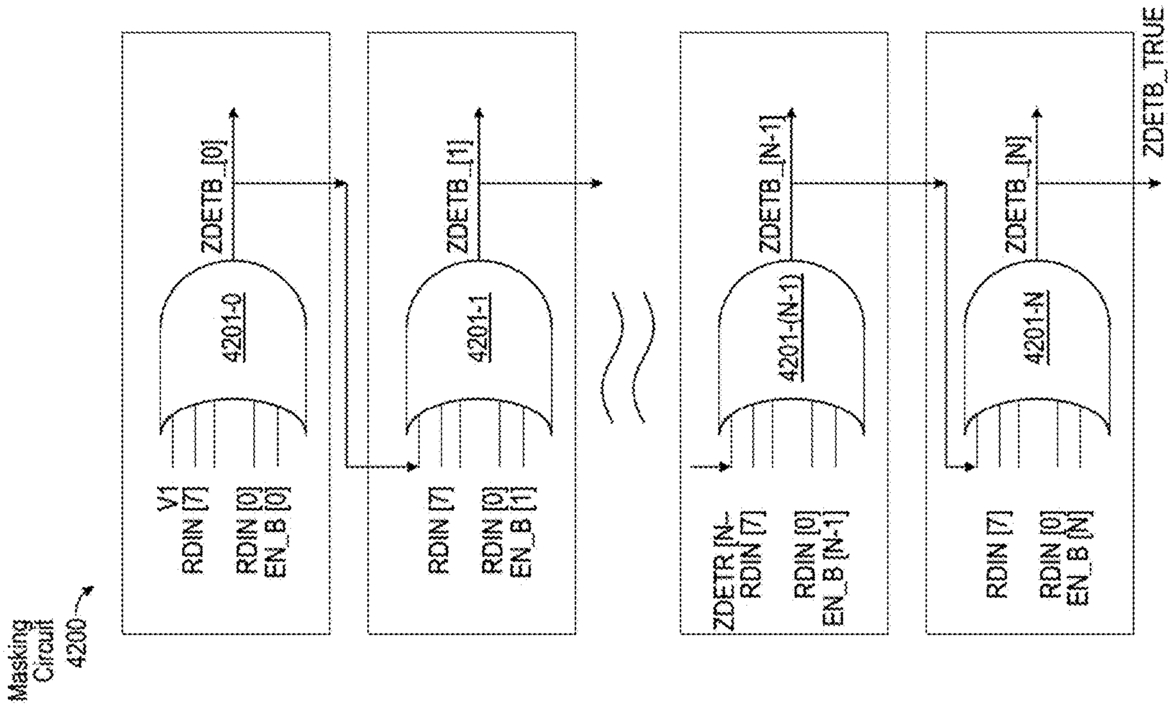
FIG. 42 depicts another masking circuit for inputs in a VMM system.

FIG. 42 depicts masking circuit 4200, which is an example of masking circuit 3920 that can be used in input block 3900, which in turn can be part of input circuit 3406 in FIG. 34. Masking circuit 4200 consolidates the functions of row input detector 3903, disabling logic 3904, and global disabling logic 3930. Masking circuit 4200 comprises OR logic 4201 (an OR gate or other logic performing an OR function) for each row, which receives as inputs all bits in the row input data for that row from row register and tagbit 3902 in FIG. 37. OR logic 4201-0 also receives a '0' as an additional input (in the form of voltage V1, which can be ground or another voltage that represents a '0'), and all subsequent OR logic 4201 receive the result of the preceding row's OR logic 4201 as an additional input (e.g., OR logic 4201-1 receives the output of OR logic 4201-0 as an input). OR logic 4201 also receives an enable signal, EN_B[0], . . . , EN_B[N] for OR logic 4201-0, . . . , 4201-N, respectively. In this way, if any of the activation bits received by any row is non-zero, then the output of the final OR logic 4201-N will be 1, indicating that the neural read is to be performed. If all of the activation bits for all rows is zero, then the final OR logic 4201-N will be 0, indicating that the neural read operation can be skipped for the entire VMM array (i.e., all rows) as the output will be 0.

Figure 43:
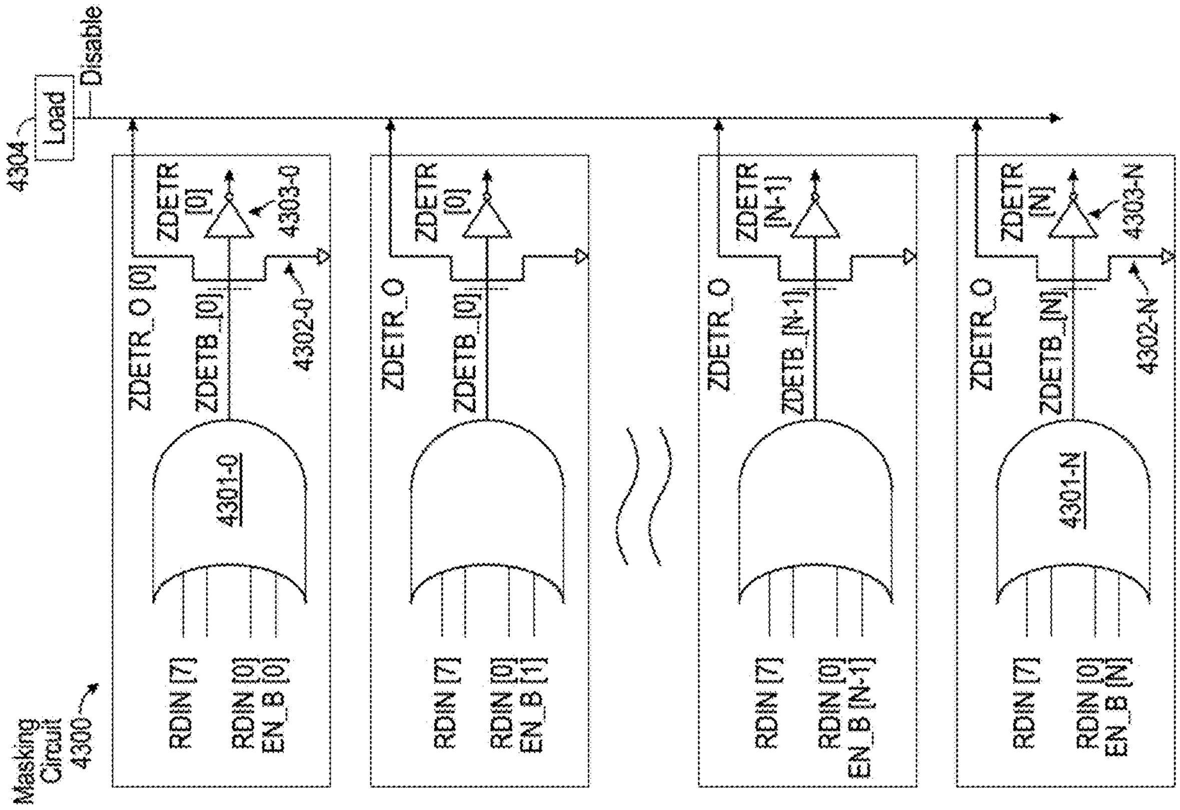
FIG. 43 depicts another masking circuit for inputs in a VMM system.

FIG. 43 depicts masking circuit 4300, which is an example of masking circuit 3920 that can be used in input block 3900, which in turn can be part of input circuit 3406 in FIG. 34. Masking circuit 4300 consolidates the functions of row input detector 3903, disabling logic 3904, and global disabling logic 3930. For each row, masking circuit 4300 comprises OR logic 4301 (an OR gate or other logic performing an OR function) (such as OR logic 4301-0 for row 0 and OR logic 4301-N for row N), NMOS transistor 4302 (such as NMOS transistor 4302-0 for row 0 and NMOS transistor 4302-N for row N), and inverter 4303 (such as inverter 4303-0 for row 0 and inverter 4303-N for row N). OR logic 4301 receives as inputs all bits in the row input data for that row from row register and tagbit 3902 in FIG. 37. OR logic 4301 also receives an enable signal, EN_B[0], . . . , EN_B[N] for OR logic 4301-0, . . . , 4301-N, respectively. The output of the OR logic 4301 is provided to the gate of NMOS transistor 4302. NMOS transistor 4302 serves as open drain circuit with a global loading circuit 4304 such as a current source, a resistor, a transistor, or other device. The source of NMOS transistor 4302 is at ground, and the drain of NMOS transistor 4302 is coupled to global loading circuit 4304. If any bit in any row input data in any row is a '1,' then the output of that OR logic will be '1', the NMOS transistor 4302 will be turned on, and the output DISABLE will be '0', meaning a read neural operation is to be performed. Otherwise, DISABLE will be '1', meaning no OP is performed for the neural read, and input signals will be prevented from being applied to all rows. If output of any individual inverter 4303 for a row is true, the respective ZDETR signal is asserted, and as a result there is a no OP for that particular row (e.g., CG='0', and circuits particularly analog circuits for that row is disabled to save power).

Figure 44:
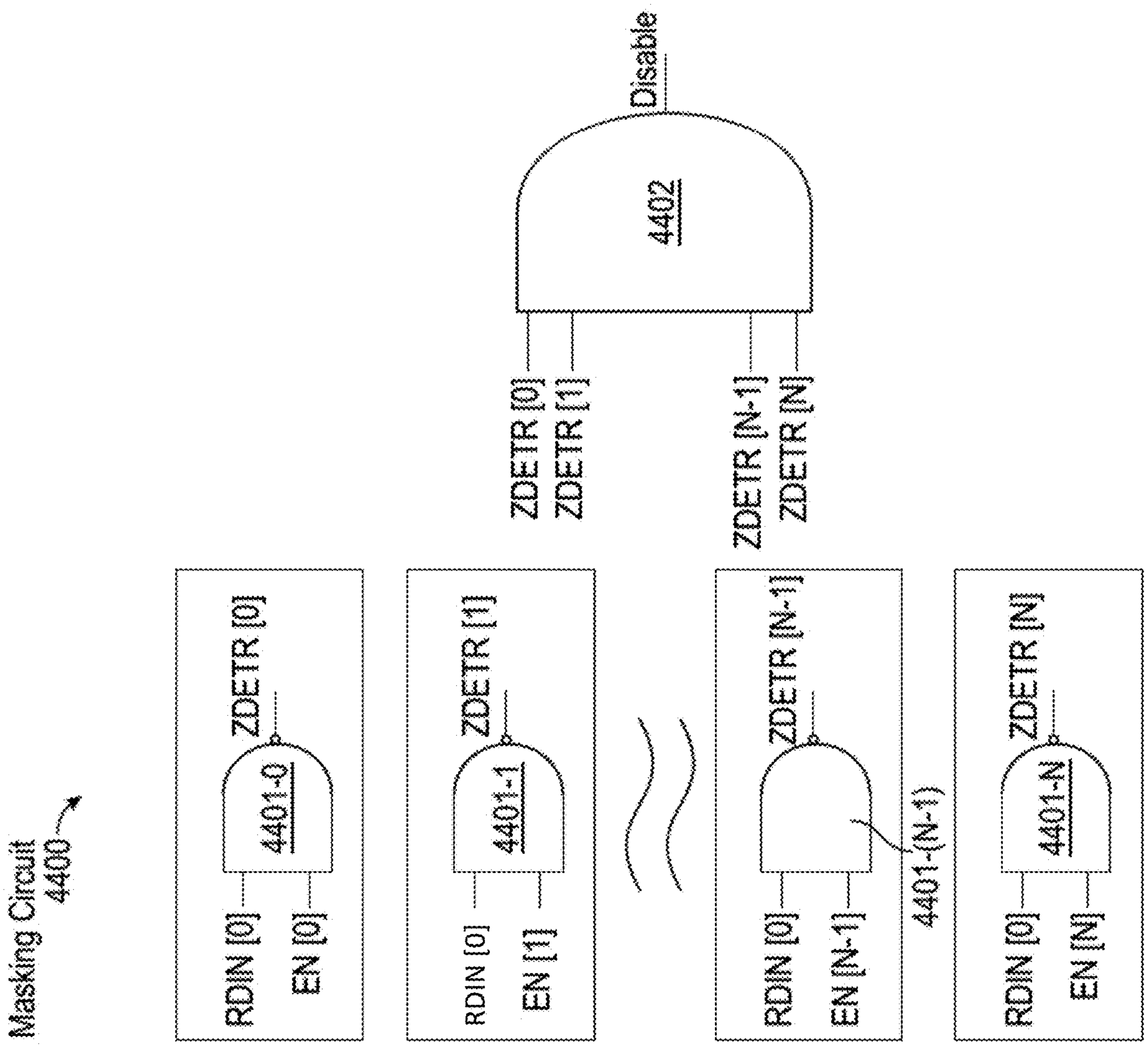
FIG. 44 depicts another masking circuit for inputs in a VMM system.

FIG. 44 depicts masking circuit 4400, which is an example of masking circuit 3920 that can be used in input block 3900, which in turn can be part of input circuit 3406 in FIG. 34. Masking circuit 4400 consolidates the functions of row input detector 3903, disabling logic 3904, and global disabling logic 3930. For each row, masking circuit 4400 comprises NAND logic 4401 (a NAND gate or other logic performing a NAND function) (such as NAND logic 4401-0 for row 0, NAND logic 4401-1 for row 1, NAND logic 4401-(N−1) for row (N−1), and NAND logic 4401-N for row N), which receives, in a sequential manner, each bit in the row input data for that row from row register and tagbit 3902 in FIG. 39 as well as enable bit EN[0], . . . , EN[N] for NAND logic 4401-0, . . . , 4401-N, respectively. Thus, if the row input data for each row contains 8 bits, then 8 different, sequential logic operations will be performed. For each cycle, the output of the NAND logic 4401 is provided to AND logic 4402 (an AND gate or other logic performing an AND function). The output of the AND logic 4402 will be 1 if each bit that is input to NAND logic 4401 is 0, meaning that the row can be disabled for that bit location and the neural read operation skipped for that particular row as to that bit location (e.g., no OP for that particular row as to that bit location), meaning that input signals will be prevented from being applied to the respective rows. The same process is repeated on a bit-by-bit manner for the remainder of the row input data.

Figure 45:
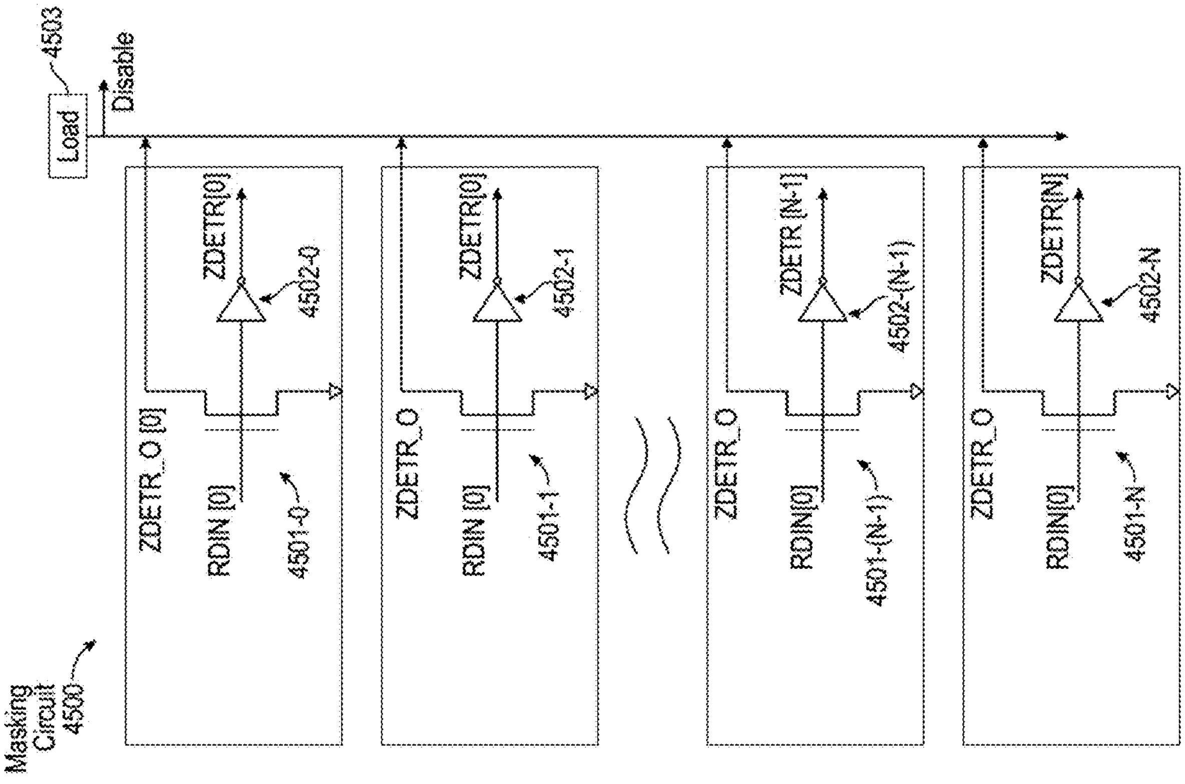
FIG. 45 depicts another masking circuit for inputs in a VMM system.

FIG. 45 depicts masking circuit 4500, which is an example of masking circuit 3920 that can be used in input block 3900, which in turn can be part of input circuit 3406 in FIG. 34. Masking circuit 4500 consolidates the functions of row input detector 3903, disabling logic 3904, and global disabling logic 3930. For each row, masking circuit 4500 comprises NMOS transistor 4501 (open drain NMOS similarly as FIG. 43) (such as NMOS transistor 4501-0 for row 0, NMOS transistor 4501-1 for row 1, NMOS transistor 4501-(N−1) for row (N−1), and NMOS transistor 4501-N for row N), whose gate receives, in a sequential manner, one bit from the activation (n-bit) data for that row. Thus, if the row input data for each row contains 8 bits, then 8 different, sequential logic operations will be performed. For each row, masking circuit 4500 also comprises inverter 4502 (such as inverter 4502-0 for row 0, inverter 4502-1 for row 1, inverter 4502-(N−1) for row (N−1), and inverter 4502-N for row N). Each inverter 4502 receives the same bit received by the gate for NMOS transistor 4501 associated with the same row. The source of NMOS transistor 4501 is at ground, and the drain of NMOS transistor 4501 (similar to that of FIG. 43) is coupled to load 4503. If any bit in a given bit location in the row input data in any row is a '1,' then the associated NMOS transistor 4501 will be turned on and the output DISABLE will be '0,' indicating that the neural read operation is to be performed for that bit location. Otherwise, DISABLE will be '1,' and the neural read operation is not performed for that bit location, meaning that input signals will be prevented from being applied to respective rows. If output of any individual inverter 4502 for a row is true, then it is a no OP for that particular row as to that bit location (e.g., CG='0', and circuits particularly analog circuits for that row is disabled to save power).

Figure 46:
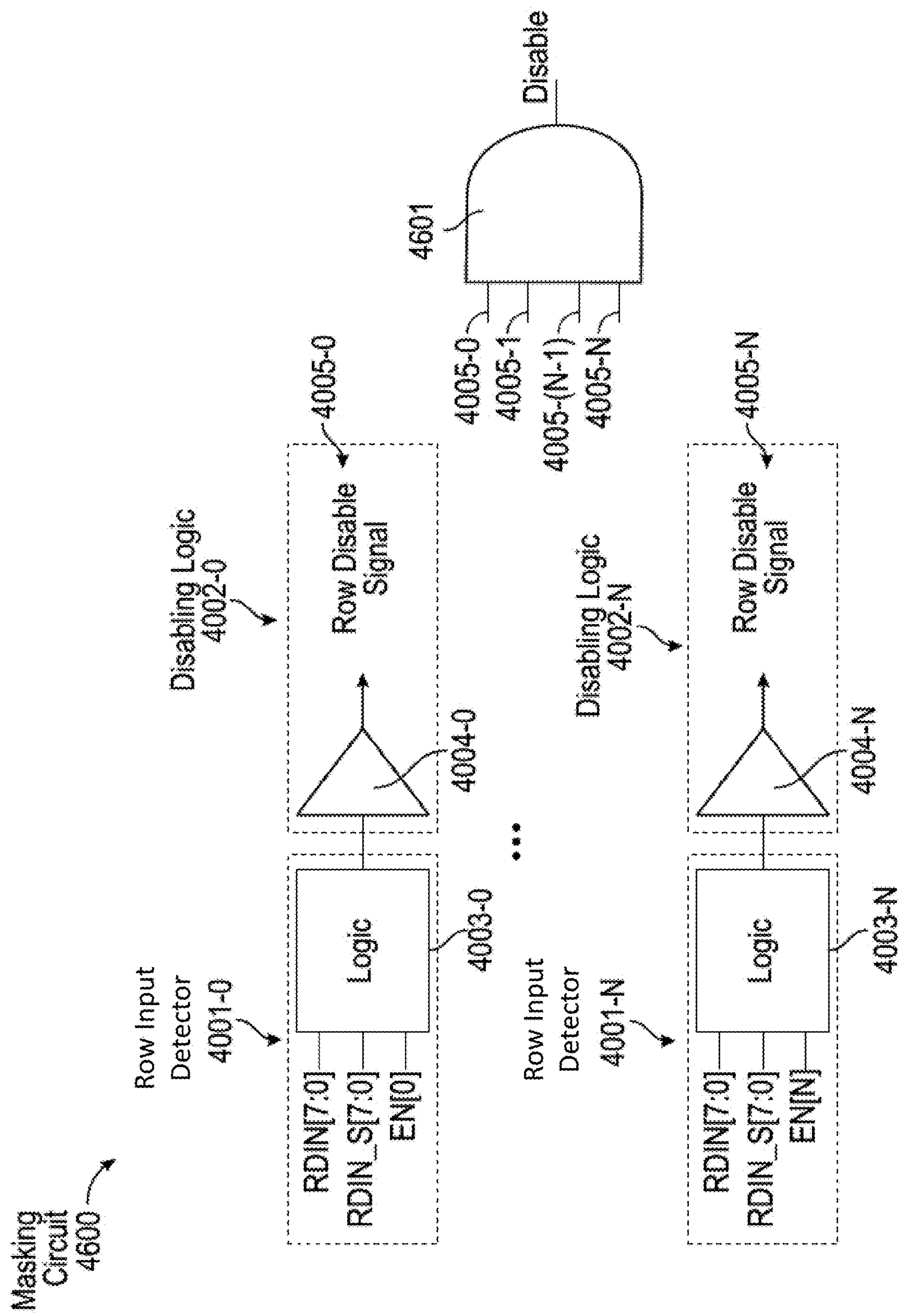
FIG. 46 depicts another masking circuit for inputs in a VMM system.

FIG. 46 depicts masking circuit 4600, which is an example of masking circuit 3920 that can be used in input block 3900, which in turn can be part of input circuit 3406 in FIG. 34. Masking circuit 4600 comprises many of the same components as masking circuit 4000 in FIG. 40A, which will not be described again for efficiency's sake. Masking circuit 4600 further comprises AND logic 4601 (an AND gate or other logic performing an AND function), which receives row disable signals 4005-0, 4005-1, . . . , 4005-(N−1), and 4005-N, and generates an output DISABLE. DISABLE will equal '1' if the output from logic 4003 for all rows 0 to N is '1', meaning that the activation bits for each row satisfies one of the following conditions: (1) RDIN[7:0]=00000000; (2) RDIN[7:0]≤low input threshold value; (3) RDIN[7:0]≥high input threshold value; or (4) RDIN[7:0]=a particular data input pattern, in which case the neural read operation can be skipped.

Figure 52:
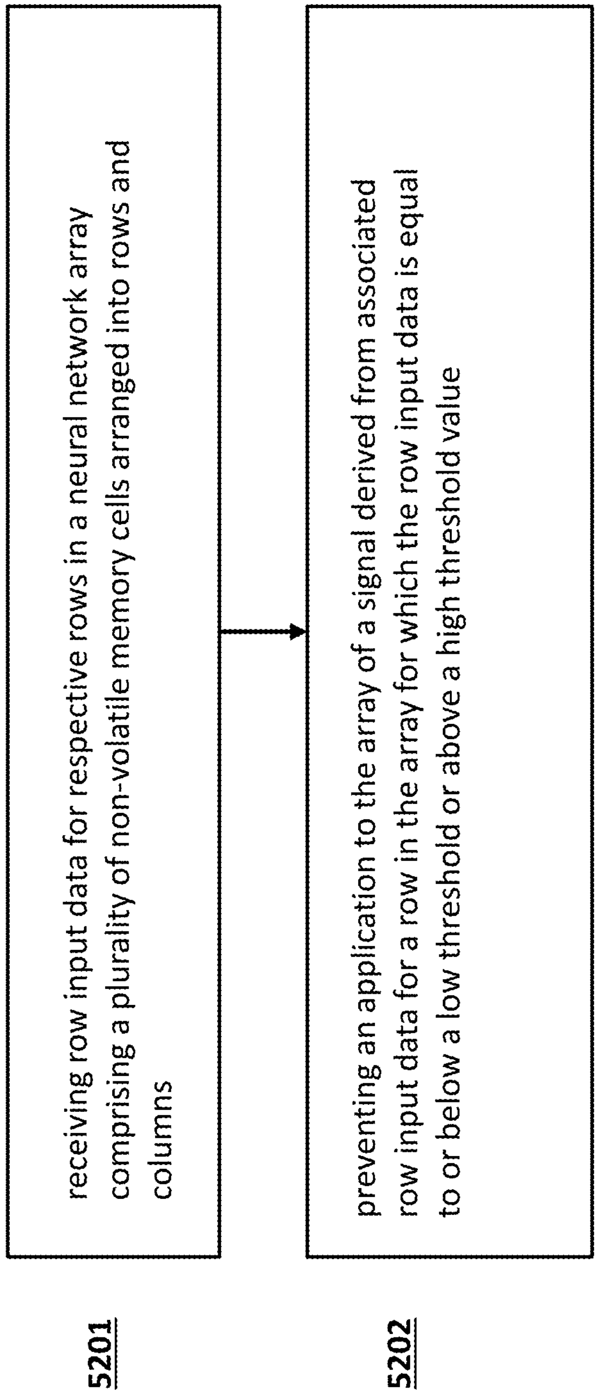
FIG. 52 depicts a method for masking inputs in a VMM system.
Figure 53:
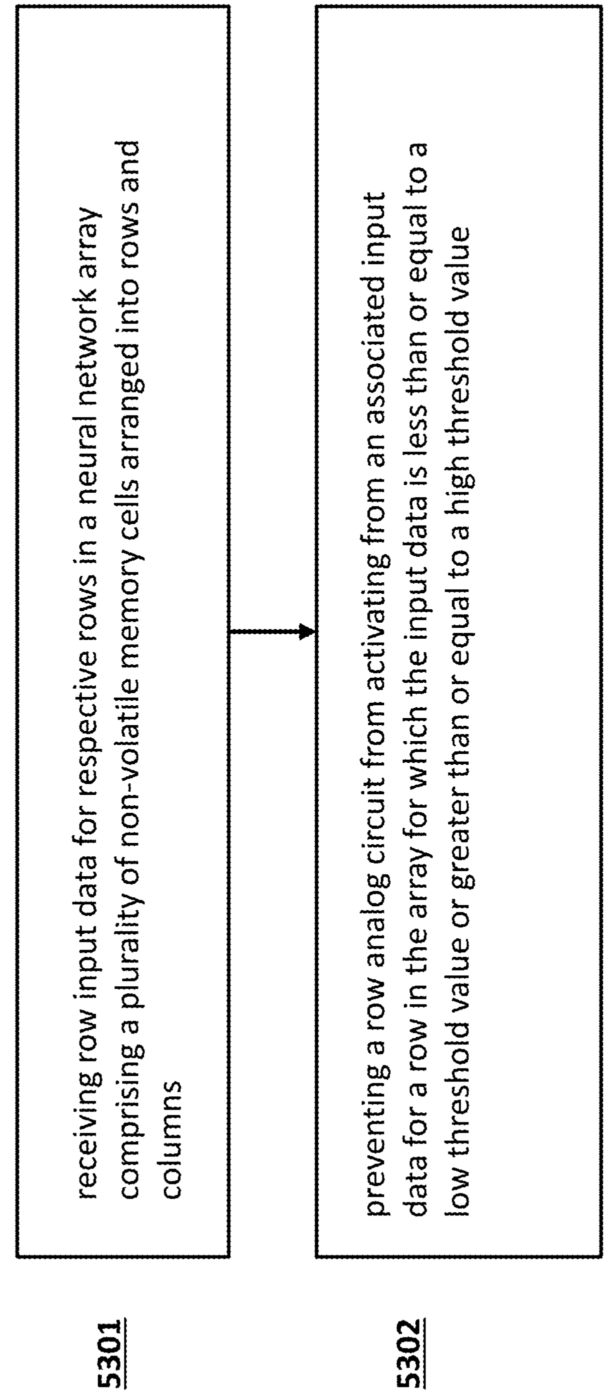
FIG. 53 depicts another method for masking inputs in a VMM system.

FIGS. 52-53 depict methods that can be performed by the circuits of FIGS. 39, 40A-40D, and 41-46.

FIG. 52 depicts method 5200. Operation 5201 comprises receiving row input data for respective rows in a neural network array comprising a plurality of non-volatile memory cells arranged into rows and columns. Operation 5202 comprises preventing an application to the array of a signal derived from associated row input data for a row in the array for which the row input data is equal to or below a low threshold or above a high threshold value. Optionally, operation 5202 comprises deasserting an enable signal to sampling logic, a sample-and-hold-buffer, or other circuitry used to generate a signal from row input data when the row input data for respective rows is less than or equal to a low threshold or greater than or equal to a high threshold value.

FIG. 53 depicts method 5300. Operation 5301 comprises receiving row input data for respective rows in a neural network array comprising a plurality of non-volatile memory cells arranged into rows and columns. Operation 5302 comprises deasserting an enable signal to sampling logic, a sample-and-hold-buffer, or other circuitry used to generate a signal from row input data for which the row input data is less than or equal to a low threshold value or greater than or equal to a high threshold value. Optionally, operation 5302 comprises preventing one or more of a digital-to-analog converter and an analog-to-digital converter from being activated when the row input data for the rows in the neural network array is less than or equal to a low threshold value or greater than or equal to a high threshold value.

Figure 47:
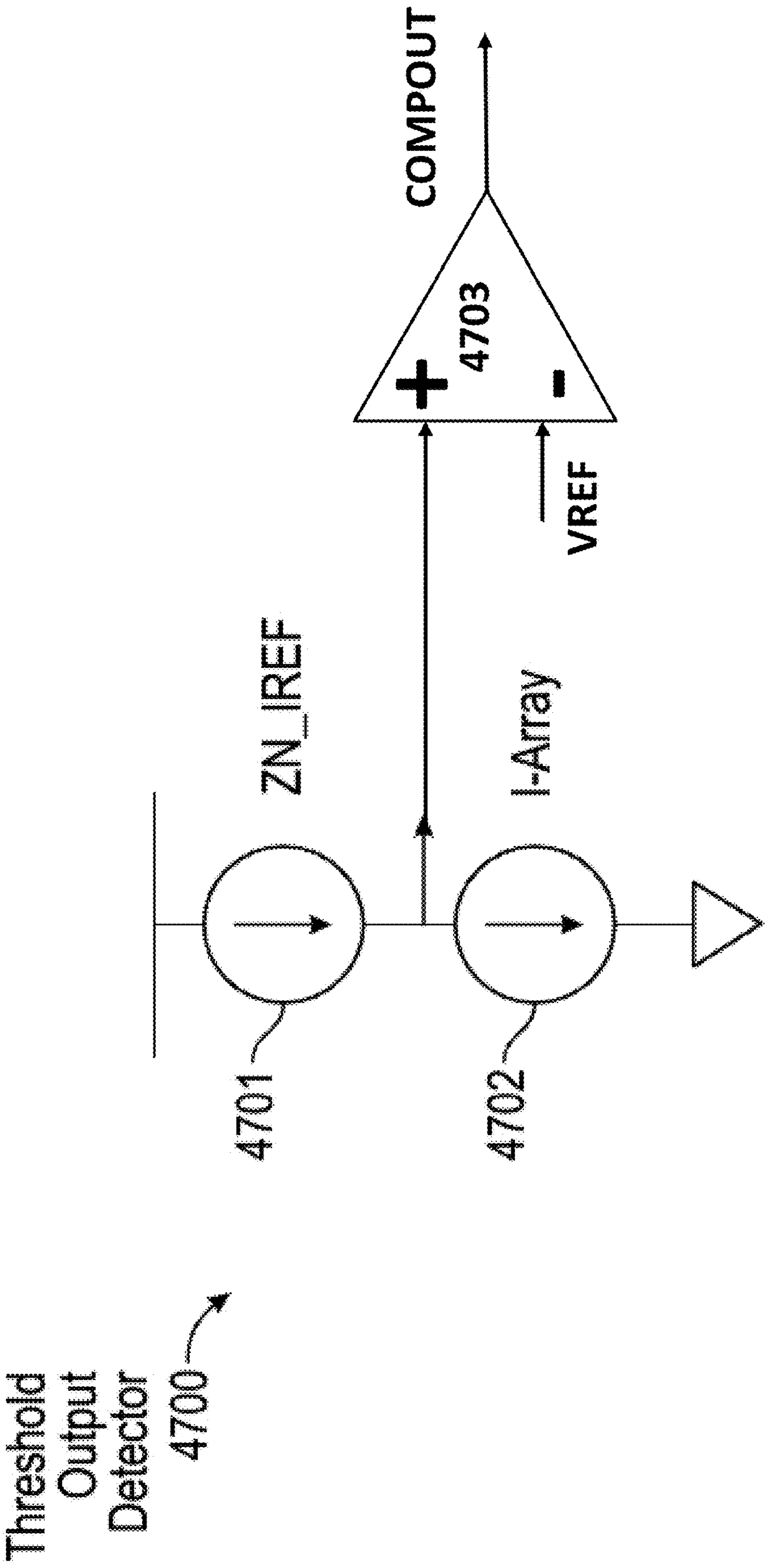
FIG. 47 depicts a threshold output detector in a VMM system.
Figure 48A:
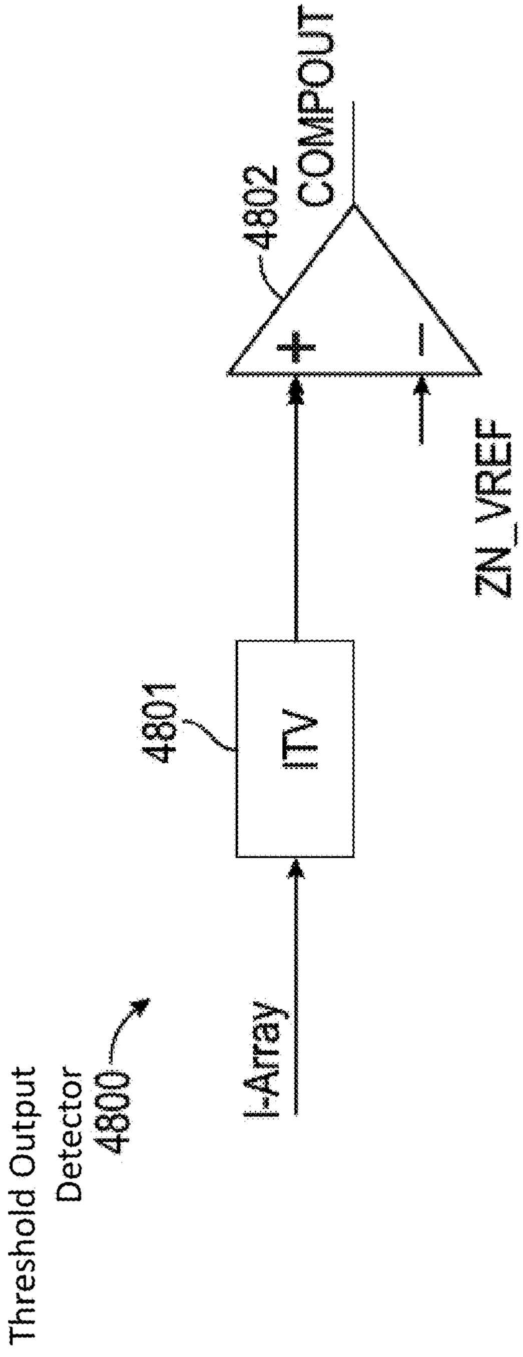
FIG. 48A depicts another threshold output detector in a VMM system.
Figure 48B:
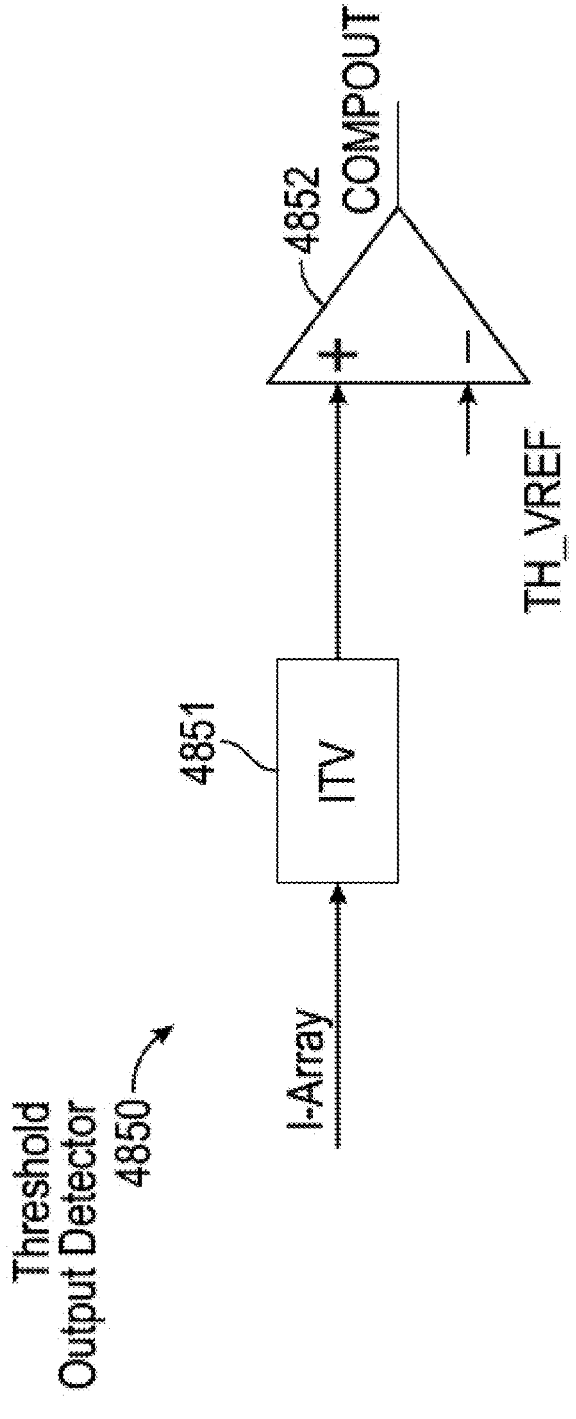
FIG. 48B depicts another threshold output detector in a VMM system.
Figure 49:
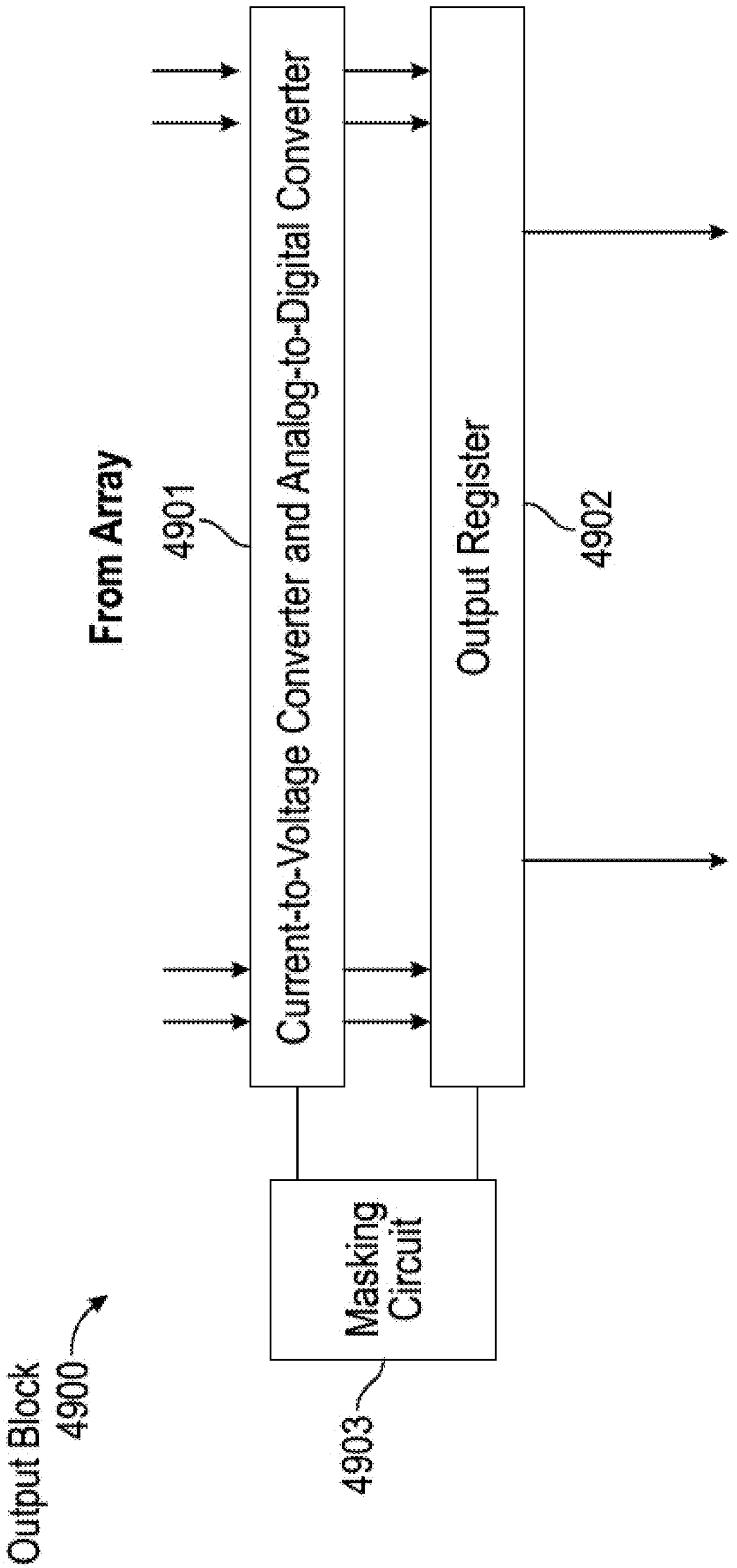
FIG. 49 depicts an output block comprising a masking circuit for use in a VMM system.

FIGS. 47-49 depict circuits that can be used in output circuit 3407 in FIG. 34.

FIG. 47 depicts threshold output detector 4700. Threshold output detector 4700 comprises reference current source 4701, which provides a current ZN_IREF, which is a threshold current. Any current below that threshold current is considered negligible and can be disregarded, with the output current treated as a "0." Reference current source 4701 is coupled to the column of the VMM array being measured, represented as current source 4702. Threshold output detector 4700 comprises comparator 4703 to indicate the comparison result of the threshold current, ZN_IREF, versus the array current, I-Array. If I-Array<ZN_IREF, the voltage to the non-inverting input of comparator 4703 will increase and COMPPUT will equal "1". If I-Array≥ ZN_REF, then the voltage of the non-inverting input of comparator 4703 will decrease to 0 V, and COMPPOUT will equal "0". When COMPOUT="0", then the current from the array, I-Array, can be considered to be negligible and, optionally, a sense operation can be not performed, which will decrease power consumption and latency, meaning no activation of components in output circuit 3407 in FIG. 34, such as a current-to-voltage converter or an analog-to-digital converter.

FIG. 48A depicts threshold output detector 4800. Threshold output detector 4800 comprises current-to-voltage converter 4801 and comparator 4802. Current-to-voltage converter 4801 receives current from a column of VMM array, I-Array, and converts it into a voltage, which comparator 4802 then compares against a reference voltage, ZN_VREF. COMPOUT will be high if the voltage equivalent of I-Array exceeds the threshold voltage, ZN_VREF. IF COMPOUT is high, then the current of the array exceeds the threshold and will be sensed and measured. If COMPOUT is low, then the current of the array does not exceed the threshold and certain components in output circuit 3407, such as a current-to-voltage converter or an analog-to-digital converter, can be not enabled to reduce power consumption. If ZN_VREF is set to 0V, then threshold output detector 4800 will operate in that instance as a zero voltage detector.

FIG. 48B depicts threshold output detector 4850. Threshold output detector 4850 comprises current-to-voltage converter 4851 and comparator 4852. Current-to-voltage converter 4851 receives current I-array from a column of a VMM array and converts it into a voltage, which comparator 4852 then compares against a reference voltage, TH_VREF.

COMPOUT will indicate if the voltage of I-Array exceeds the threshold voltage, TH_VREF. IF COMPOUT is low, then the current of the array does not exceed the threshold and will sensed and measured. If COMPOUT is high, then the current of the array does exceed the threshold and certain components in output circuit 3407, such as a current-to-voltage converter or an analog-to-digital converter, can be not enabled to reduce power consumption. This is used to detect large output current such as out of target range, then no read operation is performed. The output of the output circuit will be forced to a pre-defined level, e.g., '1' in this case. If TH_VREF is set to 0V, then threshold output detector 4800 will operate in that instance as a zero voltage detector.

FIG. 49 depicts output block 4900, which can be used in output circuit 3407 in FIG. 34. Output block 4900 is used during read operations or neural read operations. Current-to-voltage converter and analog-to-digital converter 4901 receive current from the VMM array, and when not disabled by masking circuit 4903, converts the current into a voltage, and converts the voltage into digital output bits. Output register 4902 then stores and outputs those bits. Masking circuit 4903 utilize threshold output detector 4700 or 4800 to identify output currents that are at a zero value or are above a predetermined threshold and disables the reading of current for such columns, particularly the respective analog to digital conversion, which will reduce power consumption and latency involved in analog-to-digital conversion. Optionally, masking circuit 4903 also can disable current-to-voltage converter and analog-to-digital converter 4901 in response to a signal from input block 3900, such as a disable signal from global disabling logic 3930, that indicates a neural read operation can be skipped.

Figure 50:
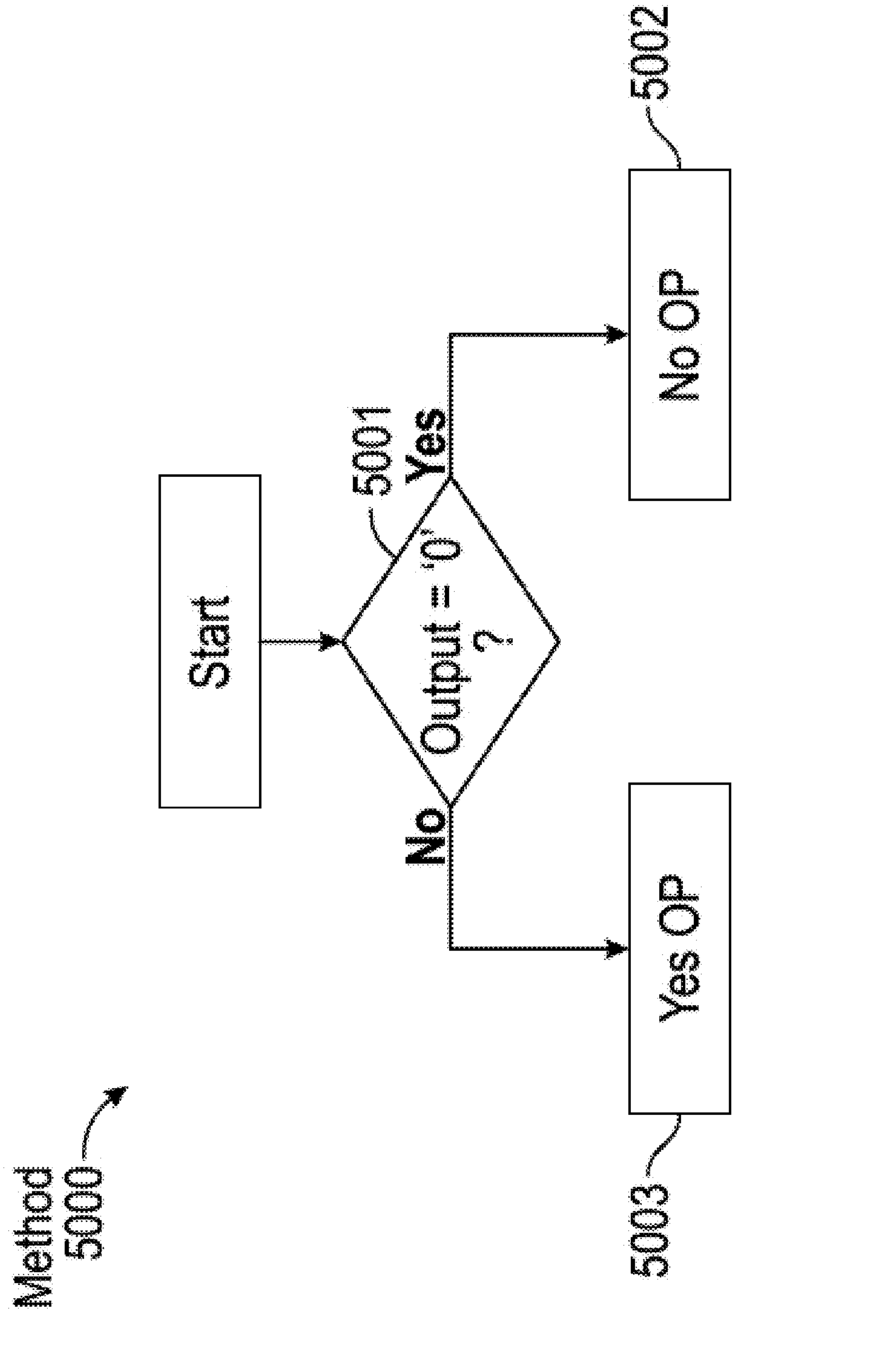
FIG. 50 depicts a method for analyzing outputs in a VMM system.
Figure 51:
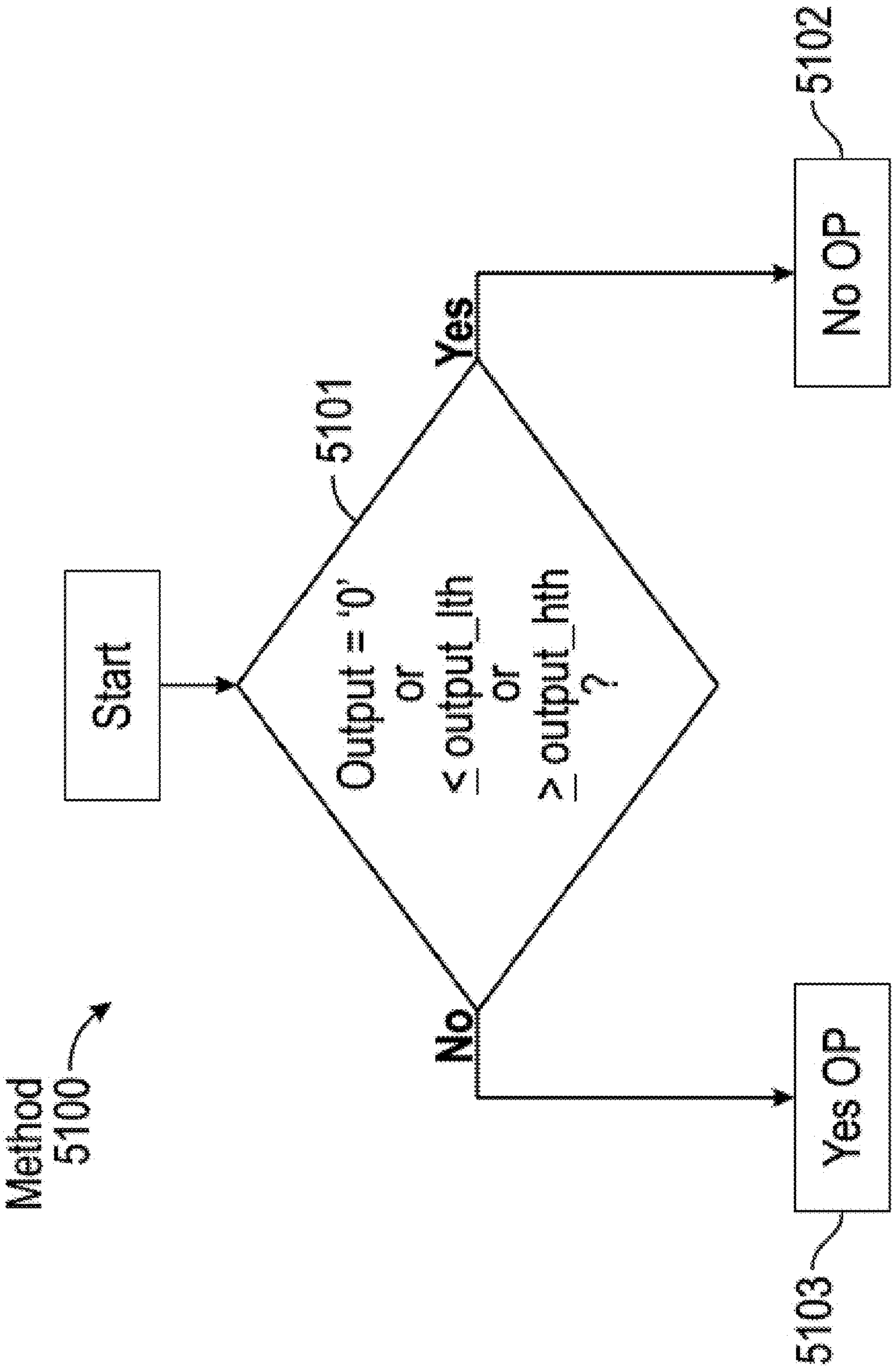
FIG. 51 depicts another method for analyzing outputs in a VMM system.

FIGS. 50 and 51 depict methods for performing these operations. FIG. 50 depicts method 5000. A column output is measured (5001). If it is '0' (which can be determined by setting ZN_VREF to 0V in FIG. 48A and TH_VREF to 0V in FIG. 48B), then no operation is performed (5002), meaning that no read of that column is performed (which means that the analog-to-digital converter in current-to-voltage converter and analog-to-digital converter 4901 and output register 4902 in output block 4900 are not activated) and the output value of output block 4900 is set to a predetermined value. If it is a '1,' then the operation is performed (5003), such as a neural read of the memory array.

FIG. 51 depicts method 5100. A column output is measured (5101). If the value is '0' or if the value is equal to or less than a low output threshold (the output bits of the output circuit is forced to be all '0' in this case) or if the value is equal to or greater than a high output threshold (the output bits of the output circuit is forced to be all '1' in this case), then no operation is performed (5102). Otherwise, the operation is performed (5103). The low output threshold and high output threshold values are selected such that no significant performance degradation is observed when the operation is not performed.

Figure 54:
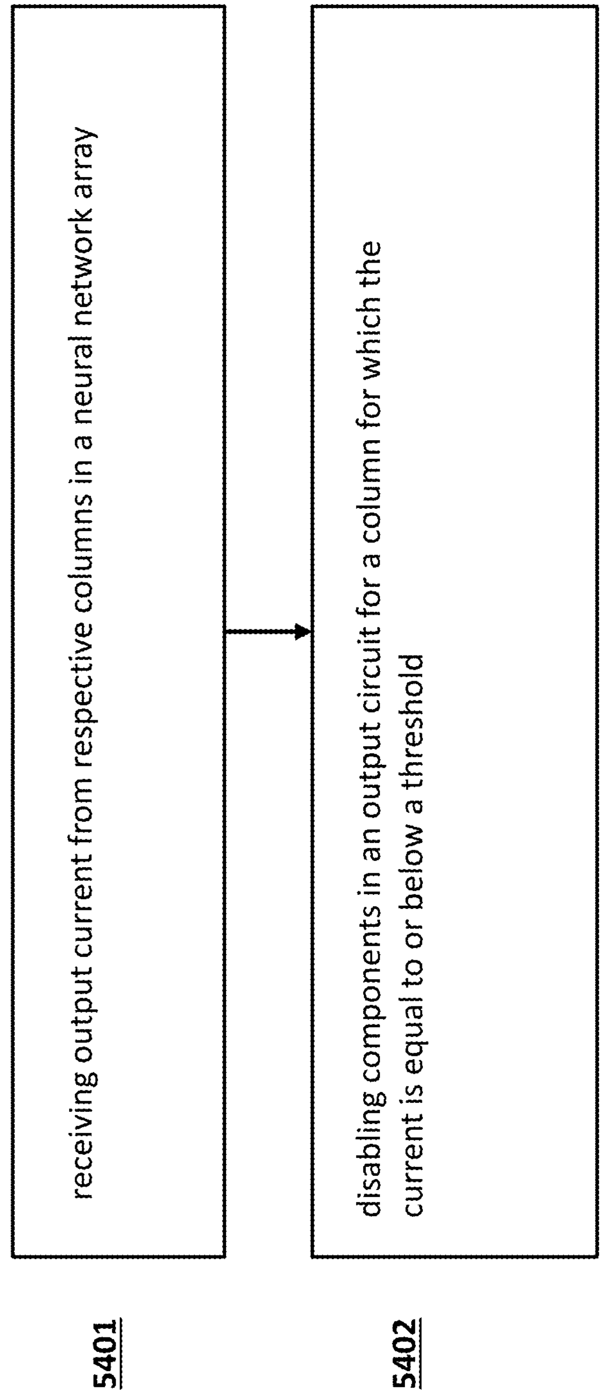
FIG. 54 depicts another method for masking outputs in a VMM system.
Figure 55:
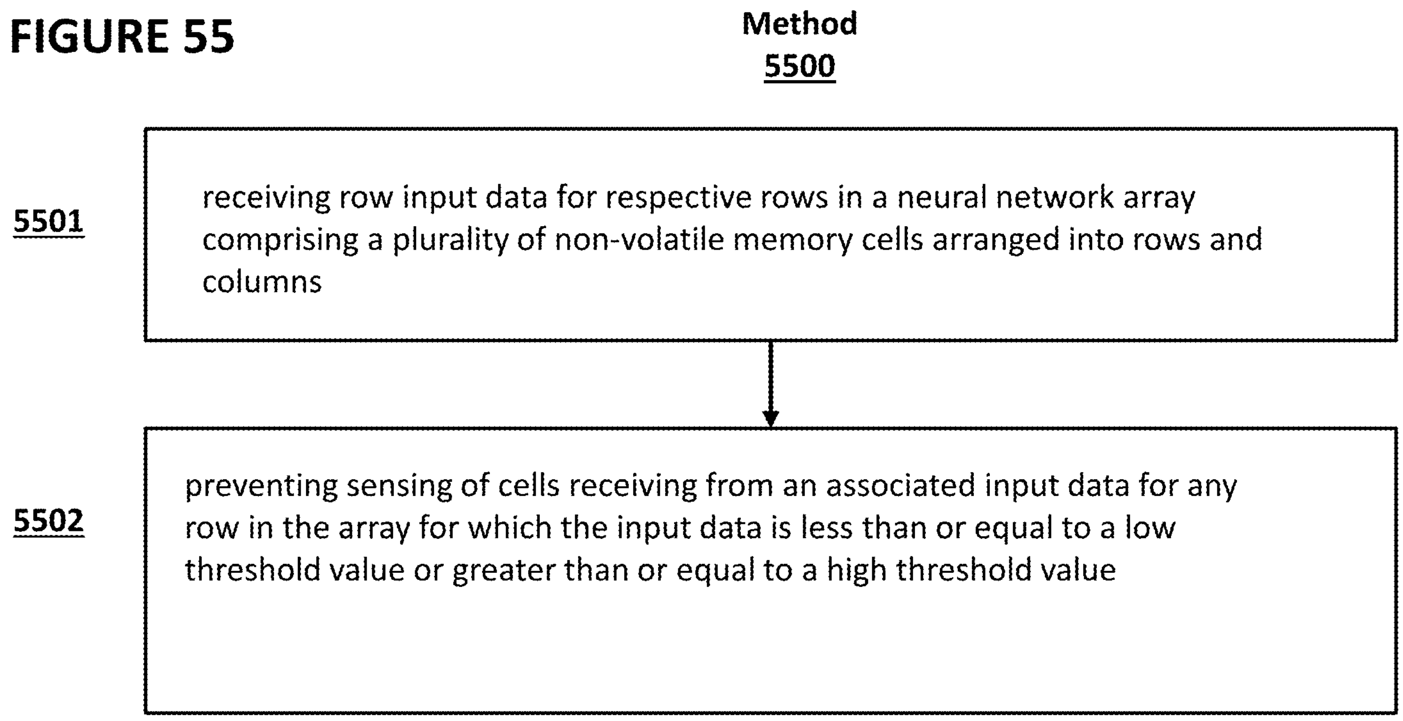
FIG. 55 depicts another method for masking outputs in a VMM system.

FIGS. 54-55 depict methods that can be performed by the circuits of FIGS. 47, 48A, 48B, and 49.

FIG. 54 depicts method 5400. Operation 5401 comprises receiving output current from respective columns in a neural network array. Operation 5402 comprises disabling components in an output circuit for a column for which the current is equal to or below a threshold. Optionally, operation 5402 comprises preventing a current-to-voltage converter or an analog-to-digital converter from being activated for one or more columns when the output current for the one or more columns is equal to or below a threshold.

FIG. 55 depicts method 5500. Operation 5501 comprises receiving row input data for respective rows in a neural network array comprising a plurality of non-volatile memory cells arranged into rows and columns. Operation 5502 comprises preventing sensing of cells receiving from an associated row input data for any row in the array for which the row input data is less than or equal to a low threshold value or greater than or equal to a high threshold value. Optionally, operation 5502 comprises preventing one or more of a current-to-voltage converter or an analog-to-digital converter from being activated when the row input data for all rows is less than or equal to a low threshold value or greater than or equal to a high threshold value.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A system comprising:

a neural network array comprising a plurality of non-volatile memory cells arranged into rows and columns; and row circuits for respective rows in the neural network array, each row circuit comprising:

a row input detector to assert a disabling signal if (i) row input data for the row is equal to '0'; or (ii) the row input data for the row is less than or equal to a low threshold non-zero value; or (iii) the row input data for the row is greater than or equal to a high threshold value; and disabling logic to disable the row in response to the disabling signal.

2. The system of claim 1, wherein the row circuit for each row comprises logic and a buffer.

3. The system of claim 2, wherein the system comprises AND logic receiving all outputs from the buffers to generate a neural read disable signal to prevent application of inputs signals to the rows in the neural network array.

4. The system of claim 3, wherein the system comprises OR logic and an inverter for each row.

5. The system of claim 4, wherein the system comprises AND logic to generate an output in response to an output of respective inverters of the rows.

6. The system of claim 1, wherein each row circuit comprises OR logic receiving row input data for the row.

7. A system comprising:

a neural network array comprising a plurality of non-volatile memory cells arranged into rows and columns; and row circuits for respective rows in the neural network array, the row circuits comprising a masking circuit to prevent application of a sparse input to one or more rows in the array when a condition is satisfied, wherein the condition is row input data for all rows is equal to ‘0’; and wherein the masking circuit comprises OR logic receiving row input data for the row, wherein the OR logic for a first row receives a “0” on an input and the OR logic for all other rows receives an output from the OR logic for a preceding row.

8. The system of claim 1, wherein each row circuit comprises OR logic receiving row input data for the row and an NMOS transistor coupled to a load.

9. The system of claim 1, wherein each row circuit comprises an inverter receiving a single bit in the row input data for the row.

10. The system of claim 9, wherein system comprises AND logic to generate an output in response to the output of respective inverters.

11. A system comprising:

a neural network array comprising a plurality of non-volatile memory cells arranged into rows and columns; and row circuits for respective rows in the neural network array, the row circuits comprising a masking circuit to prevent application of a sparse input to one or more rows in the array when a condition is satisfied, wherein the condition is row input data for all rows is equal to ‘0’; and wherein the masking circuit comprises an NMOS transistor comprising a gate receiving a single bit in the row input data for the row and a drain coupled to a load.

12. A system comprising:

a neural network array comprising a plurality of non-volatile memory cells arranged into rows and columns; and row circuits for respective rows in the neural network array, the row circuits comprising a masking circuit to prevent application of a sparse input to one or more rows in the array when a condition is satisfied;

wherein the masking circuit prevents an application of an input signal to one or more rows in the array by preventing one or more of a digital-to-analog converter and an analog-to-digital converter from being activated when the condition is satisfied, wherein the condition comprises for a respective row in the array (i) row input data for the row is equal to ‘0’; or (ii) the row input data for the row is less than or equal to a low threshold non-zero value; or (iii) the row input data for the row is greater than or equal to a high threshold value.

13. A method comprising:

receiving row input data for respective rows in a neural network array comprising a plurality of non-volatile memory cells arranged into rows and columns; and preventing an application of an input signal derived from an associated row input data by one or more of a digital-to-analog converter and an analog-to-digital converter for a row in the array for which (i) row input data for the row is equal to ‘0’; or (ii) the row input data for the row is less than or equal to a low threshold non-zero value; or (iii) the row input data for the row is greater than or equal to a high threshold value.

14. A method comprising:

receiving row input data for respective rows in a neural network array comprising a plurality of non-volatile memory cells arranged into rows and columns; and preventing an application of an input signal derived from an associated row input data for a row in the array for which the row input data is equal to or below a low threshold or above a high threshold value;

wherein the preventing comprises preventing one or more of a digital-to-analog converter and an analog-to-digital converter from being activated when the row input data for respective rows is less than or equal to a low threshold or greater than or equal to a high threshold value.

* * * * *